US011367837B2

(12) United States Patent
Sim et al.

(10) Patent No.: US 11,367,837 B2
(45) Date of Patent: Jun. 21, 2022

(54) ORGANIC LIGHT-EMITTING DEVICE

(71) Applicant: Samsung Electronics Co., Ltd., Suwon-si (KR)

(72) Inventors: Myungsun Sim, Suwon-si (KR); Sooghang Ihn, Hwaseong-si (KR); Joonghyuk Kim, Seoul (KR); Yasushi Koishikawa, Hwaseong-si (KR); Jongsoo Kim, Seoul (KR); Hasup Lee, Seoul (KR); Soonok Jeon, Suwon-si (KR); Yeonsook Chung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 486 days.

(21) Appl. No.: 16/375,333

(22) Filed: Apr. 4, 2019

(65) Prior Publication Data

US 2020/0028094 A1 Jan. 23, 2020

(30) Foreign Application Priority Data

Jul. 20, 2018 (KR) .................... 10-2018-0084766
Jan. 29, 2019 (KR) .................... 10-2019-0011305

(51) Int. Cl.
*H01L 51/00* (2006.01)
*H01L 51/50* (2006.01)
*H01L 51/52* (2006.01)

(52) U.S. Cl.
CPC ........ *H01L 51/0072* (2013.01); *H01L 51/006* (2013.01); *H01L 51/0054* (2013.01); *H01L 51/0058* (2013.01); *H01L 51/0067* (2013.01); *H01L 51/0073* (2013.01); *H01L 51/0085* (2013.01); *H01L 51/504* (2013.01);
(Continued)

(58) Field of Classification Search
None
See application file for complete search history.

(56) References Cited

U.S. PATENT DOCUMENTS 9,190,623 B2    11/2015   Kwong et al.
10,297,764 B2 *  5/2019   Ihn .................... H01L 51/0055
(Continued)

FOREIGN PATENT DOCUMENTS

JP    2012151322 A    8/2012
KR    20170000323 A    1/2017

OTHER PUBLICATIONS

Nakanotani et al. "High-efficiency organic light-emitting diodes with fluorescent emitters." Nature communications 5, No. 1 (2014): 1-7. (Year: 2014).*
(Continued)

*Primary Examiner* — Robert S Loewe
(74) *Attorney, Agent, or Firm* — Cantor Colburn LLP

(57) ABSTRACT

An organic light-emitting device including an emission layer including a first electrode; a second electrode facing the first electrode; and an organic layer disposed between the first electrode and the second electrode, wherein the organic layer comprises an emission layer, the emission layer comprises a first compound, a second compound, and a third compound, and the first compound and the second compound are different from each other, each of the first compound and the second compound emits light, the third compound does not emit light, and the first compound and the second compound satisfy Conditions and Inequalities as described herein.

20 Claims, 7 Drawing Sheets

(52) U.S. Cl.
CPC ...... *H01L 51/5016* (2013.01); *H01L 51/5092* (2013.01); *H01L 51/5096* (2013.01); *H01L 51/5278* (2013.01); H01L 51/5056 (2013.01); H01L 51/5072 (2013.01)

(56) References Cited

U.S. PATENT DOCUMENTS

| | | | |
|---|---|---|---|
| 2013/0053558 A1* | 2/2013 | Pflumm | C09B 57/00 544/180 |
| 2015/0340623 A1 | 11/2015 | Kawamura et al. | |
| 2016/0190478 A1* | 6/2016 | Nakanotani | H01L 51/0071 257/40 |
| 2016/0380210 A1 | 12/2016 | Kim et al. | |
| 2017/0062718 A1 | 3/2017 | Numata et al. | |
| 2017/0062752 A1 | 3/2017 | Ihn et al. | |
| 2017/0077418 A1 | 3/2017 | Stoessel et al. | |
| 2017/0092875 A1 | 3/2017 | Parham et al. | |
| 2017/0194388 A1* | 7/2017 | Kim | H01L 27/3211 |
| 2017/0320855 A1* | 11/2017 | Wong | C07D 403/06 |
| 2017/0324044 A1* | 11/2017 | Joosten | C07D 403/14 |
| 2018/0013087 A1* | 1/2018 | Wang | H01L 51/0059 |
| 2018/0159050 A1* | 6/2018 | Kim | C07F 7/0816 |
| 2018/0166634 A1* | 6/2018 | Numata | C07D 403/12 |
| 2018/0175294 A1* | 6/2018 | Duan | C07D 417/10 |
| 2018/0248127 A1* | 8/2018 | Lee | C07D 487/04 |
| 2018/0277766 A1* | 9/2018 | Mukhopadhyay | H01L 51/5028 |
| 2019/0157570 A1 | 5/2019 | Sim et al. | |
| 2019/0181353 A1 | 6/2019 | Ihn et al. | |
| 2019/0259959 A1* | 8/2019 | Duan | H01L 51/006 |
| 2021/0083218 A1* | 3/2021 | Umeda | H01L 51/5024 |

OTHER PUBLICATIONS

Bo Seong Kim et al., "Above 20% external quantum efficiency in novel hybrid white organic light-emitting diodes having green thermally activated delayed fluorescent emitter," Scientific Reports, Aug. 14, 2014, pp. 1-6, vol. 4, Article No. 6019.

Hyocheol Jung et al., "Recent Progress on Organic Emitters for Organic Light Emitting Diode Lightings," Appl. Chem. Eng., Oct. 2016, pp. 455-466, vol. 27, No. 5.

Takahiro Higuchi et al., "High-Efficiency White Organic Light-Emitting Diodes Based on a Blue Thermally Activated Delayed Fluorescent Emitter Combined with Green and Red Fluorescent Emitters," Advanced Materials, Feb. 9, 2015, pp. 2019-2023, vol. 27, Issue No. 12.

Wook Song et al., "High efficiency fluorescent white organic light-emitting diodes having a yellow fluorescent emitter sensitized by a blue thermally activated delayed fluorescent emitter," Organic Electronics, Apr. 18, 2015, pp. 138-143, vol. 23.

Extended European search report issued by the European Patent Office dated Nov. 26, 2019 in the examination of the European Patent Application No. 19168054.5, which corresponds to the U.S. Appl. No. 16/375,333.

* cited by examiner

ORGANIC LIGHT-EMITTING DEVICE

CROSS-REFERENCE TO RELATED APPLICATION

This application claims the benefit of and priority to Korean Patent Application No. 10-2018-0084766, filed on Jul. 20, 2018 and No. 10-2019-0011305, filed on Jan. 29, 2019, in the Korean Intellectual Property Office, and all the benefits accruing therefrom under 35 U.S.C. § 119, the contents of which are incorporated herein in their entirety by reference.

BACKGROUND

1. Field

One or more embodiments relate to an organic light-emitting device including an emission layer including a first compound, a second compound, and a third compound.

2. Description of the Related Art

Organic light-emitting devices (OLEDs) are self-emission devices that produce full-color images, and that also have wide viewing angles, high contrast ratios, short response times, and excellent characteristics in terms of brightness, driving voltage, and response speed, compared to devices in the art.

In an example, an organic light-emitting device includes an anode, a cathode, and an organic layer disposed between the anode and the cathode, wherein the organic layer includes an emission layer. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Various types of OLEDs are known. However, there still remains a need for OLEDs having longer lifespan, increased driving voltage, and greater quantum efficiency.

SUMMARY

Aspects of the present disclosure provide an organic light-emitting device including an emission layer including a predetermined first compound, a predetermined second compound, and a predetermined third compound.

Additional aspects will be set forth in part in the description which follows and, in part, will be apparent from the description, or may be learned by practice of the presented exemplary embodiments.

An aspect provides an organic light-emitting device including: a first electrode; a second electrode facing the first electrode; and an organic layer disposed between the first electrode and the second electrode, wherein the organic layer may include an emission layer, the emission layer may include a first compound, a second compound, and a third compound, and the first compound and the second compound may be different from each other, each of the first compound and the second compound may emit light, the third compound may not emit light, the first compound and the second compound may satisfy one of Conditions 1 to 4:
wherein Condition 1 comprises:
400 nanometers≤$\lambda_{max1}$<500 nanometers, and
400 nanometers≤$\lambda_{max2}$<500 nanometers,
wherein Condition 2 comprises:
500 nanometers≤$\lambda_{max1}$<550 nanometers, and
500 nanometers≤$\lambda_{max2}$<550 nanometers,
wherein Condition 3 comprises:
550 nanometers≤$\lambda_{max1}$<620 nanometers, and
550 nanometers≤$\lambda_{max2}$<620 nanometers,
wherein Condition 4 comprises:
620 nanometers≤$\lambda_{max1}$<700 nanometers, and
620 nanometers≤$\lambda_{max2}$<700 nanometers,
the first compound and the second compound may satisfy Inequality 1-1 or 1-2:

$$PLS(C1) \le PLS(C2) \quad (1\text{-}1)$$

$$(\lambda_{max2} - \lambda_{max1}) + PLS(C1) \le PLS(C2) \quad (1\text{-}2),$$

the first compound and the second compound may satisfy Inequality (2):

$$kr(C1) \ge kr(C2) \quad (2), \text{ and}$$

wherein, in Conditions 1 to 4 and Inequalities 1-1, 1-2, and 2, $\lambda_{max1}$ is a maximum emission wavelength of the first compound, $\lambda_{max2}$ is a maximum emission wavelength of the second compound, PLS(C1) is photostability of the first compound, PLS(C2) is photostability of the second compound, kr(C1) is a radiative decay rate of the first compound, and kr(C2) is a radiative decay rate of the second compound.

Another aspect provides an organic light-emitting device including: a first electrode; a second electrode facing the first electrode;
a plurality of light-emitting units, in the number of m, disposed between the first electrode and the second electrode, each light-emitting unit including an emission layer, and a plurality of charge generation layers, in the number of m−1, disposed between two adjacent light-emitting units among the plurality of light-emitting units, each charge generation layer including an n-type charge generation layer and a p-type charge generation layer, wherein m may be an integer of 2 or more, a maximum emission wavelength of light emitted by at least one light-emitting unit among the plurality of light-emitting units may be different from a maximum emission wavelength of light emitted by at least one other light-emitting unit among the plurality of light-emitting units, the emission layer may include a first compound, a second compound, and a third compound, and the first compound and the second compound may be different from each other, each of the first compound and the second compound may emit light, the third compound may not emit light, the first compound and the second compound may satisfy one of Conditions 1 to 4:
wherein Condition 1 includes:
400 nanometers≤$\lambda_{max1}$<500 nanometers, and
400 nanometers≤$\lambda_{max2}$<500 nanometers,
wherein Condition 2 includes:
500 nanometers≤$\lambda_{max1}$<550 nanometers, and
500 nanometers≤$\lambda_{max2}$<550 nanometers,
wherein Condition 3 includes:
550 nanometers≤$\lambda_{max1}$<620 nanometers, and
550 nanometers≤$\lambda_{max2}$<620 nanometers,
wherein Condition 4 includes:
620 nanometers≤$\lambda_{max1}$<700 nanometers, and
620 nanometers≤$\lambda_{max2}$<700 nanometers, the first compound and the second compound may satisfy Inequality 1-1 or 1-2:

$$PLS(C1) \leq PLS(C2) \quad (1\text{-}1)$$

$$(\lambda_{max2} - \lambda_{max1}) + PLS(C1) \leq PLS(C2) \quad (1\text{-}2),$$

the first compound and the second compound may satisfy Inequality 2:

$$kr(C1) \geq kr(C2) \quad (2), \text{ and}$$

wherein, in Conditions 1 to 4 and Inequalities 1-1, 1-2, and 2, $\lambda_{max1}$ is a maximum emission wavelength of the first compound, $\lambda_{max2}$ is a maximum emission wavelength of the second compound, PLS(C1) is photostability of the first compound, PLS(C2) is photostability of the second compound, kr(C1) is a radiative decay rate of the first compound, and kr(C2) is a radiative decay rate of the second compound.

Another aspect provides an organic light-emitting device including: a first electrode; a second electrode facing the first electrode; and plurality of emission layers, in the number of m, disposed between the first electrode and the second electrode, wherein m is an integer of 2 or more, a maximum emission wavelength of light emitted by at least one emission layer among the plurality of emission layers may be different from a maximum emission wavelength of light emitted by at least one other emission layer among the plurality of emission layers, the emission layer includes a first compound, a second compound, and a third compound, and the first compound and the second compound may be different from each other, each of the first compound and the second compound may emit light, the third compound may not emit light, the first compound and the second compound may satisfy one of Conditions 1 to 4:

wherein Condition 1 includes:
400 nanometers $\leq \lambda_{max1} <$ 500 nanometers, and
400 nanometers $\leq \lambda_{max2} <$ 500 nanometers,
wherein Condition 2 includes:
500 nanometers $\leq \lambda_{max1} <$ 550 nanometers, and
500 nanometers $\leq \lambda_{max2} <$ 550 nanometers,
wherein Condition 3 includes:
550 nanometers $\leq \lambda_{max1} <$ 620 nanometers, and
550 nanometers $\leq \lambda_{max2} <$ 620 nanometers,
wherein Condition 4 includes:
620 nanometers $\leq \lambda_{max1} <$ 700 nanometers, and
620 nanometers $\leq \lambda_{max2} <$ 700 nanometers,
the first compound and the second compound may satisfy Inequality 1-1 or 1-2:

$$PLS(C1) \leq PLS(C2) \quad (1\text{-}1)$$

$$(\lambda_{max2} - \lambda_{max1}) + PLS(C1) \leq PLS(C2) \quad (1\text{-}2),$$

the first compound and the second compound may satisfy Inequality 2:

$$kr(C1) \geq kr(C2) \quad (2), \text{ and}$$

wherein, in Conditions 1 to 4 and Inequalities 1-1, 1-2, and 2, $\lambda_{max1}$ is a maximum emission wavelength of the first compound, $\lambda_{max2}$ is a maximum emission wavelength of the second compound, PLS(C1) is photostability of the first compound, PLS(C2) is photostability of the second compound, kr(C1) is a radiative decay rate of the first compound, and kr(C2) is a radiative decay rate of the second compound.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
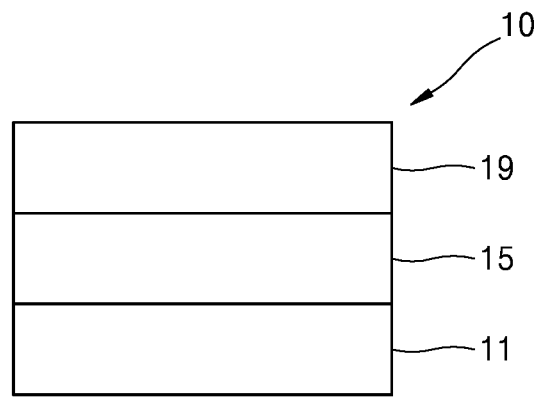
FIG. 1 is a schematic view of an organic light-emitting device 10 according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise. As used herein, "a combination thereof" is an open ended term that means including at least one of the recited components, and may further include similar unrecited components.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Description of FIG. 1

FIG. 1 is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with FIG. 1.

The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

In an embodiment, the first electrode 11 may be formed by depositing or sputtering a material for forming the first electrode1 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In an embodiment, the material for forming the first electrode 11 may be a metal or metal alloy, such as magnesium (Mg), silver (Ag), indium (In), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or a combination thereof.

The hole transport region may include only either a hole injection layer or a hole transport layer. In an embodiment, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer, the hole injection layer may be formed on the first electrode 11 by using one or more suitable methods, for example, vacuum deposition, spin coating, casting, Langmuir-Blodgett (LB) deposition, or a combination thereof.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0 Angstroms per second (Å/sec) to about 100 Å/sec. However, the deposition conditions are not limited thereto.

When the hole injection layer is formed using spin coating, the coating conditions may vary according to the compound that is used to form the hole injection layer, and the desired structure and thermal properties of the hole injection layer to be formed. For example, the coating rate may be in the range of about 2,000 revolutions per minute (rpm) to about 5,000 rpm, and a temperature at which heat treatment is performed to remove a solvent after coating may be in the range of about 80° C. to about 200° C. However, the coating conditions are not limited thereto.

Conditions for forming a hole transport layer and an electron blocking layer may be understood by referring to conditions for forming the hole injection layer.

The hole transport region may include, for example, m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonicacid:polyaniline (PANI/CSA), polyaniline/poly(4-styrenesulfonate):polyaniline (PANI/PSS), a compound represented by Formula 201, a compound represented by Formula 202, or a combination thereof.

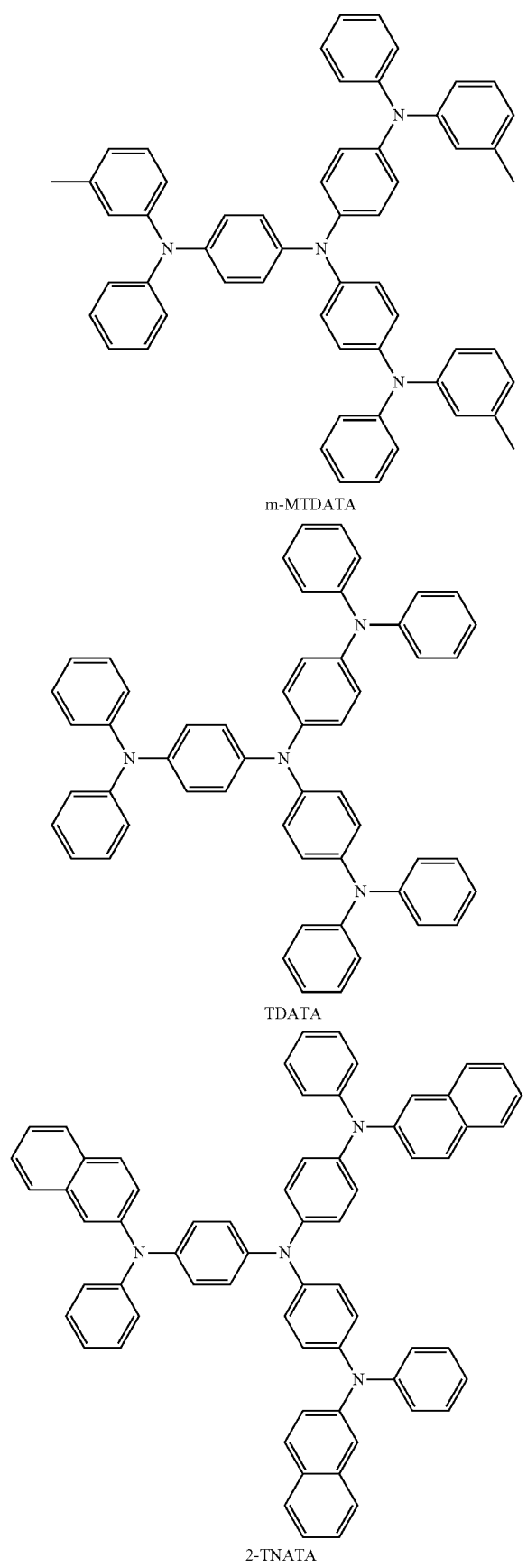
m-MTDATA
TDATA
2-TNATA
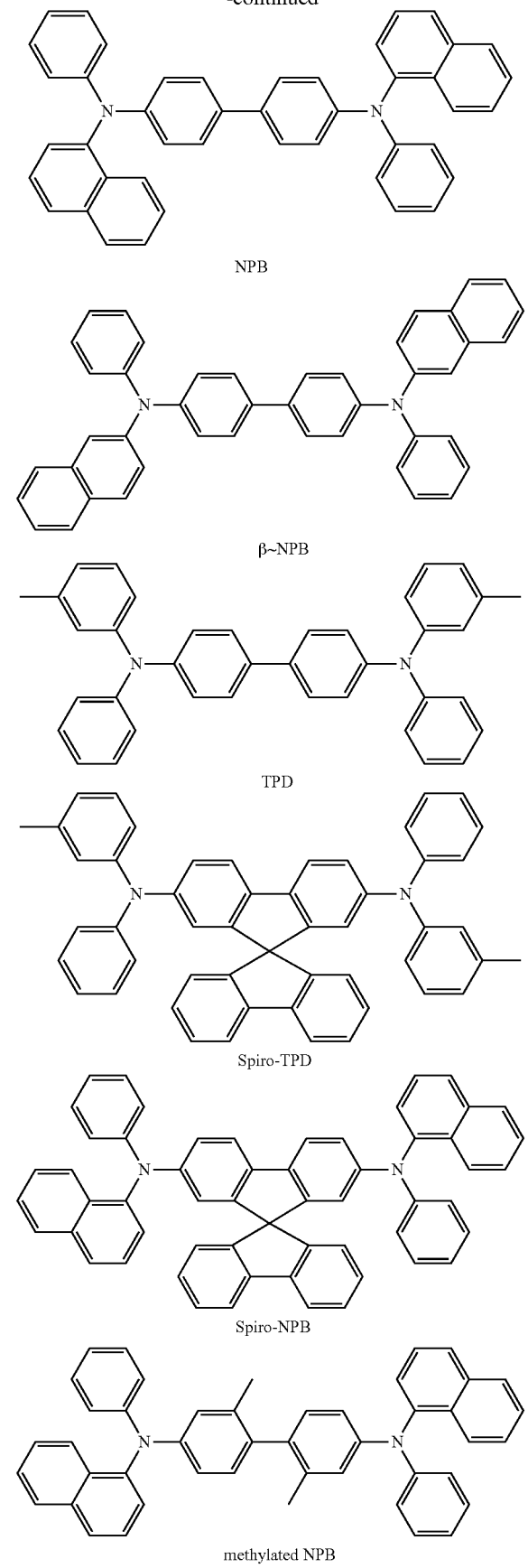
NPB
β~NPB
TPD
Spiro-TPD
Spiro-NPB
methylated NPB

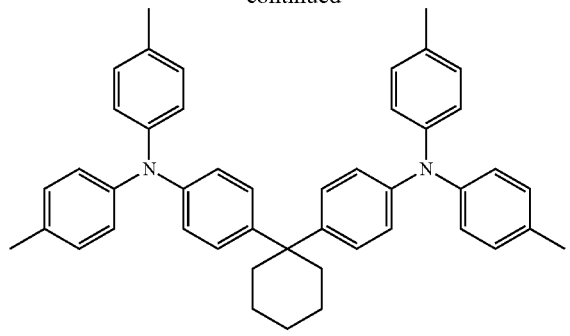

TAPC

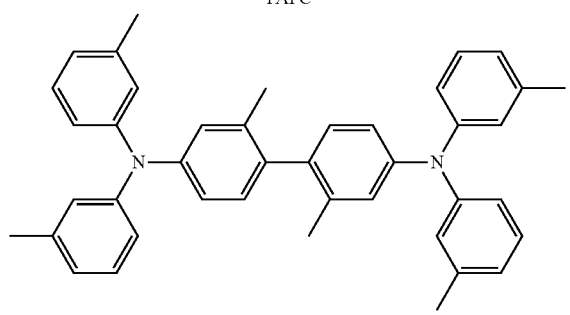

HMTPD

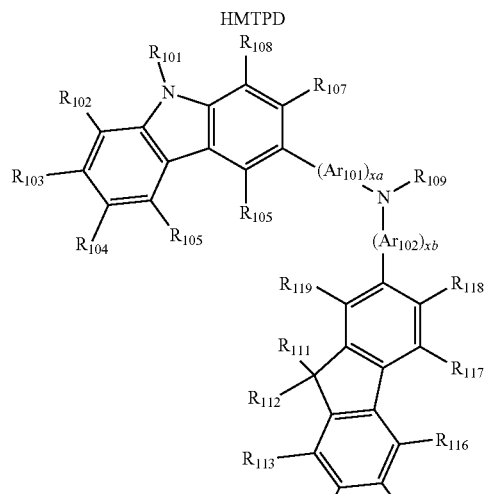

Formula 201

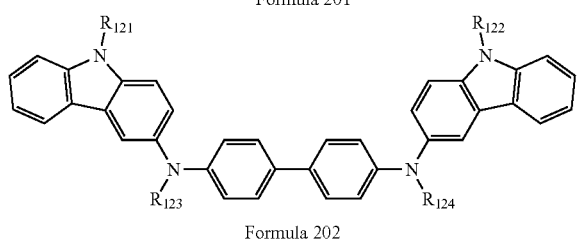

Formula 202

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

In Formula 201, xa and xb may each independently be an integer from 0 to 5, or 0, 1 or 2. For example, xa may be 1 and xb may be 0, but xa and xb are not limited thereto.

In Formulae 201 and 202, $R_{101}$ to $R_{105}$, $R_{111}$ to $R_{19}$, and $R_{121}$ to $R_{124}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, a pentoxy group, and so on); or a $C_1$-$C_{10}$ alkyl group and a $C_1$-$C_{10}$ alkoxy group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or a combination thereof; or a phenyl group, a naphthyl group, an anthracenyl group, a fluorenyl group, or a pyrenyl group; or a phenyl group, a naphthyl group, an anthracenyl group, a fluorenyl group, and a pyrenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or a combination thereof, but embodiments of the present disclosure are not limited thereto.

In Formula 201, $R_{109}$ may be a phenyl group, a naphthyl group, an anthracenyl group, or a pyridinyl group; or a phenyl group, a naphthyl group, an anthracenyl group, or a pyridinyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or a combination thereof.

According to an embodiment, the compound represented by Formula 201 may be represented by Formula 201A, but embodiments of the present disclosure are not limited thereto:

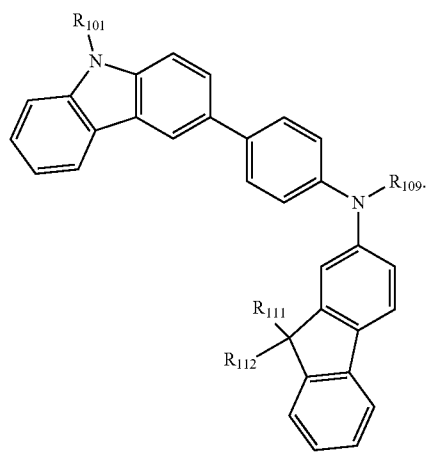

Formula 201A

In Formula 201A, $R_{101}$, $R_{111}$, $R_{112}$, and $R_{109}$ may be the same as defined above.

For example, the compound represented by Formula 201 and the compound represented by Formula 202 may include compounds HT1 to HT20, but embodiments of the present disclosure are not limited thereto:

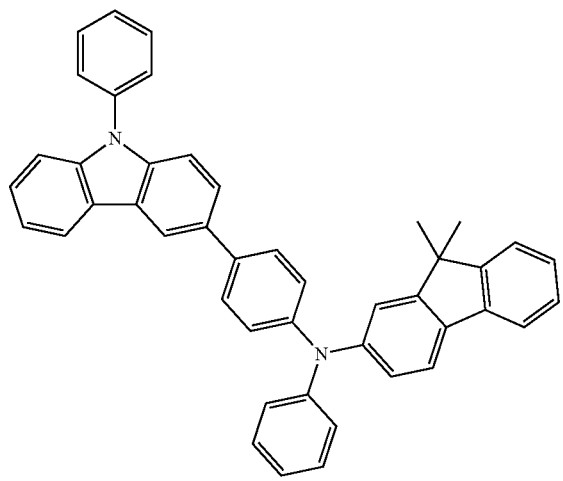

HT1

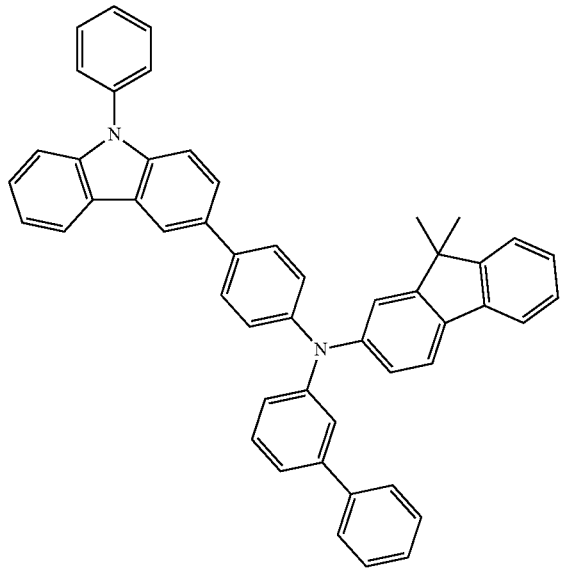

HT2

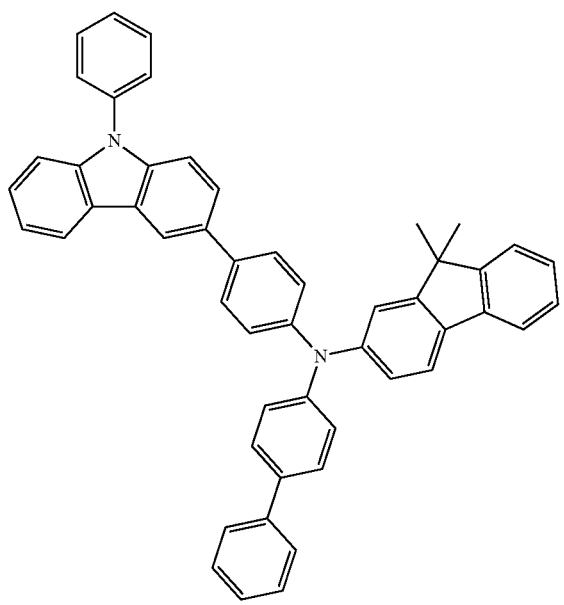

HT3

HT4
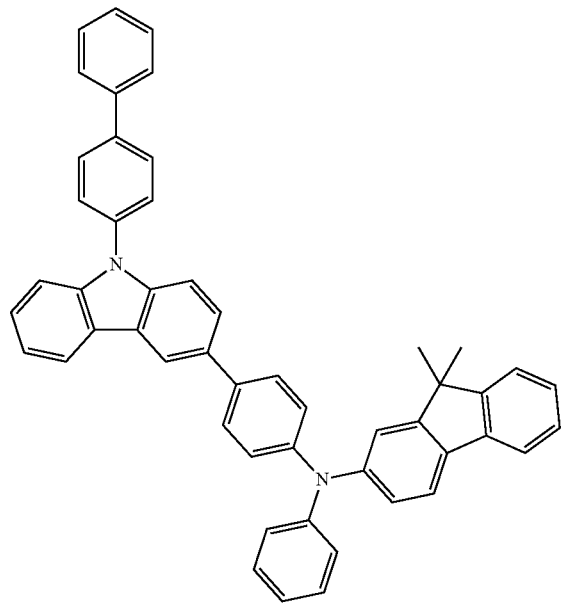
HT5
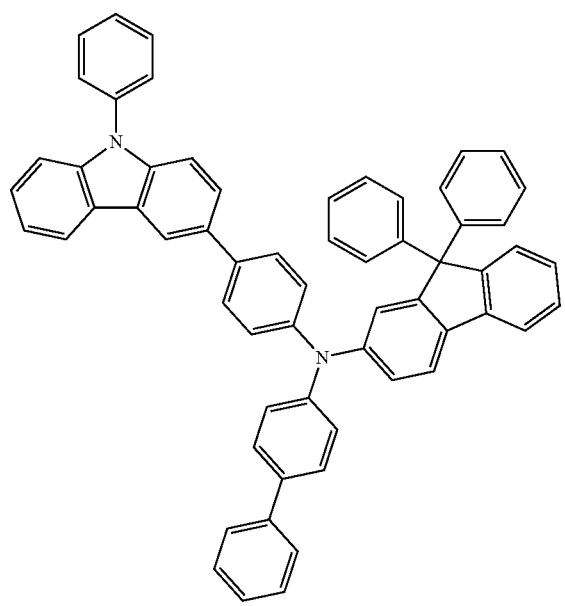
HT6
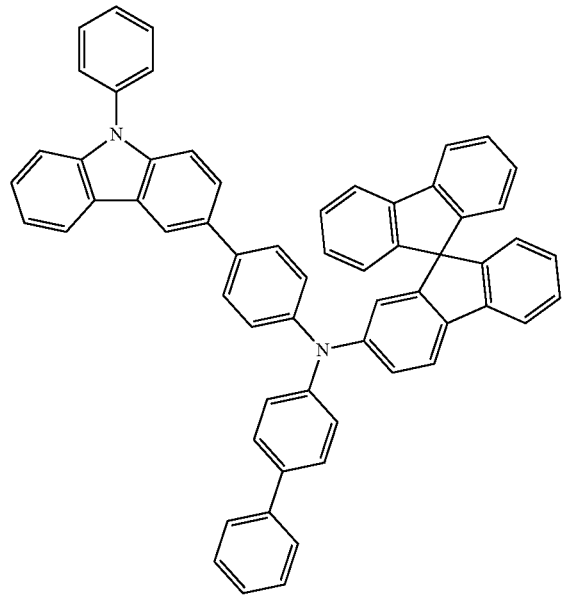
HT7
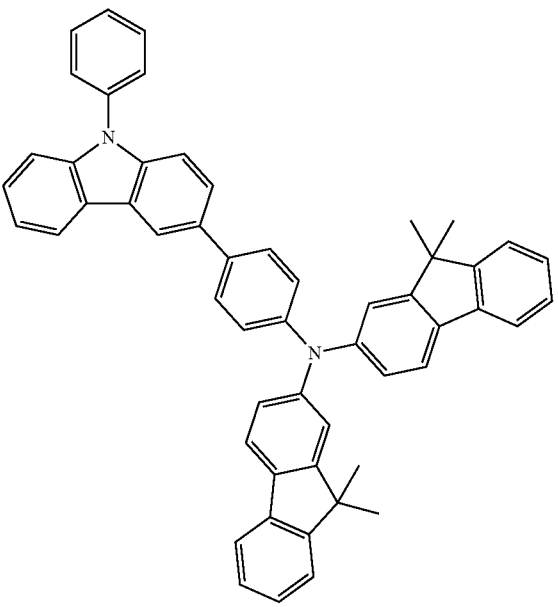

-continued
HT8
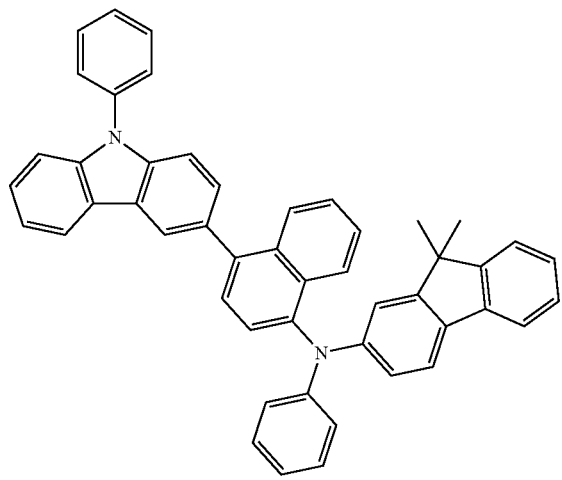
HT9
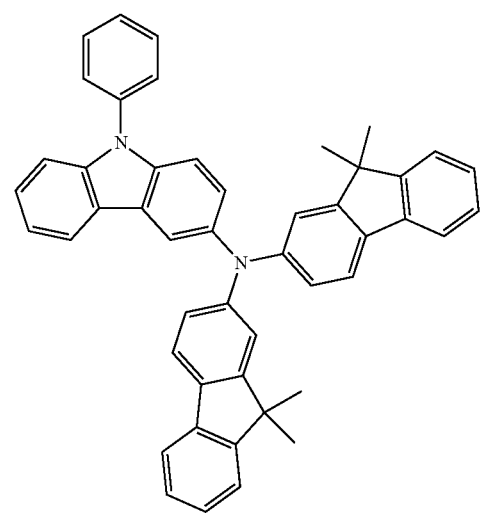
HT10
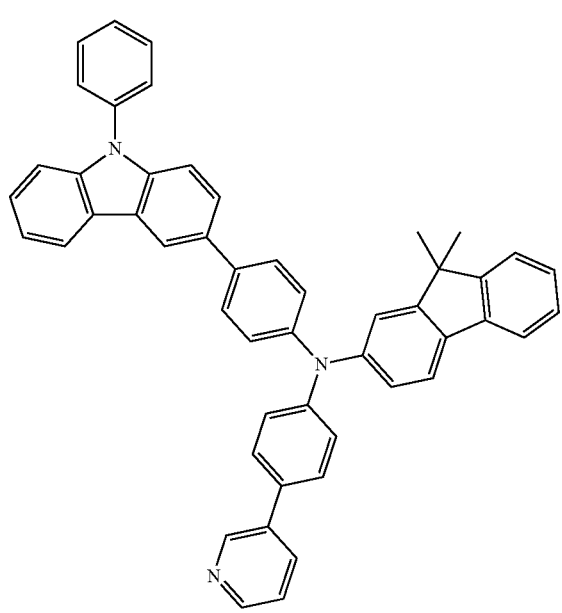
-continued
HT11
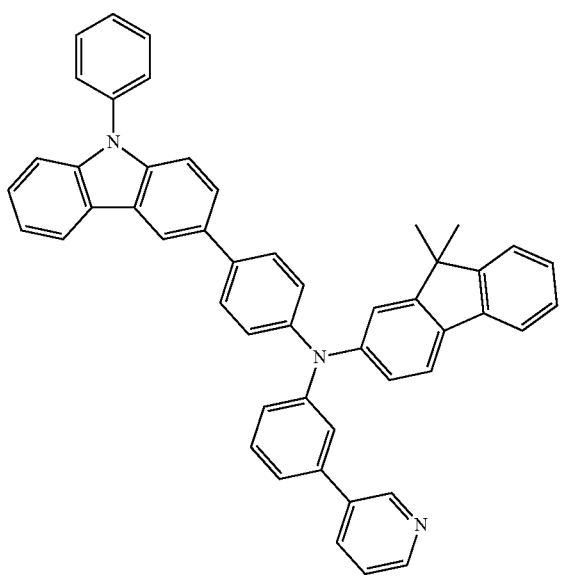
HT12
HT13

HT14

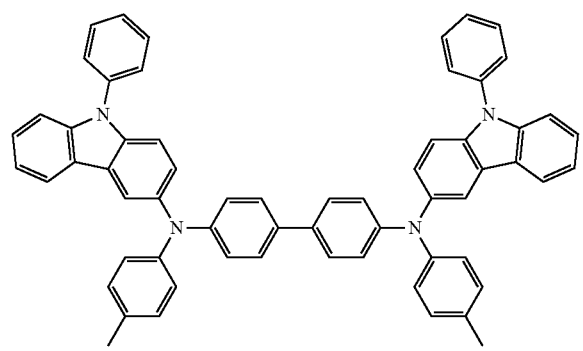

HT15

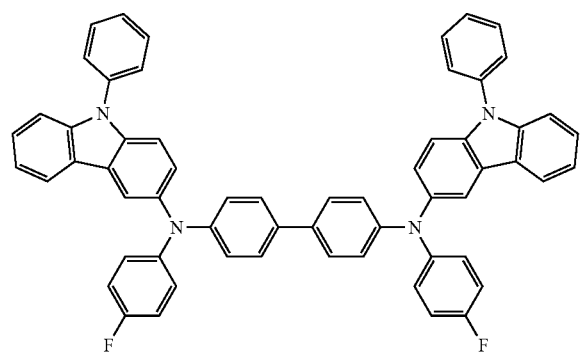

HT16

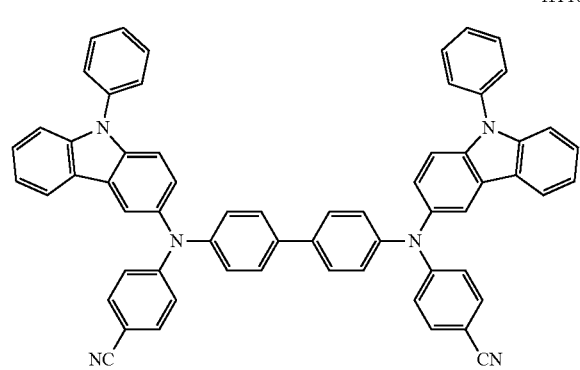

HT17

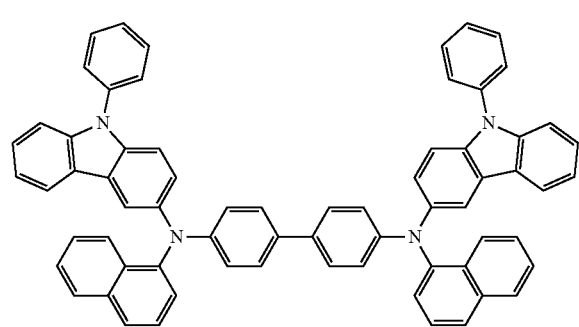

HT18

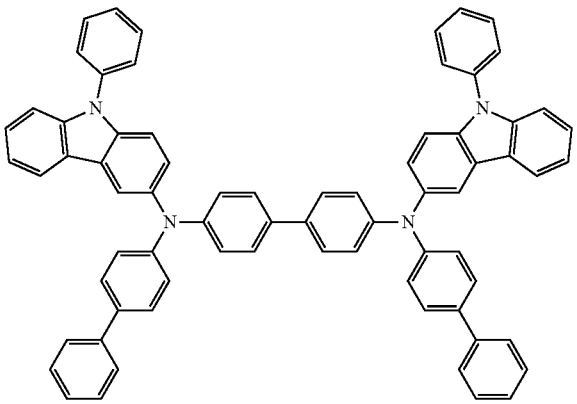

HT19

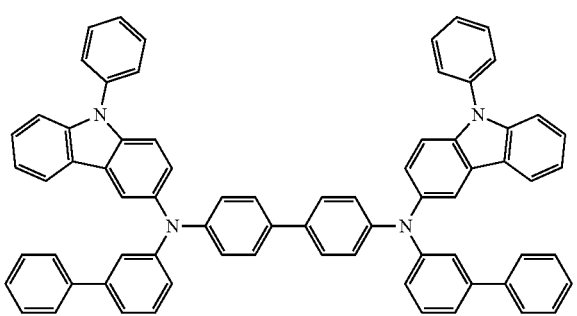

HT20

A thickness of the hole transport region may be in a range of about 100 Å to about 10,000 Å, for example, about 100 Å to about 1,000 Å. When the hole transport region includes a hole injection layer, a hole transport layer, or a combination thereof, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1500 Å. Without being bound by theory, when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or a combination thereof, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1 or HP-1, but are not limited thereto.

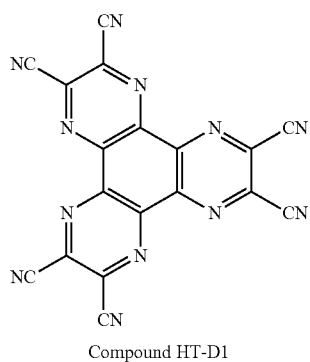

Compound HT-D1

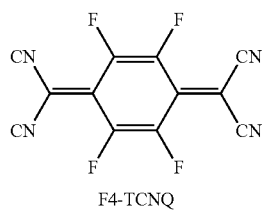

F4-TCNQ

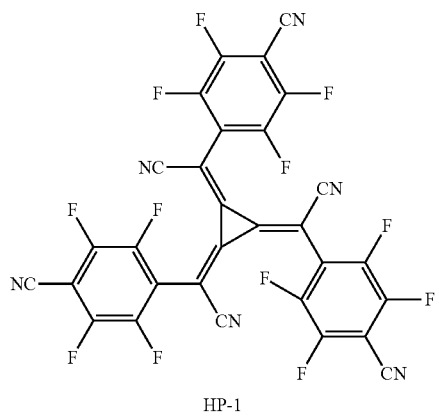

HP-1

The hole transport region may further include a buffer layer.

In addition, the buffer layer may compensate for an optical resonance distance according to a wavelength of light emitted from the emission layer, and thus, efficiency of a formed organic light-emitting device may be improved.

The electron transport region may further include an electron blocking layer. The electron blocking layer may include, for example, mCP, but a material therefor is not limited thereto.

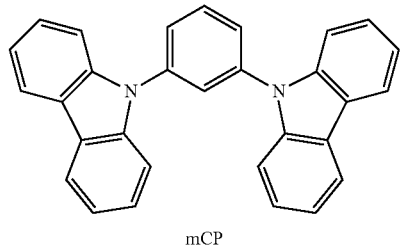 [SMILES: c1cc(-n2c3ccccc3c3ccccc32)cc(-n2c3ccccc3c3ccccc32)c1]

mCP

Then, an emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

Emission Layer

The organic layer may include an emission layer, and the emission layer may include a first compound, a second compound, and a third compound.

The first compound and the second compound may be different from each other.

Each of the first compound and the second compound may emit light, and the third compound may not emit light.

The first compound and the second compound may satisfy one of Conditions 1 to 4:

| | |
|---|---|
| 400 nm≤$\lambda_{max1}$<500 nm, and 400 nm≤$\lambda_{max2}$<500 nm | Condition 1 |
| 500 nm≤$\lambda_{max1}$<550 nm, and 500 nm≤$\lambda_{max2}$<550 nm | Condition 2 |
| 550 nm≤$\lambda_{max1}$<620 nm, and 550 nm≤$\lambda_{max2}$<620 nm | Condition 3 |
| 620 nm≤$\lambda_{max1}$<700 nm, and 620 nm≤$\lambda_{max2}$<700 nm | Condition 4 |

In Conditions 1 to 4, $\lambda_{max1}$ is a maximum emission wavelength of the first compound, and $\lambda_{max2}$ is a maximum emission wavelength of the second compound.

Specifically, $\lambda_{max1}$ refers to a wavelength value of the first compound diluted to a concentration of 10 mM in $CHCl_3$, which indicates the greatest intensity in a photoluminescence (PL) spectrum obtained at room temperature by using an ISC PC1 Spectrofluorometer equipped with a xenon lamp. $\lambda_{max2}$ may be measured on the second compound in the same condition.

When the first compound and the second compound satisfy one selected from Conditions 1 to 4, the first compound and the second compound may emit similar color light.

The first compound and the second compound may satisfy Inequality 1-1 or 1-2:

| | |
|---|---|
| $PLS(C1) \leq PLS(C2)$ | Inequality 1-1 |
| $(\lambda_{max2}-\lambda_{max1})+PLS(C1) \leq PLS(C2)$ | Inequality 1-2 |

In Inequalities 1-1 and 1-2, PLS(C1) is a photostability of the first compound, and PLS(C2) is a photostability of the second compound.

Specifically, PLS(C1) may be calculated through Equation P:

| | |
|---|---|
| $PLS(C1)(\%) = I_2(C1)/I_1(C1) \times 100$ | Equation P |

In Equation P, $I_1(C1)$ is maximum light intensity obtained by measuring PL spectra at room temperature under an inert environment where outside air is blocked, with respect to a film that is formed by depositing the first compound alone or with the third compound on a quartz substrate followed by performing encapsulation with a glass substrate.

In Equation P, $I_2(C1)$ is maximum light intensity obtained by measuring PL spectra at room temperature under an inert environment where outside air is blocked, with respect to a film. The film is formed by depositing the first compound alone or with the third compound on a quartz substrate followed by performing encapsulation with a glass substrate. The film is then exposed to pumping laser light used for evaluation of $I1(C1)$ under an inert environment for 3 hours before measuring PL spectra.

PLS(C2) may be calculated in the same manner with respect to the second compound.

The first compound and the second compound may satisfy Inequality 2:

$$kr(C1) \geq kr(C2) \qquad \text{Inequality 2}$$

In Inequality 2, $kr(C1)$ is a radiative decay rate of the first compound, and $kr(C2)$ is a radiative decay rate of the second compound.

The value of $kr(C1)$ may be calculated through photoluminescence quantum efficiency (PLQY) and decay lifetime (Tau) measured in a thin film manufactured by mixing the first compound with polymethyl (meth)acrylate (PMMA) or the third compound.

Specifically, when the first compound is a fluorescence emitter or a phosphorescence emitter, $kr(C1)$ may be represented by (PLQY/Tau) obtained by dividing PLQY by Tau. When the first compound is a delayed fluorescence emitter, $kr(C1)$ may be represented by a value obtained by i) obtaining a ratio of a delayed fluorescence component with respect to a total emission component and ii) multiplying PLQY by the ratio of the delayed fluorescence component and dividing the same by Tau.

As used herein, PLQY is defined as a ratio of emitted photons to photons absorbed in a sample, and may be measured by a device (Quntaurus-QY or the like) including a xenon lamp as an excitation light source, a spectrometer, an integrating sphere, and a detector.

Tau may be determined by evaluating a PL spectrum at room temperature by using a FluoTime 300 (manufactured by PicoQuant) and a pumping source PLS340 (excitation wavelength=340 nm, spectrum width=20 nm) (manufactured by PicoQuant). Specifically, a wavelength of a main peak of the obtained spectrum may be determined, and PLS340 repeatedly measured the number of photons emitted from each sample at the wavelength of the main peak due to a photon pulse (pulse width=500 ps) applied to each film according to time based on time-correlated single photon counting (TCSPC), thereby obtaining a sufficiently fittable time-resolved photoluminescence (TRPL) curve. Tau may be calculated therefrom by fitting two or more exponential decay functions. At this time, a background signal curve was obtained by repeating the same measurement once more for the same measurement time as the measurement time for obtaining the TRPL curve in a dark state (a state in which a photon pulse signal applied to the predetermined film was blocked), and the background signal curve was fitted and used as a baseline.

The ratio of the delayed fluorescence component may be obtained by calculating a ratio of an integral value of an exponential decay function (that is, a change in intensity according to time) with respect to the time determined as Tau to an integral value of total emission intensity with respect to the time determined as the TRPL curve.

When the first compound was a phosphorescence emitter or a delayed fluorescence emitter, the function used for fitting was represented by Equation A below, and the greatest one among Tau(s) obtained therefrom was taken.

When the first compound was a fluorescence emitter, Tau was obtained from Equation B through amplitude values ($A_1, A_2, A_3$, or the like) and Tau values ($Tau_1, Tau_2, Tau_3$, or the like) obtained through fitting:

$$f(t) = \sum_{i=1}^{n} A_i \exp(-t/T_{decay,i}) \qquad \text{Equation A}$$

$$Tau = \left(\sum_{i=1}^{n} A_i \times Tau_i\right) \div \left(\sum_{i=1}^{n} A_i\right) \qquad \text{Equation B}$$

The value of $kr(C2)$ may be measured in the same manner as in $kr(C1)$, except that the first compound was changed to the second compound.

For example, the organic light-emitting device according to the embodiment may further satisfy Equations 2-1 and 2-2 below:

$$LT(C1+C2) > LT(C1) \qquad \text{Inequality 2-1}$$

$$LT(C1+C2) > LT(C2) \qquad \text{Inequality 2-2}$$

In Inequalities 2-1 and 2-2, $LT(C1)$ is a lifespan of a comparable organic light-emitting device including only the first compound and not including the second compound from between the first and the second compounds, $LT(C2)$ is a lifespan of a comparable organic light-emitting device including only the second compound and not including the first compound from between the first and the second compounds.

The value of $LT(C1+C2)$ is a lifespan of the organic light-emitting device according to an embodiment (i.e., including both the first compound and the second compound). In other words, the comparable organic light-emitting devices are identical to the organic light-emitting device described herein, except the comparable organic light-emitting devices do not include both the first compound and the second compound together in a same device.

The organic light-emitting device according to an embodiment may have improved lifespan as compared with the both of the organic light-emitting device including the first compound alone and the organic light-emitting device including the second compound alone. Specifically, the lifespan of the organic light-emitting device according to an embodiment is not similar to the lifespan of the organic light-emitting device including a compound having a longer lifespan between the first compound and the second compound, but may be remarkably improved. Although not limited to a specific theory, it may be thought to be due to i) a current stress dispersion effect, ii) an optical stress dispersion effect, iii) and an expansion effect of an emission region. Specifically, when the first compound is relatively stronger in resistance to current stress than the second compound, the current stress of the second compound is dispersed to the first compound, thereby improving the lifespan. When the first compound is relatively stronger in resistance to optical stress than the second compound, the optical stress of the second compound is dispersed to the first compound through energy transfer between the first compound and the second compound, thereby improving the lifespan. In addition, since the first compound and the second compound are used together, charge balance in the emission layer is improved. Therefore, the emission region may be expanded, thereby improving the lifespan.

For example, the organic light-emitting device according to the embodiment may further satisfy Inequality 2-3:

$$EQE(C2) \leq EQE(C1+C2) \leq EQE(C1) \quad \text{Inequality 2-3}$$

In Inequality 2-3, EQE(C1) is the external quantum efficiency of the comparable organic light-emitting device including only the first compound and not including the second compound from between the first and the second compounds, EQE(C2) is the external quantum efficiency of the comparable organic light-emitting device including only the second compound and not including the first compound from between the first and the second compounds, and EQE(C1+C2) is the external quantum efficiency of the organic light-emitting device according to an embodiment.

The organic light-emitting device according to an embodiment may have external quantum efficiency (EQE) close to an average value of the external quantum efficiency of the comparable organic light-emitting device including the first compound alone and the external quantum efficiency of the comparable organic light-emitting device including the second compound alone. As used herein, the external quantum efficiency of the organic light-emitting device is closer to the external quantum efficiency of the organic light-emitting device including a compound having a larger radiative decay rate between the first compound and the second compound. Although not limited to a specific theory, it is thought because a compound having a larger radiative decay rate further participates in light emission.

In an embodiment, a maximum emission wavelength ($\lambda_{max1}$) of the first compound and a maximum emission wavelength ($\lambda_{max2}$) of the second compound may satisfy Condition 1, but embodiments of the present disclosure are not limited thereto.

In an embodiment, an amount of the first compound in the emission layer may be larger than an amount of the second compound, but embodiments of the present disclosure are not limited thereto.

For example, the amount of the first compound in the emission layer and the amount of the second compound may each independently be in a range of about 1 weight percent (wt %) to about 20 wt %, based on the total weight of the emission layer, but embodiments of the present disclosure are not limited thereto.

In an embodiment, the amount of the first compound in the emission layer may be in a range of about 5 wt % to about 20 wt %, and the amount of the second compound in the emission layer may be in a range of about 1 wt % to about 10 wt %, but embodiments of the present disclosure are not limited thereto.

In an embodiment, the amount of the first compound in the emission layer may be in a range of about 10 wt % to about 20 wt %, and the amount of the second compound in the emission layer may be in a range of about 1 wt % to about 10 wt %, but embodiments of the present disclosure are not limited thereto.

In an embodiment, each of the first compound and the second compound may have PLQY of about 10% to about 100%, but embodiments of the present disclosure are not limited thereto.

In an embodiment, an energy gap (Eg1) of first compound (i.e., band gap) and an energy gap (Eg2) of the second compound (i.e., band gap) may satisfy Inequality 2-4, but embodiments of the present disclosure are not limited thereto:

$$|Eg1-Eg2|<0.15 \text{ electron volts (eV)} \quad \text{Inequality 2-4}$$

In Inequality 2-4, Eg1 may be calculated by measuring a PL spectrum of a solution in which the first compound was diluted in $CHCl_3$ at a concentration of 10 millimolar (mM). In the PL spectrum, a y-axis represents emission intensity, and an x-axis represents a wavelength. A tangent line was drawn with respect to the rise of the PL spectrum on the short wavelength side, and a wavelength value $\lambda_{edge}$ [nm] of the intersection of the tangent line and the x-axis was obtained. Eg1 was determined by converting the wavelength value into an energy value using Equation 2-4a.

$$Eg1 \text{ [eV]}=1239.85/\lambda_{edge} \text{ [nm]} \quad \text{Equation 2-4a}$$

Eg2 may be measured in the same manner in the same condition with respect to the second compound.

When the first compound and the second compound satisfy Inequality 2-4, each of the first compound and the second compound may emit light. Therefore, the light emitted by the organic light-emitting device according to the embodiment may have a combined color of light emitted by the first compound and light emitted by the second compound.

In an embodiment, the first compound may be a delayed fluorescence emitter, and the second compound may be a delayed fluorescence emitter; the first compound may be a phosphorescence emitter, and the second compound may be a phosphorescence emitter; the first compound may be a delayed fluorescence emitter, and the second compound may be a phosphorescence emitter; the first compound may be a phosphorescence emitter, and the second compound may be a delayed fluorescence emitter; or the first compound may be a fluorescence emitter, and the second compound may be a fluorescence emitter, but embodiments of the present disclosure are not limited thereto. When both the first compound and the second compound are the same type of emitter, the first compound and the second compound are not the same compound. For example, when the first compound and the second compound are each a fluorescence transmitter, the first compound may be a first fluorescence transmitter and the second compound may be a second fluorescence transmitter, wherein the first and second fluorescence transmitters are not the same compound.

For example, the delayed fluorescence emitter may satisfy Inequality 3, but embodiments of the present disclosure are not limited thereto:

$$0 \text{ eV} \leq [E_{S1}(TADF)-E_{T1}(TADF)] \leq 0.3 \text{ eV} \quad \text{Inequality 3}$$

In Inequality 3, $E_{S1}(TADF)$ is a lowest excitation singlet energy level of the delayed fluorescence emitter in electron volts, and $E_{T1}(TADF)$ is a lowest excitation triplet energy level of the delayed fluorescence emitter in electron volts.

In an embodiment, the delayed fluorescence emitter may be represented by Formulae 1. Formula 2, or a combination thereof, but embodiments of the present disclosure are not limited thereto:

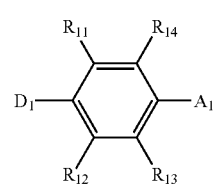

Formula 1

-continued

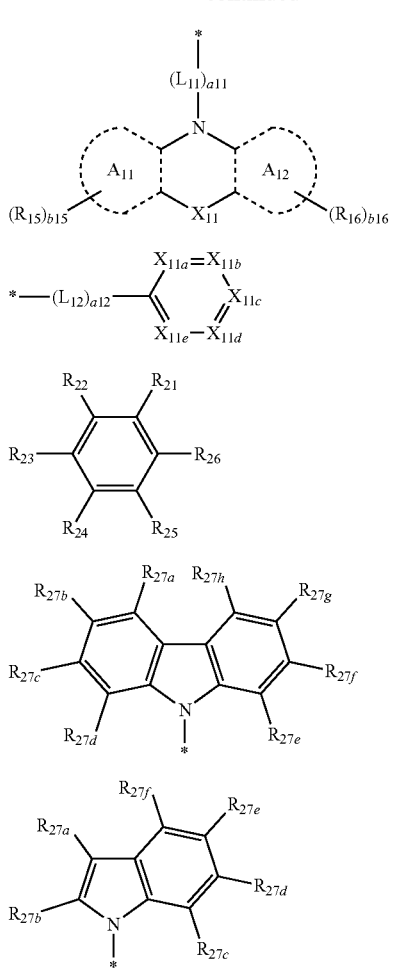

Formula 11-1

Formula 12-1

Formula 2

Formula 13-1

Formula 13-2

In Formulae 1, 2, 11-1, 12-1, 13-1, and 13-2, $D_1$ may be a group represented by Formula 11-1, $A_1$ may be a group represented by Formula 12-1, $X_{11}$ may be a single bond, O, S, N($R_{17}$), or C($R_{17}$)($R_{16}$); $A_{11}$ and $A_{12}$ may each independently be a benzene group, a fluorene group, a carbazole group, a dibenzofuran group, or a dibenzothiophene group; $L_{11}$ and $L_{12}$ may each independently be a substituted or unsubstituted $C_5$-$C_{30}$ carbocyclic group or a substituted or unsubstituted $C_1$-$C_{30}$ heterocyclic group; a11 and a12 may each independently be 0, 1, 2, or 3; $X_{11a}$ may be N or C($R_{11a}$); $X_{11b}$ may be N or C($R_{11b}$); $X_{11c}$ may be N or C($R_{11c}$); $X_{11d}$ may be N or C($R_{11d}$); and $X_{11e}$ may be N or C($R_{11e}$), wherein at least one of $X_{11a}$ to $X_{11e}$ is N.

In Formulae 1, 2, 11-1, 12-1, 13-1, and 13-2, $R_{21}$ to $R_{27}$ may each independently be a group represented by Formula 13-1, a group represented by Formula 13-2, hydrogen, deuterium, —F, —Cl, —Br, —I, a hydroxyl group, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group; at least one of $R_{21}$ to $R_{27}$ may be a cyano group; at least one of $R_{21}$ to $R_{27}$ may be a group represented by Formula 13-1 or a group represented by Formula 13-2; $R_{11}$ to $R_{16}$, $R_{11a}$ to $R_{11e}$, and $R_{27a}$ to $R_{27h}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), or —B($Q_6$)($Q_7$); b15 and b16 may each independently be 1, 2, 3, 4, 5, 6, 7, or 8; $Q_1$ to $Q_7$ may each independently be hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, and * indicates a bonding site to a neighboring atom.

In an embodiment, the delayed fluorescence emitter may be one of Compounds $C_1$ to $C_4$, $C_6$, $C_7$, or a combination thereof, but embodiments of the present disclosure are not limited thereto:

C1

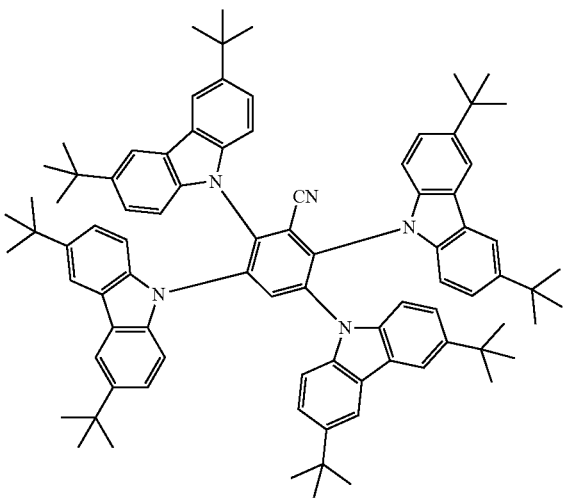

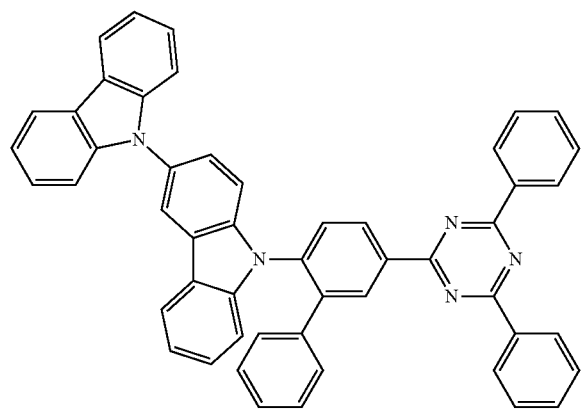

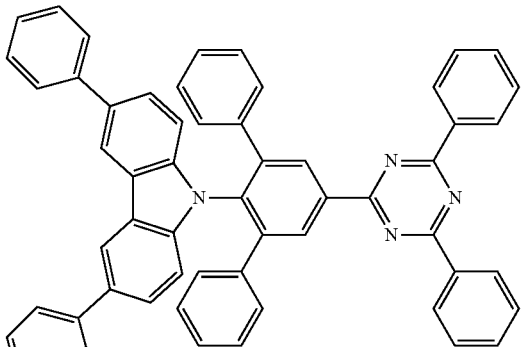

For example, the phosphorescence emitter may be represented by Formula 81, but embodiments of the present disclosure are not limited thereto:

$$M(L_{81})_{n81}(L_{82})_{n82} \quad \text{Formula 81}$$

In Formulae 81, M may be a first-row transition metal, a second-row transition metal, and a third-row transition metal of the Periodic Table of Elements; $L_{81}$ may be a ligand represented by Formula 81A; n81 may be an integer from 1 to 3, wherein, when n81 is two or more, two or more $L_{81}$(s) may be identical to or different from each other; $L_{82}$ may be an organic ligand; and n82 may be an integer from 0 to 4, wherein, when n82 is two or more, two or more $L_{82}$(s) may be identical to or different from each other.

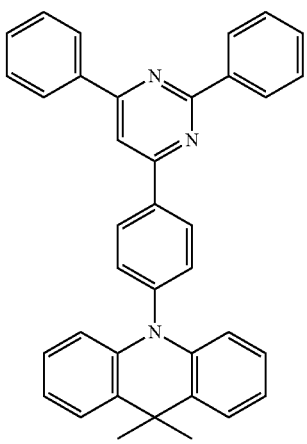

Formula 81A

In Formula 81A, $Y_{81}$ to $Y_{84}$ may each independently be carbon (C) or nitrogen (N); $Y_{81}$ and $Y_{82}$ may be linked via a single bond or a double bond; $Y_{83}$ and $Y_{84}$ may be linked via a single bond or a double bond; $CY_{81}$ and $CY_{82}$ may each independently be a $C_5$-$C_{30}$ carbocyclic group or a $C_3$-$C_{30}$ heterocarbocyclic group; $CY_{81}$ and $CY_{82}$ may optionally be further linked together via an organic linking group; $R_{81}$ and $R_{82}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{60}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C60$ heteroaryl group, a substituted or unsubstituted monovalent non-aromatic condensed polycyclic group, a substituted or unsubstituted monovalent non-aromatic condensed heteropolycyclic group, —$Si(Q_{81})(Q_{82})(Q_{83})$, —$N(Q_{84})(Q_{85})$, —$B(Q_{86})(Q_{87})$, or —$P(=O)(Q_{88})(Q_{89})$; a81 and a82 may each independently be an integer from 1 to 5, with the proviso that when a81 is two or more, two or more groups $R_{81}$ may be identical to or different from each other, when a82 is two or more, two or more groups $R_{82}$ may be identical to or different from each other, when a81 is two or more, neighboring group $R_{81}$ may optionally be linked to form a saturated or unsaturated ring, when a82 is two or more, neighboring groups $R_{82}$ may optionally be linked to form a saturated or unsaturated ring; wherein two, three, or four of a plurality of neighboring groups $R_{81}$ and groups $R_{82}$ may optionally be linked to a four-coordinate, six-coordinate, or eight-coordinate ligand; wherein in Formula 81A, * and *' each indicate a bonding site to M in Formula 81; and $Q_{81}$ to $Q_{89}$ and $Q_{91}$ to $Q_{93}$ may each independently be hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

In an embodiment, the phosphorescence emitter may be Compound C5, but embodiments of the present disclosure are not limited thereto:

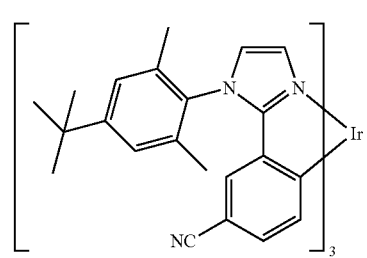

C5

For example, the fluorescence emitter may satisfy Inequality 4, but embodiments of the present disclosure are not limited thereto:

$$0\ eV \leq [E_{S1}(F) - E_{T1}(F)] < 0.5\ eV \qquad \text{Inequality 4}$$

In Inequality 4, $E_{S1}(F)$ is a lowest excitation singlet energy level of the fluorescence emitter in electron volts, and $E_{T1}(F)$ is a lowest excitation triplet energy level of the fluorescence emitter in electron volts.

In an embodiment, the fluorescence emitter may be an anthracene derivative, a pyrene derivative, a chrysene derivative, a fluoranthene derivative, a perylene derivative, a fluorene derivative, an aryl acetylene derivative, a styryl arylene derivative, a styryl amine derivative, an aryl amine derivative, a boron complex, a coumarin-based dye, a pyran-based dye, a cyanine-based dye, a croconium dye, a squarylium dye, an oxobenzoanthracene-based dye, a fluororesin-based dye, a rhodamine dye, a pyrylium dye, a perylene-based dye, a stilbene-based dye, a polythiophene-based dye, or a compound having a high fluorescence quantum yield and represented by a rare-earth complex-based phosphor or a laser dye, but embodiments of the present disclosure are not limited thereto. Exemplary fluorescence emitters may include one or more of the following compounds:

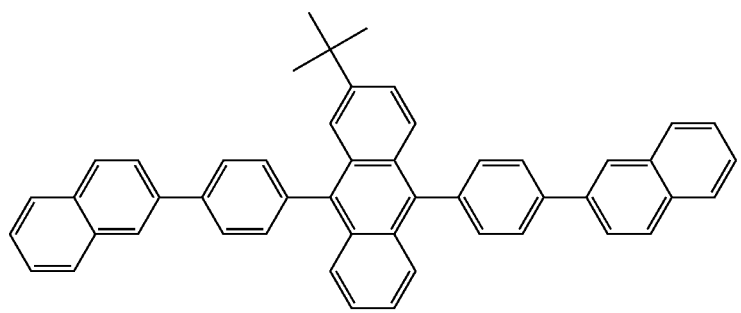

-continued
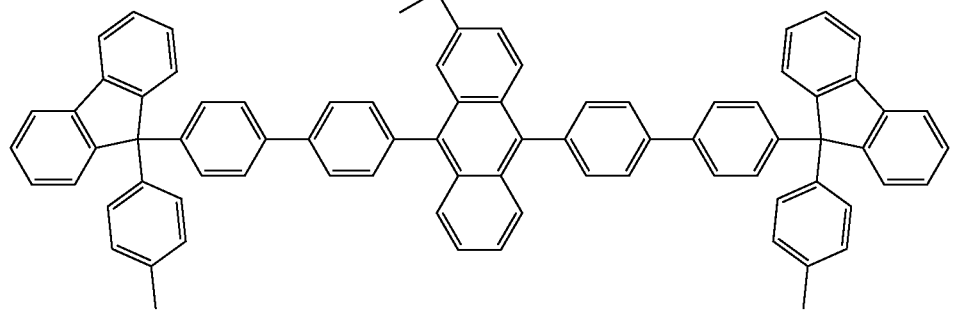
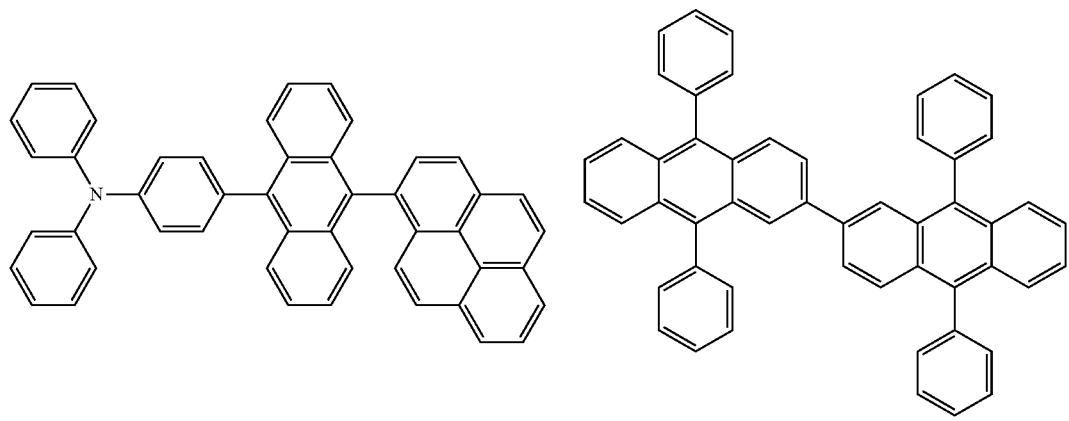
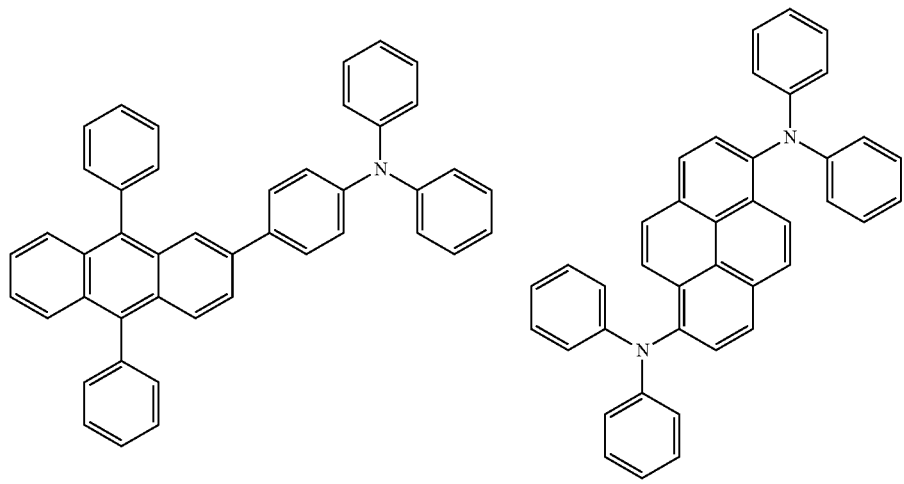
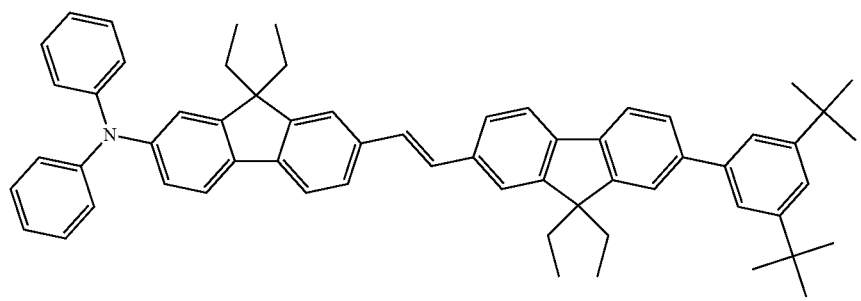

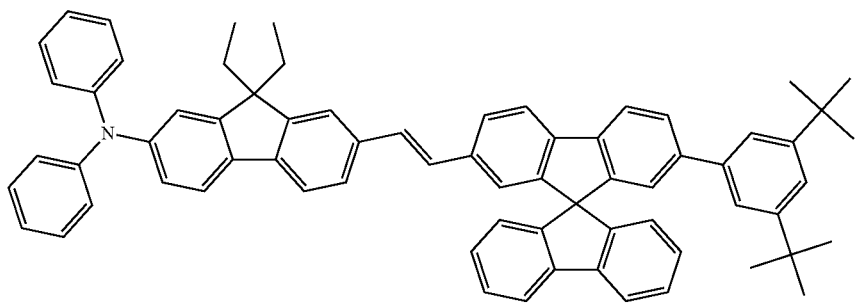
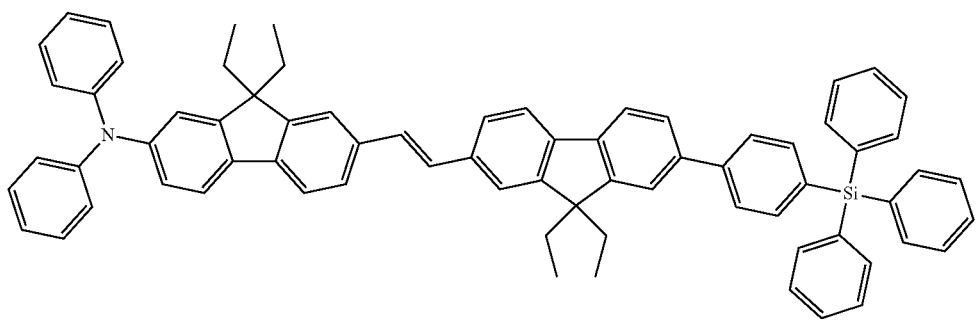
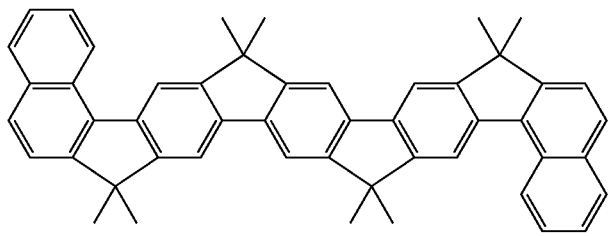
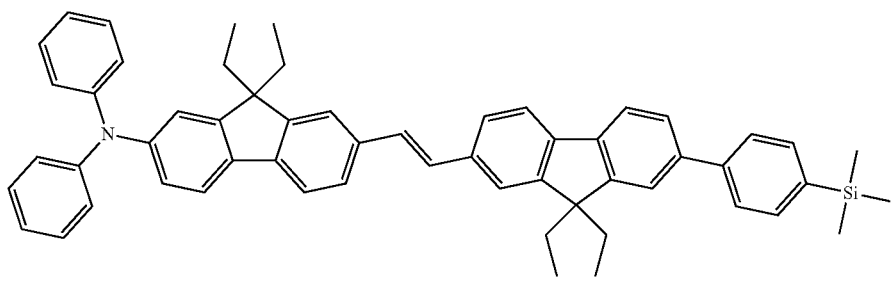
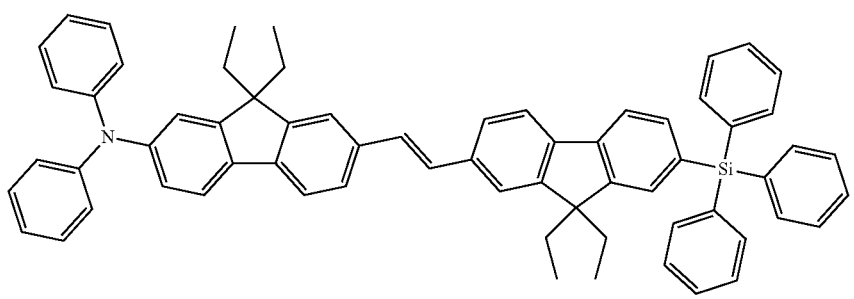

-continued
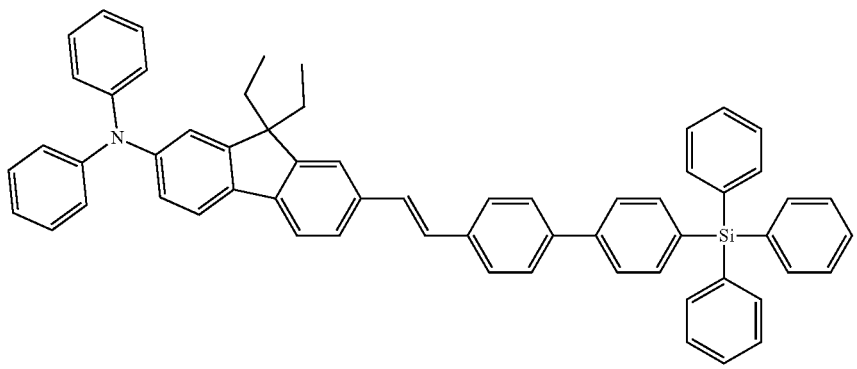
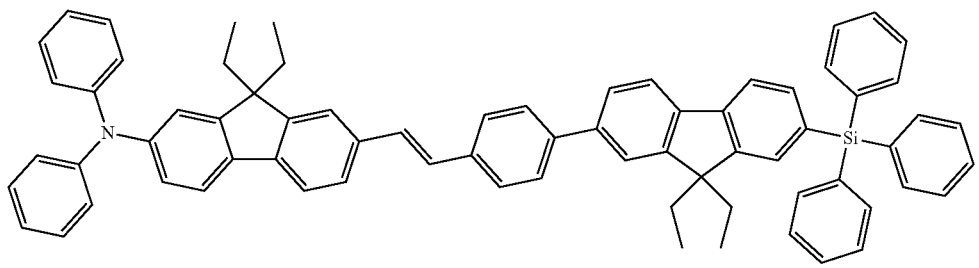
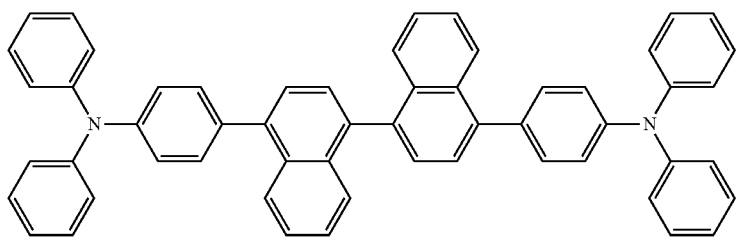
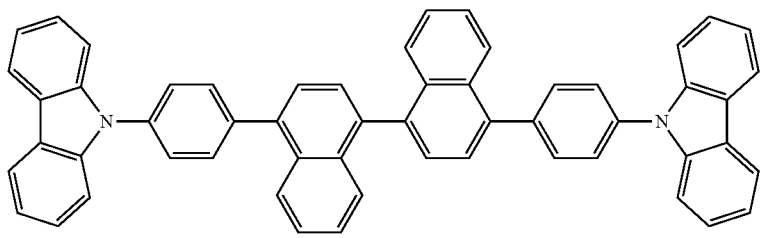
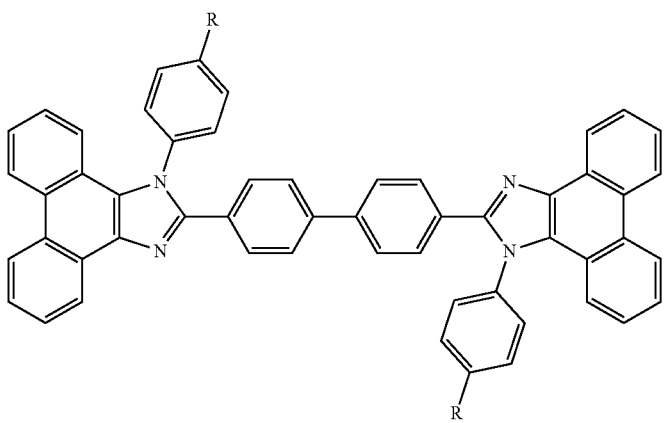
R = H
R = CH₃
R = OCH₃

-continued
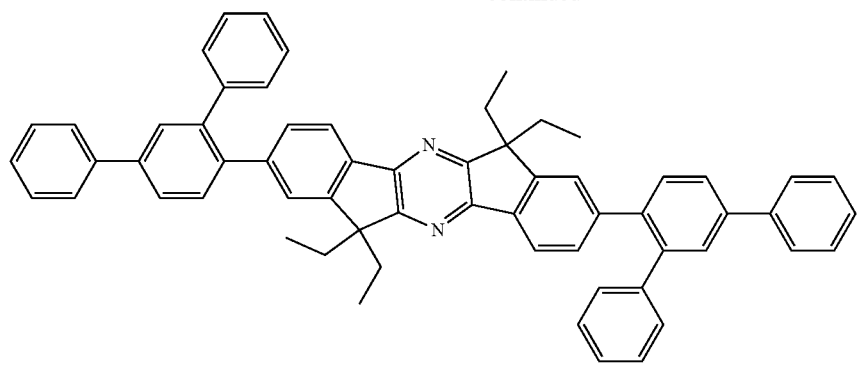
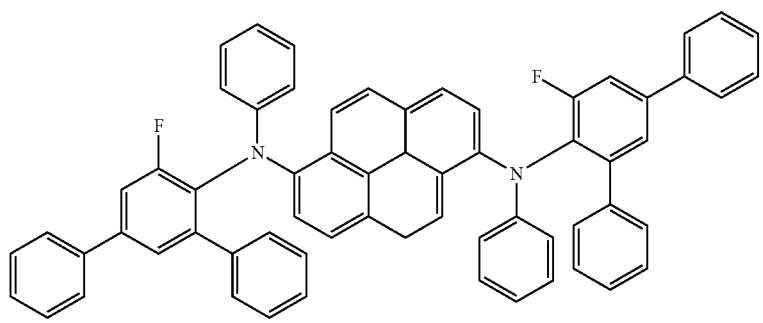
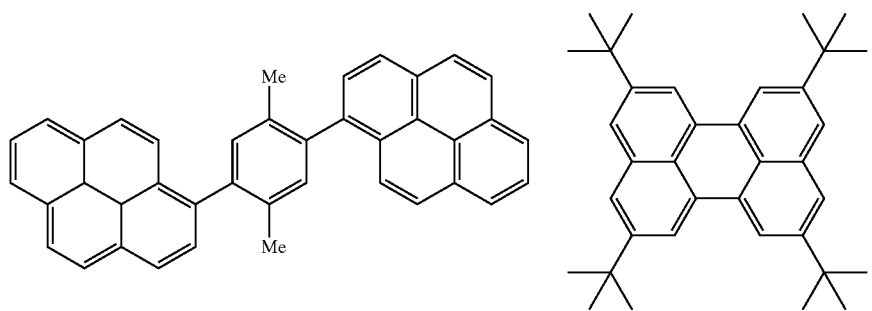
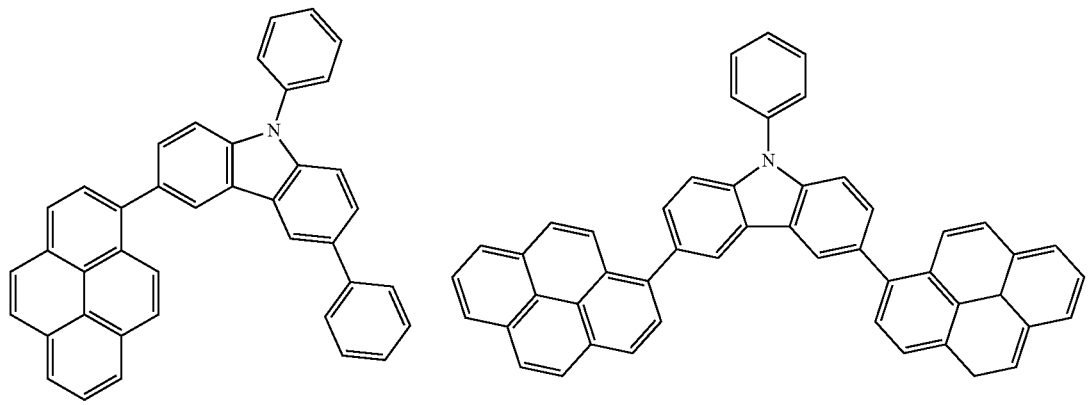

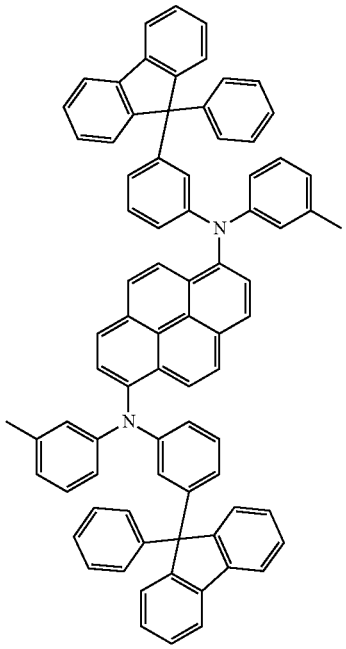

In an embodiment, the organic light-emitting device may further satisfy Inequalities 5 and 6, but embodiments of the present disclosure are not limited thereto:

$$CIE_x(C1) < CIE_x(C1+C2) < CIE_x(C2) \quad \text{Inequality 5}$$

$$CIE_y(C1) < CIE_y(C1+C2) < CIE_y(C2) \quad \text{Inequality 6}$$

In Inequalities 5 and 6, $CIE_x(C1)$ is an x value of a CIE color coordinate of the comparable organic light-emitting device including only the first compound and not including the second compound from between the first and the second compounds, $CIE_x(C2)$ is an x value of a CIE color coordinate of the comparable organic light-emitting device including only the second compound and not including the first compound from between the first and the second compounds, $CIE_x(C1+C2)$ is an x value of a CIE color coordinate of the organic light-emitting device, $CIE_y(C1)$ is a y value of a CIE color coordinate of the comparable organic light-emitting device including only the first compound and not including the second compound from between the first and the second compounds, $CIE_y(C2)$ is a y value of a CIE color coordinate of the comparable organic light-emitting device including only the second compound and not including the first compound from between the first and the second compounds, and $CIE_y(C1+C2)$ is a y value of a CIE color coordinate of the organic light-emitting device.

In an embodiment, the organic light-emitting device may further satisfy Equation 1, but embodiments of the present disclosure are not limited thereto:

$$A(C1+C2) = [a \times A(C1)] + [b \times A(C2)] \quad \text{Equation 1}$$

In Equation 1, a and b may each independently be a real number greater than 0 and less than 1, the sum of a and b may be 1, $A(C1+C2)$ is an area of a region defined by the x-axis and the EL spectrum of the organic light-emitting device, $A(C1)$ is an area of a region defined by the x-axis and the EL spectrum of the comparable organic light-emitting device including only the first compound and not including the second compound from between the first and the second compounds, and $A(C2)$ is an area of a region defined by the x-axis and the EL spectrum of the comparable organic light-emitting device including only the second compound and not including the first compound from between the first and the second compounds.

In other words, the area of the region defined by the x-axis and the EL spectrum is the area under the curve in each EL spectrum.

The emission layer further includes a third compound. For example, an amount of the third compound in the emission layer may be in a range of about 60 wt % to about 98 wt %, based on the total weight of the emission layer, but embodiments of the present disclosure are not limited thereto.

In an embodiment, the amount of the third compound in the emission layer may be in a range of about 80 wt % to about 97 wt %, but embodiments of the present disclosure are not limited thereto. While not wishing to be bound by theory, it is understood that when the amount of the third compound is within this range, the third compound may act as a matrix in the emission layer, may prevent efficiency from being reduced due to self-quenching between neighboring emission compounds by dispersing the emission compound (for example, the first compound and/or the second compound), and may manage charge movement to reduce charge stress of neighboring emission compounds, thereby contributing to improvement in lifespan.

In an embodiment, the third compound may satisfy at least one of Inequalities (7-1) to (7-4), but embodiments of the present disclosure are not limited thereto:

$$S1(C3) \geq S1(C1) \quad \text{Inequality 7-1}$$

$$T1(C3) \geq T1(C1) \quad \text{Inequality 7-2}$$

$$S1(C3) \geq S1(C2) \quad \text{Inequality 7-3}$$

$$T1(C3) \geq T1(C2) \quad \text{Inequality 7-4}$$

In Inequalities (7-1) to (7-4), $S1(C1)$ is a lowest excitation singlet energy level of the first compound, $T1(C1)$ is a lowest excitation triplet energy level of the first compound, S1(C2) is a lowest excitation singlet energy level of the second compound, T1(C2) is a lowest excitation triplet energy level of the second compound, S1(C3) is a lowest excitation singlet energy level of the third compound, and T1(C3) is a lowest excitation triplet energy level of the third compound. The above-described energy levels are in electron volts.

For example, the first compound may be a delayed fluorescence emitter, the second compound may be a delayed fluorescence emitter, and the first compound and the second compound may satisfy Inequalities 7-1 to 7-4, but embodiments of the present disclosure are not limited thereto. In an embodiment, when the first compound and the second compound satisfy Inequalities 7-1 to 7-4, both the first compound and the second compound may emit light.

In an embodiment, the first compound may be a phosphorescence emitter, the second compound may be a phosphorescence emitter, and the first compound and the second compound may satisfy Inequalities 7-2 and 7-4, but embodiments of the present disclosure are not limited thereto. In an embodiment, when the first compound and the second compound satisfy Inequalities 7-2 and 7-4, both the first compound and the second compound may emit light.

In an embodiment, the first compound may be a delayed fluorescence emitter, the second compound may be a phosphorescence emitter, and the first compound and the second compound may satisfy Inequalities 7-1, 7-2, and 7-4, but embodiments of the present disclosure are not limited thereto. In an embodiment, when the first compound and the second compound satisfy Inequalities 7-1, 7-2, and 7-4, both the first compound and the second compound may emit light.

In an embodiment, the first compound may be a phosphorescence emitter, the second compound may be a delayed fluorescence emitter, and the first compound and the second compound may satisfy Inequalities 7-2 to 7-4, but embodiments of the present disclosure are not limited thereto. In an embodiment, when the first compound and the second compound satisfy Inequalities 7-2 to 7-4, both the first compound and the second compound may emit light.

In an embodiment, the first compound may be a fluorescence emitter, the second compound may be a fluorescence emitter, and the first compound and the second compound may satisfy Inequalities 7-1 and 7-3, but embodiments of the present disclosure are not limited thereto. In an embodiment, when the first compound and the second compound satisfy Inequalities 7-1 and 7-3, both the first compound and the second compound may emit light.

In an embodiment, the third compound may include an electron transport host, a hole transport host, or a combination thereof.

The electron transport host may include an electron transport moiety.

The hole transport host may not include the electron transport moiety.

The term "electron transport moiety" as used herein refers to a group that is a cyano group, a π electron-depleted nitrogen-containing cyclic group, or a group represented by one of the following formulae:

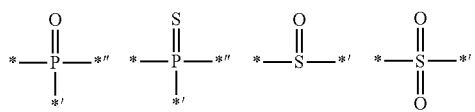

In the formulae above, *, *', and *'' each indicate a bonding site to a neighboring atom.

The term "π electron-depleted nitrogen-containing cyclic group" as used herein refers to a cyclic group having at least one *—N=*' moiety. The n electron-depleted nitrogen-containing cyclic group may be, for example, an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinolic group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, an azadibenzosilole group, or a group in which at least one of the foregoing groups is condensed with any cyclic group.

The x electron-depleted nitrogen-free cyclic group may be, for example, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, or a dihydroacridine group, but embodiments of the present disclosure are not limited thereto.

In an embodiment, the electron transport host may include a compound represented by one of Formulae 3-1 and 3-2, but embodiments of the present disclosure are not limited thereto:

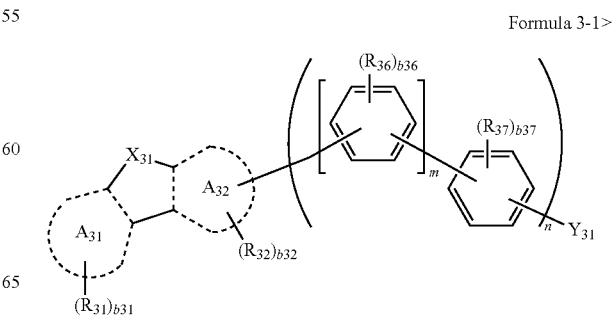

Formula 3-1>

-continued

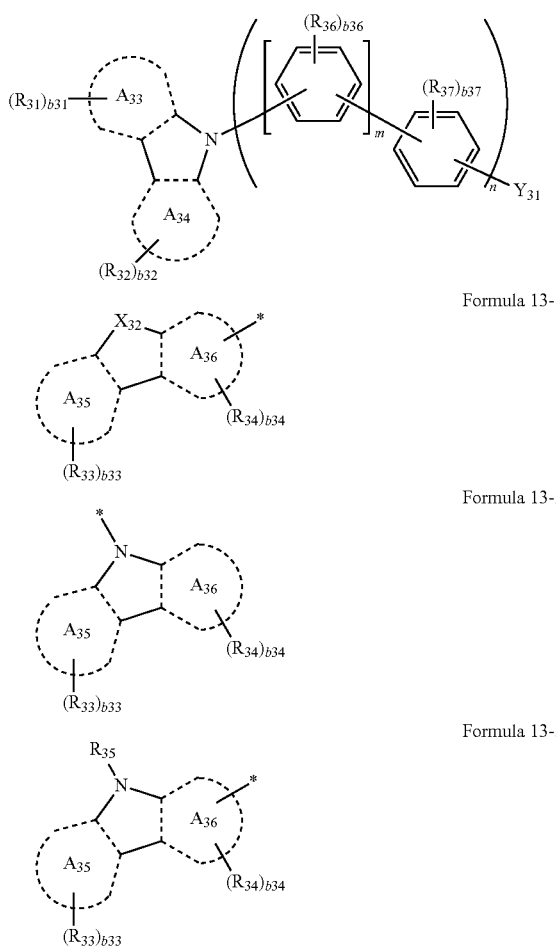

Formula 3-2

Formula 13-1

Formula 13-2

Formula 13-3

In Formulae 3-1, 3-2, and 13-1 to 13-3, $Y_{31}$ may be a group represented by one of Formulae 13-1 to 13-3, $A_{31}$ to $A_{36}$ may each independently be a benzene group, a naphthalene group, a fluorene group, a carbazole group, a dibenzosilole group, a dibenzofuran group, or a dibenzothiophene group, $X_{31}$ and $X_{32}$ may each independently be O or S, m may be 0, 1, or 2, n may be 1 or 2, $R_{31}$ to $R_{37}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), or —B($Q_1$)($Q_2$); b31 to b34, b36, and b37 may each independently be 1, 2, 3, or 4, * indicates a bonding site to a neighboring atom, and the compound represented by one of Formulae 3-1 and 3-2 may include a cyano group.

For example, in Formulae 3-1 and 3-2, $A_{31}$ to $A_{36}$ may each independently be a benzene group, a fluorene group, a carbazole group, a dibenzofuran group, or a dibenzothiophene group, wherein at least one of $A_{31}$ and $A_{32}$, at least one of $A_{33}$ and $A_{34}$, and at least one of $A_{35}$ and $A_{36}$ may each independently be a benzene group, but embodiments of the present disclosure are not limited thereto.

For example, in Formulae 3-1 and 3-2, m may be 0 or 1, and n may be 1, but embodiments of the present disclosure are not limited thereto.

For example, in Formulae 3-1 and 3-2, $R_{31}$ to $R_{37}$ may each independently be hydrogen, deuterium, a cyano group, a $C_1$-$C_{10}$ alkyl group, or a $C_1$-$C_{10}$ alkoxy group; or a $C_1$-$C_{10}$ alkyl group or a $C_1$-$C_{10}$ alkoxy group, each substituted with deuterium, a cyano group, or a combination thereof; or a phenyl group, a biphenyl group, a terphenyl group, a naphthyl group, a fluorenyl group, a carbazolyl group, a dibenzofuranyl group, or a dibenzothiophenyl group; or a phenyl group, a biphenyl group, a terphenyl group, a naphthyl group, a fluorenyl group, a carbazolyl group, a dibenzofuranyl group, or a dibenzothiophenyl group, each substituted with a deuterium, a cyano group, a $C_1$-$C_{10}$ alkyl group, a $C_1$-$C_{10}$ alkoxy group, a phenyl group, a biphenyl group, a terphenyl group, a naphthyl group, a fluorenyl group, a carbazolyl group, a dibenzofuranyl group, a dibenzothiophenyl group, but embodiments of the present disclosure are not limited thereto.

In an embodiment, the number of the cyano group included in each of the compound represented by Formula 3-1 and the compound represented by Formula 3-2 may be selected from 1, 2, 3, and 4, but embodiments of the present disclosure are not limited thereto.

For example, in Formulae 3-1 and 3-2, at least one of $R_{36}$ and $R_{37}$ may each independently be a cyano group, but embodiments of the present disclosure are not limited thereto.

In an embodiment, in Formulae 3-1 and 3-2, a group represented by:

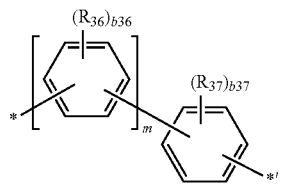

may be a group represented by Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, or P1 to P9, but embodiments of the present disclosure are not limited thereto:

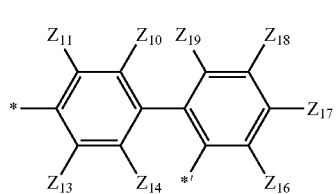

PO1

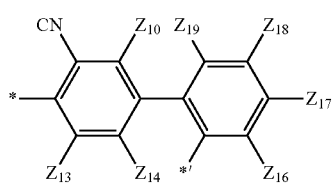 PO2
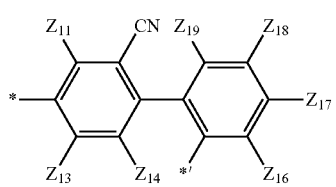 PO3
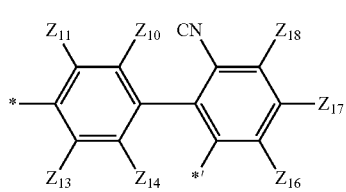 PO4
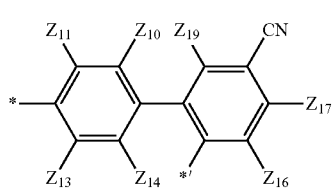 PO5
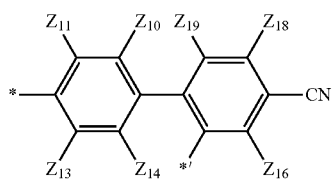 PO6
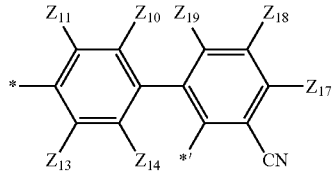 PO7
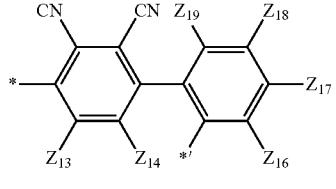 PO8
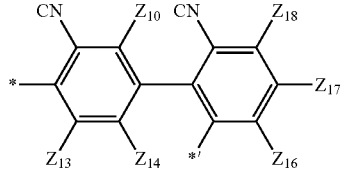 PO9
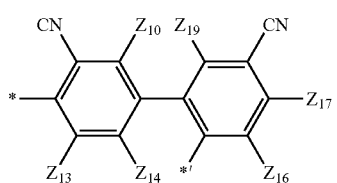 PO10
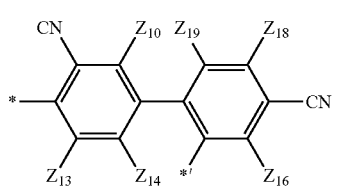 PO11
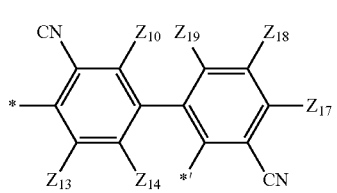 PO12
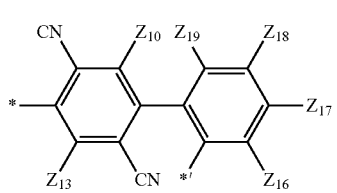 PO13
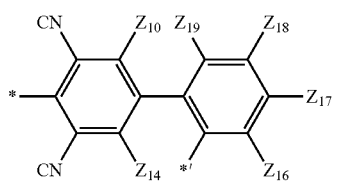 PO14
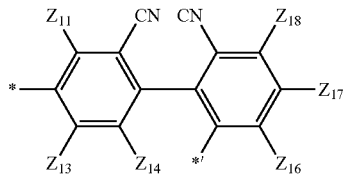 PO15
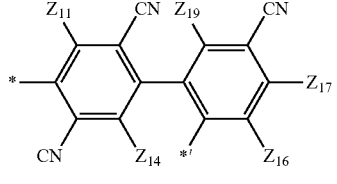 PO16
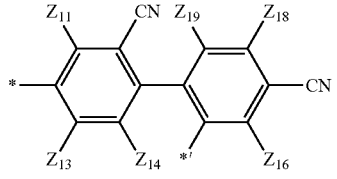 PO17

-continued
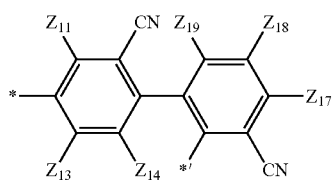 PO18
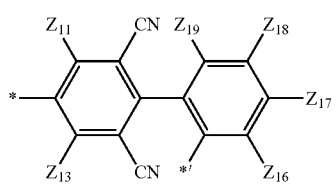 PO19
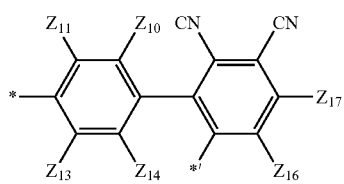 PO20
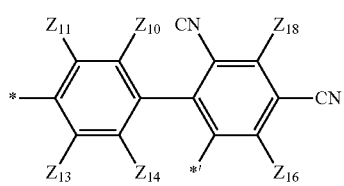 PO21
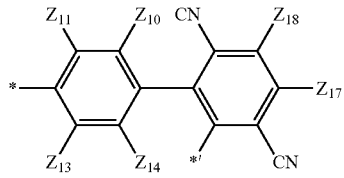 PO22
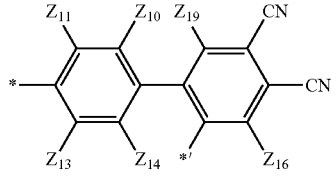 PO23
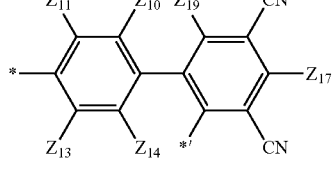 PO24
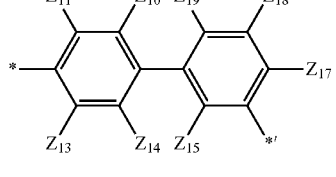 PM1
-continued
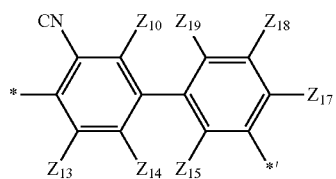 PM2
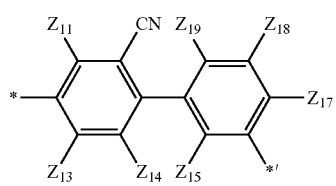 PM3
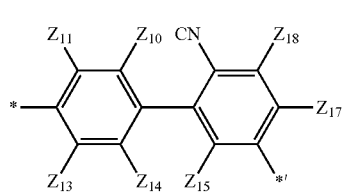 PM4
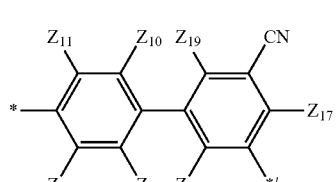 PM5
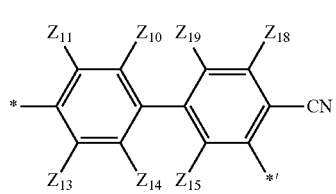 PM6
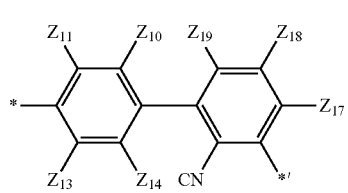 PM7
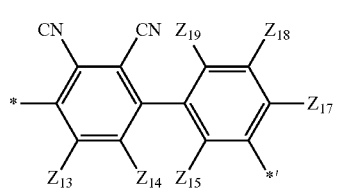 PM8
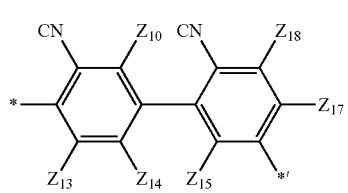 PM9

-continued
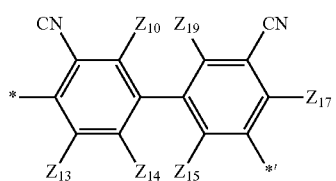
PM10
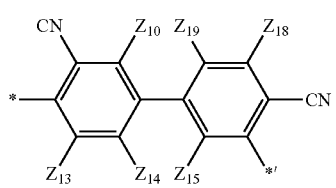
PM11
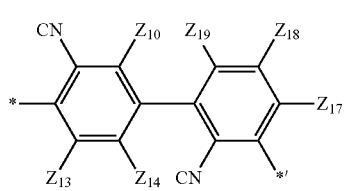
PM12
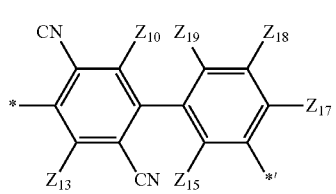
PM13
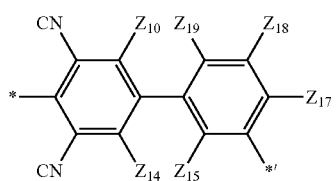
PM14
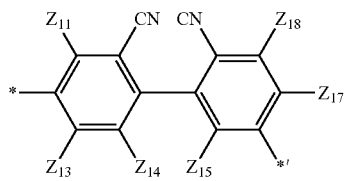
PM15
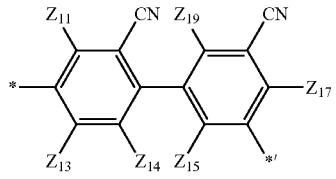
PM16
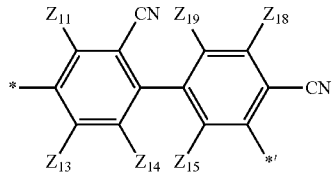
PM17
-continued
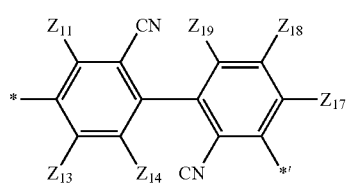
PM18
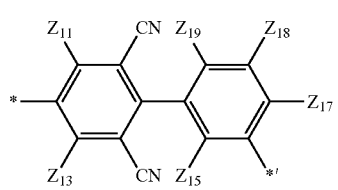
PM19
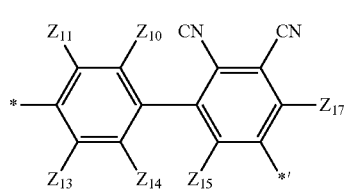
PM20
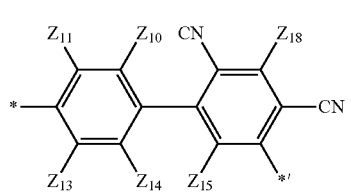
PM21
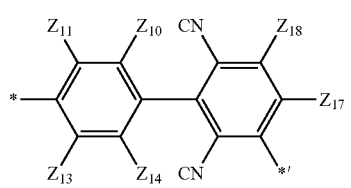
PM22
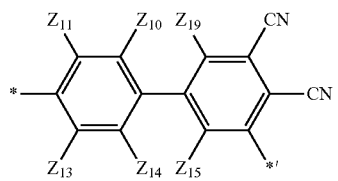
PM23
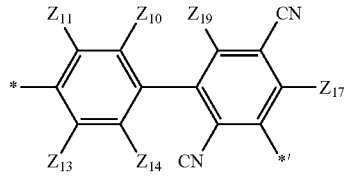
PM24
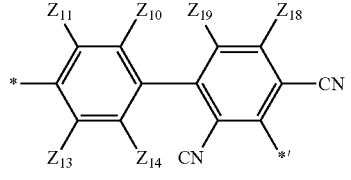
PM25

-continued
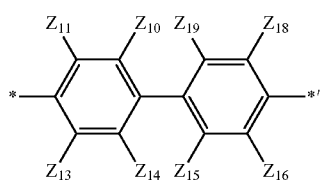
PP1
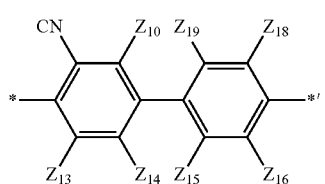
PP2
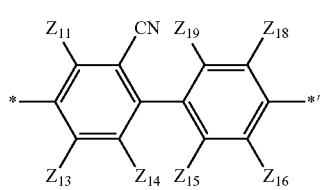
PP3
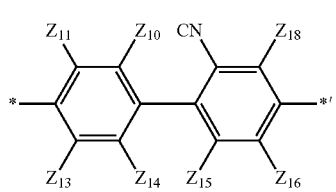
PP4
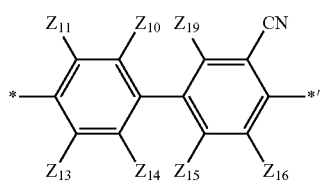
PP5
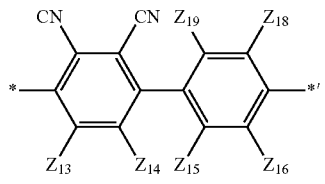
PP6
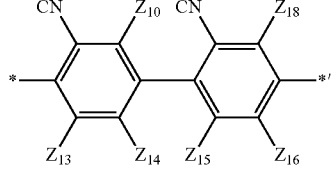
PP7
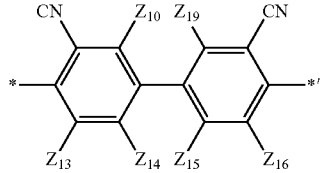
PP8
-continued
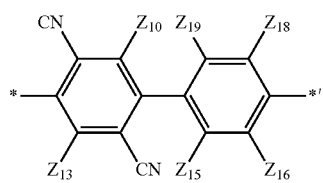
PP9
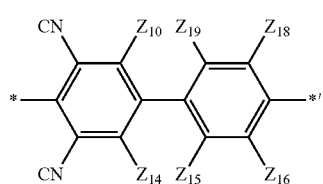
PP10
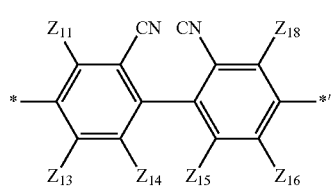
PP11
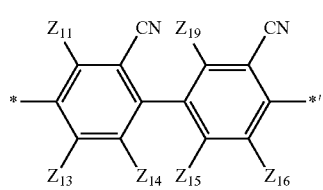
PP12
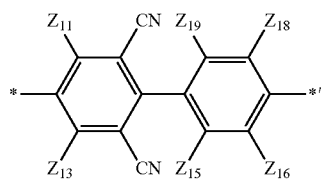
PP13
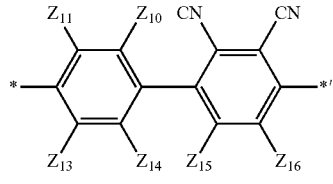
PP14
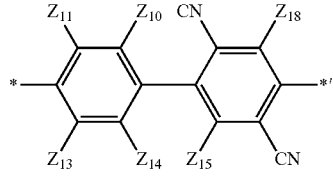
PP15
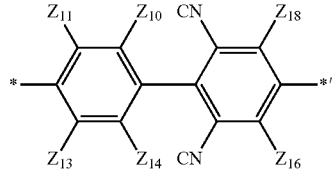
PP16

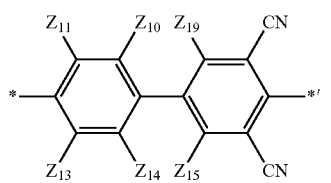 PP17
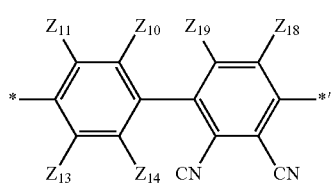 PP18
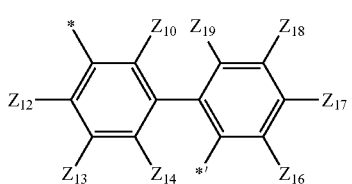 MO1
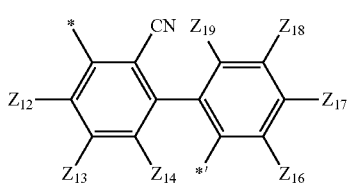 MO2
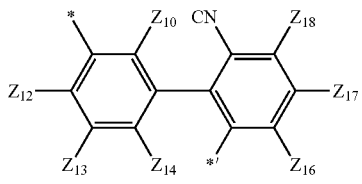 MO3
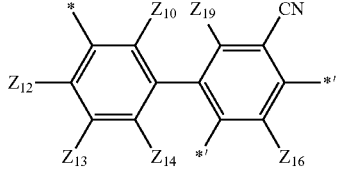 MO4
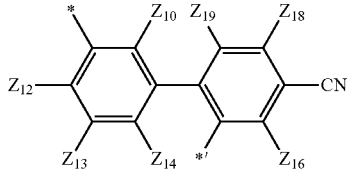 MO5
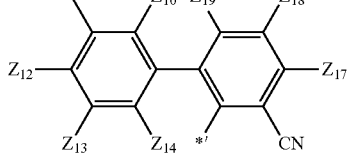 MO6
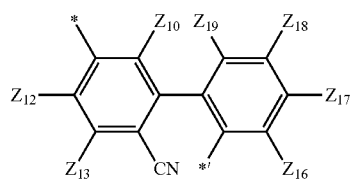 MO7
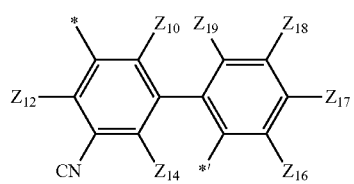 MO8
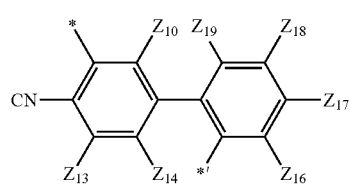 MO9
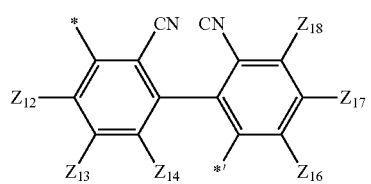 MO10
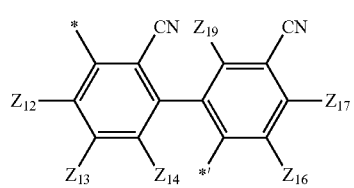 MO11
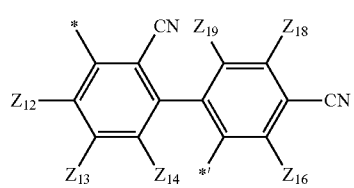 MO12
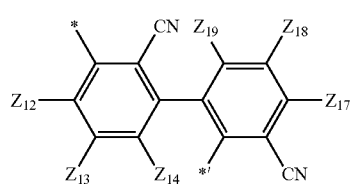 MO13
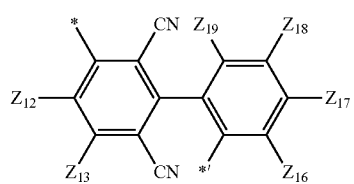 MO14

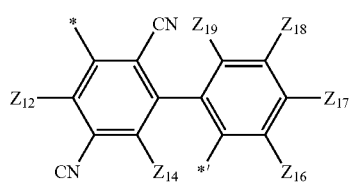 MO15
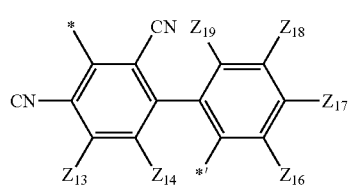 MO16
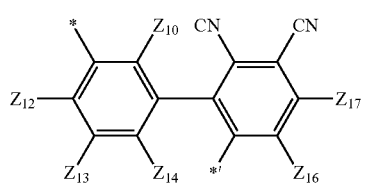 MO17
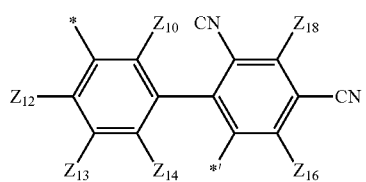 MO18
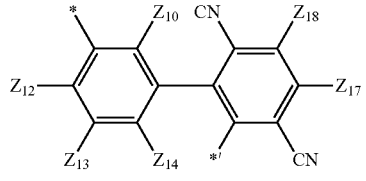 MO19
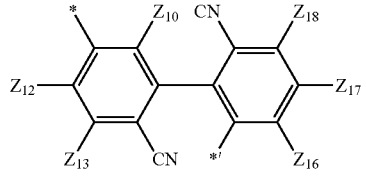 MO20
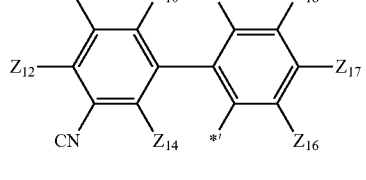 MO21
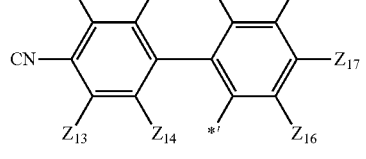 MO22
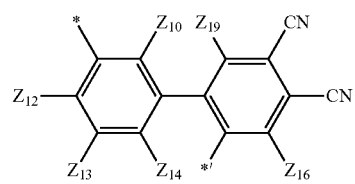 MO23
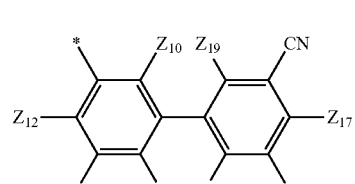 MO24
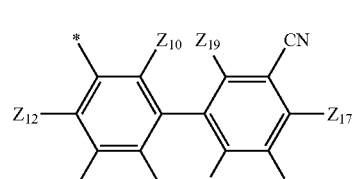 MO25
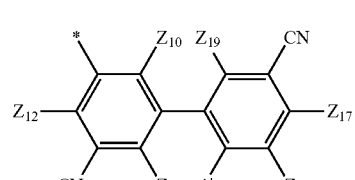 MO26
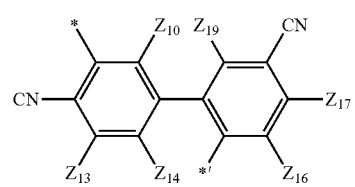 MO27
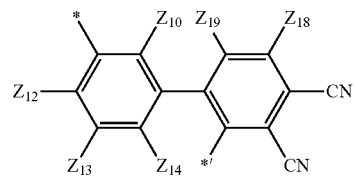 MO28
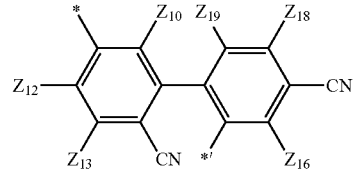 MO29
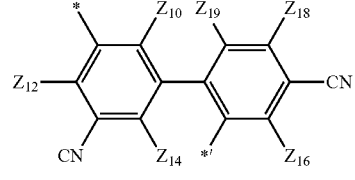 MO30

MO31 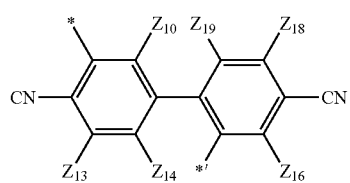
MO32 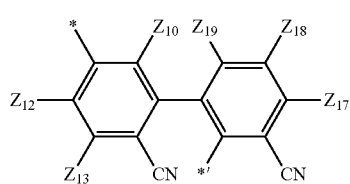
MO33 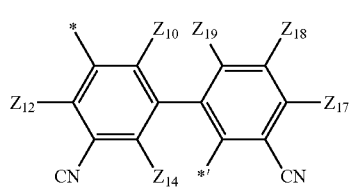
MO34 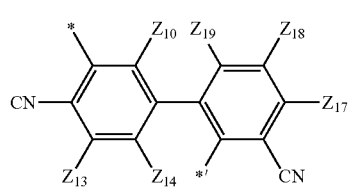
MO35 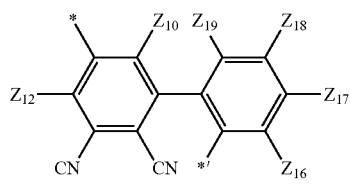
MO36 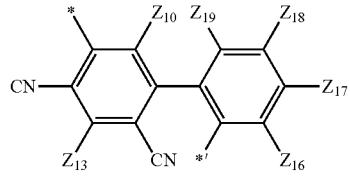
MO37 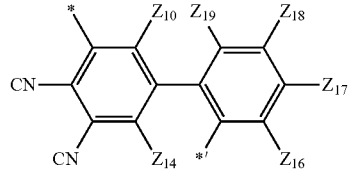
MM1 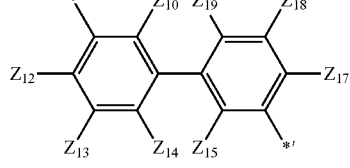
MM2 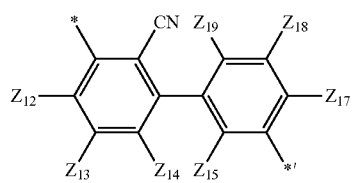
MM3 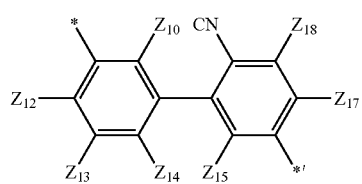
MM4 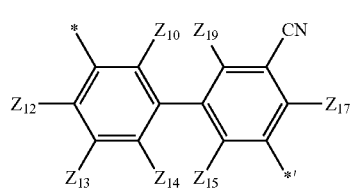
MM5 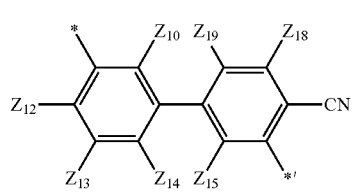
MM6 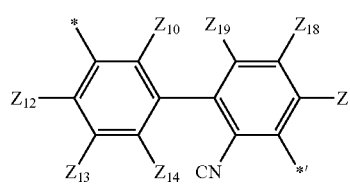
MM7 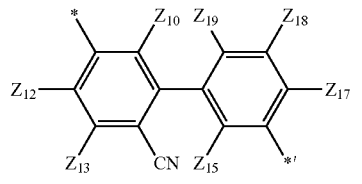
MM8 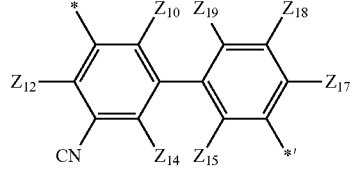
MM9 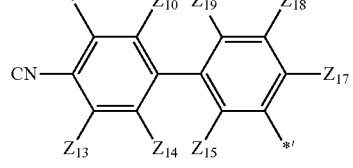

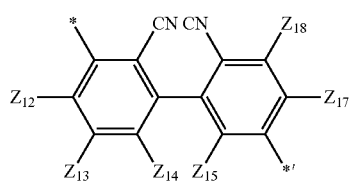 MM10
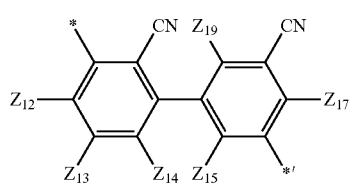 MM11
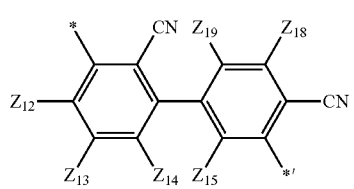 MM12
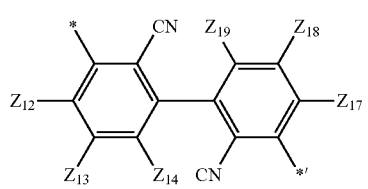 MM13
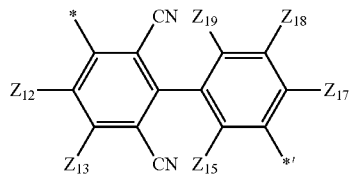 MM14
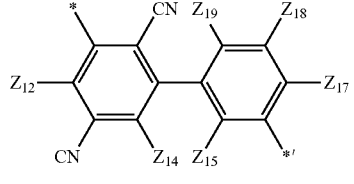 MM15
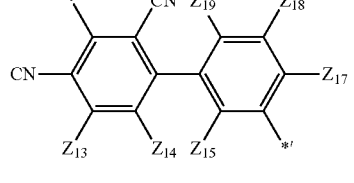 MM16
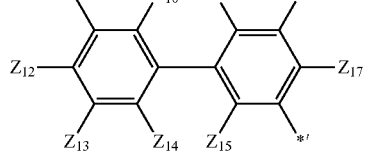 MM17
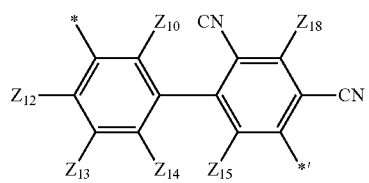 MM18
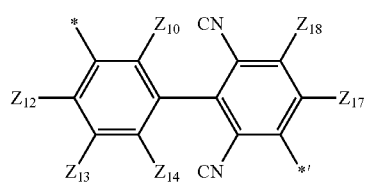 MM19
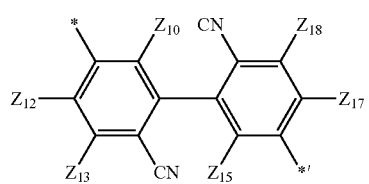 MM20
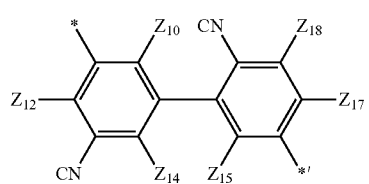 MM21
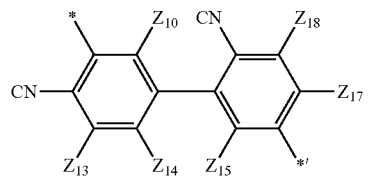 MM22
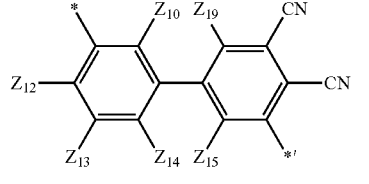 MM23
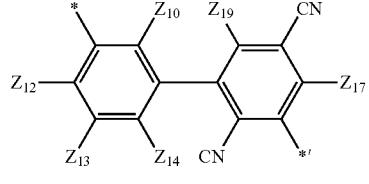 MM24
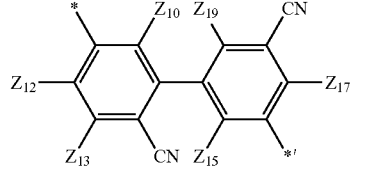 MM25

MM26 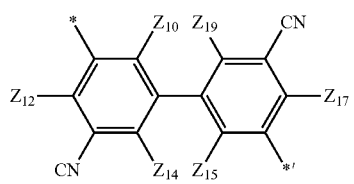 MM34 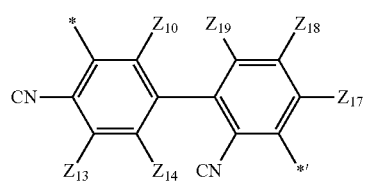
MM27 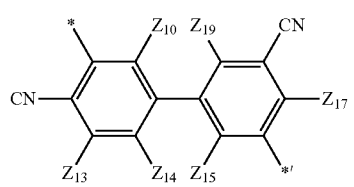 MM35 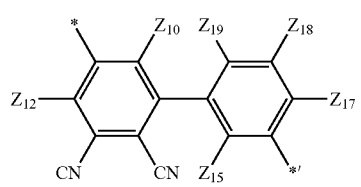
MM28 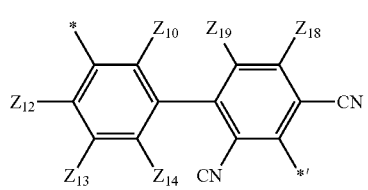 MM36 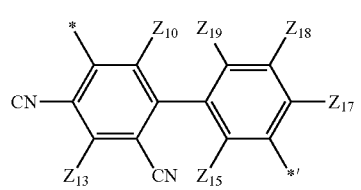
MM29 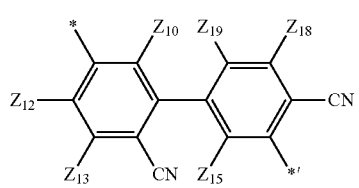 MM37 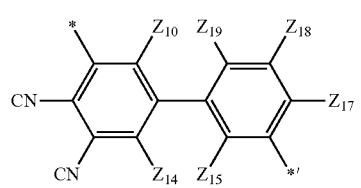
MM30 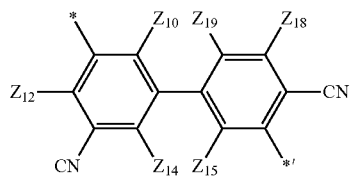 MP1 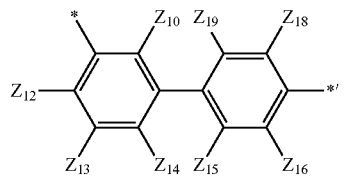
MM31 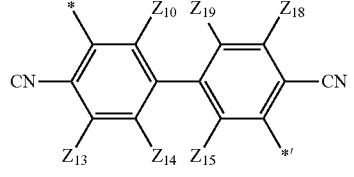 MP2 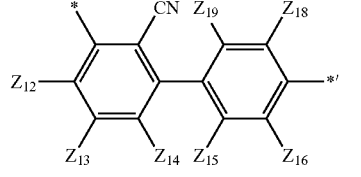
MM32 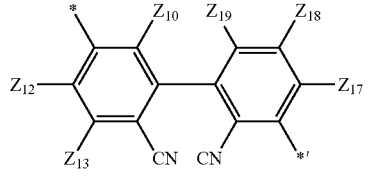 MP3 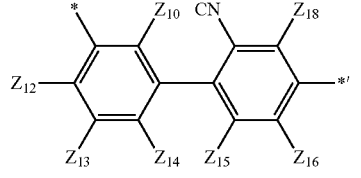
MM33 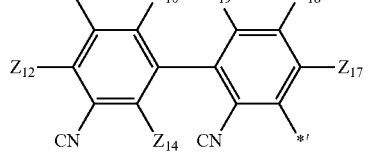 MP4 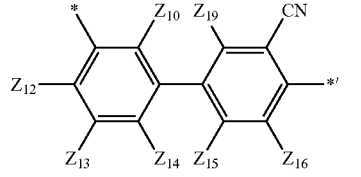

MP5
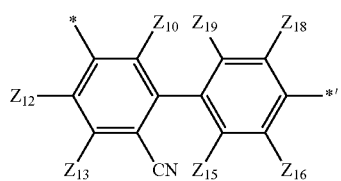
MP6
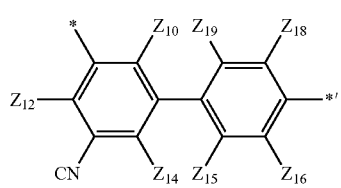
MP7
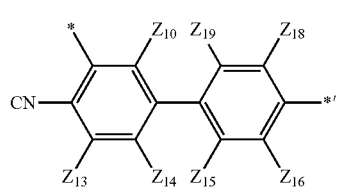
MP8
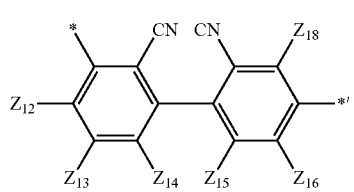
MP9
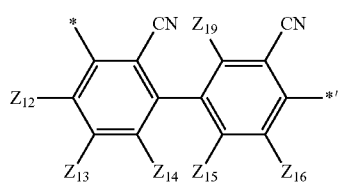
MP10
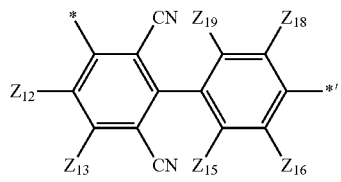
MP11
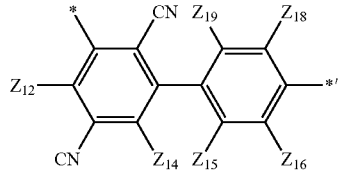
MP12
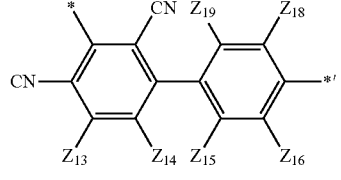
MP13
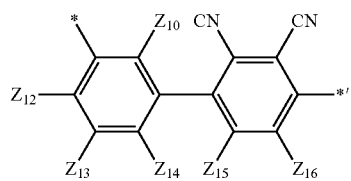
MP14
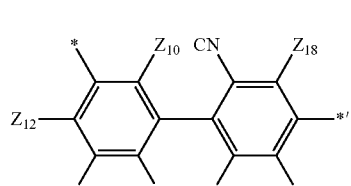
MP15
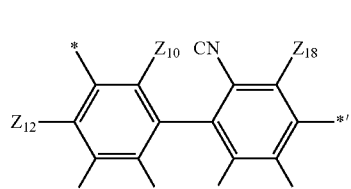
MP16
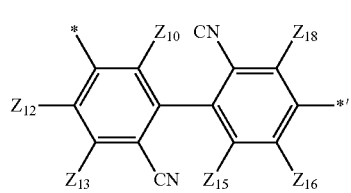
MP17
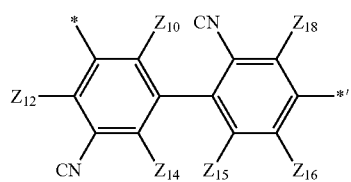
MP18
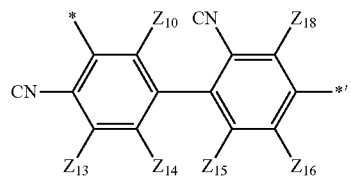
MP19
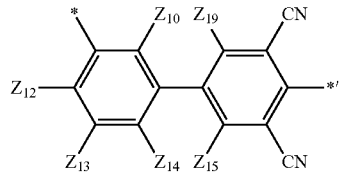
MP20
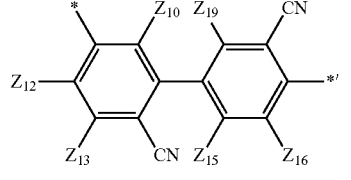

-continued

MP21, MP22, MP23, MP24, MP25, OO1, OO2, OO3, OO4, OO5, OO6, OO7, OO8, OO9, OO10, OO11

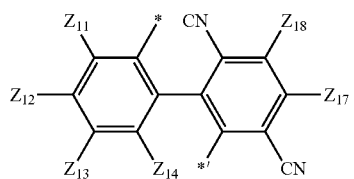
OO12
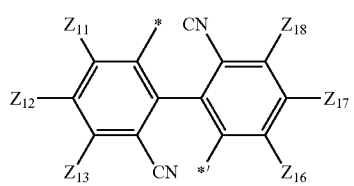
OO13
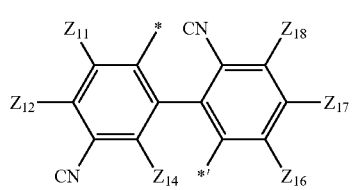
OO14
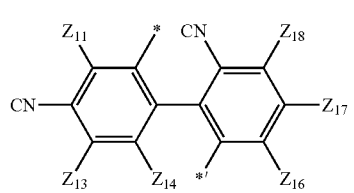
OO15
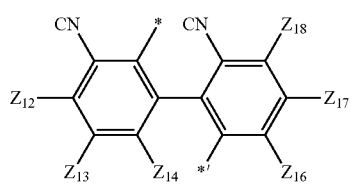
OO16
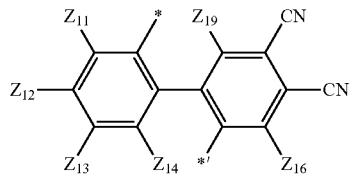
OO17
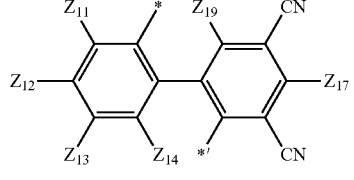
OO18
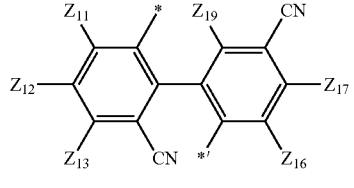
OO19
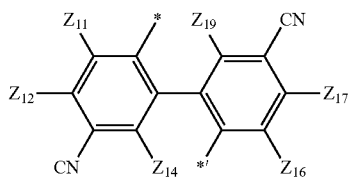
OO20
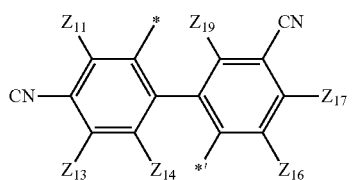
OO21
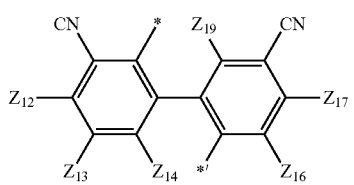
OO22
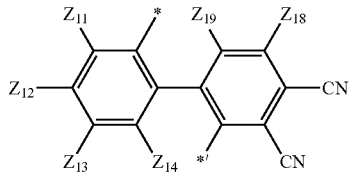
OO23
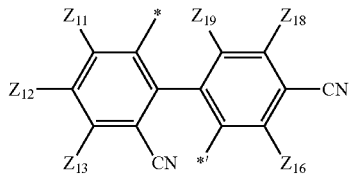
OO24
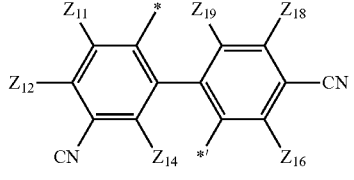
OO25
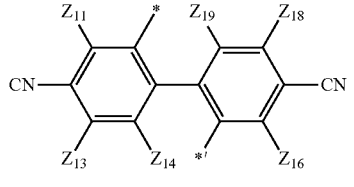
OO26
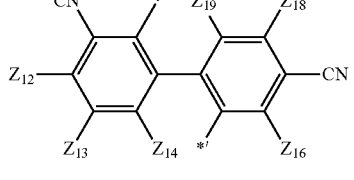
OO27

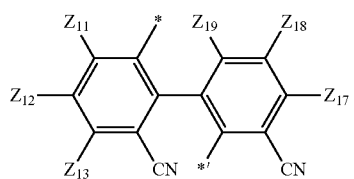 OO28
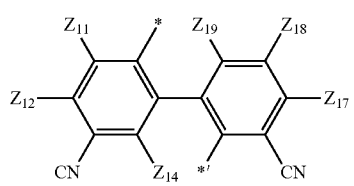 OO29
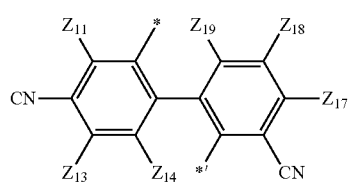 OO30
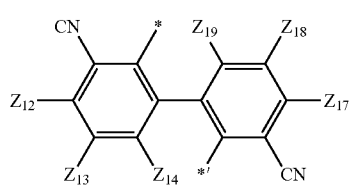 OO31
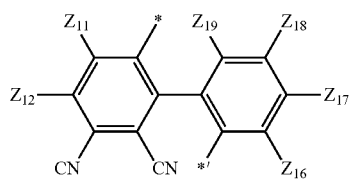 OO32
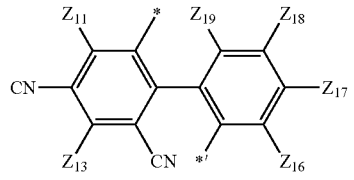 OO33
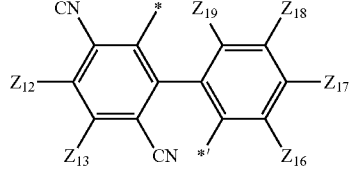 OO34
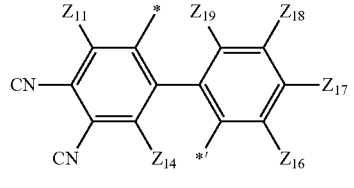 OO35
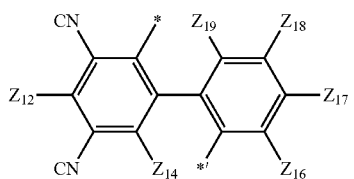 OO36
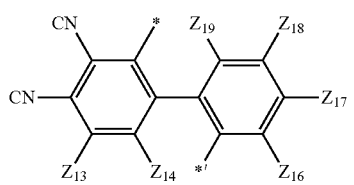 OO37
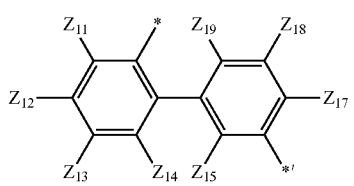 OM1
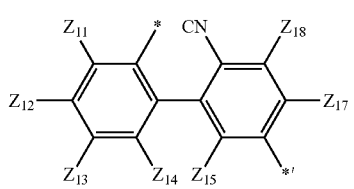 OM2
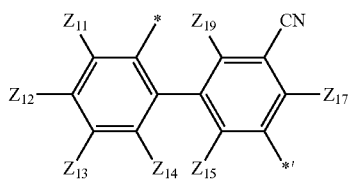 OM3
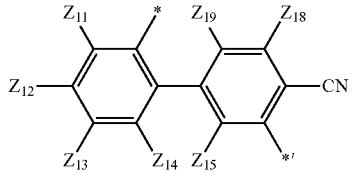 OM4
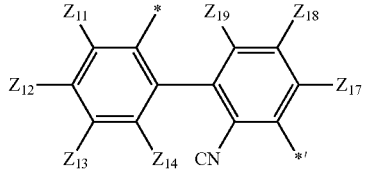 OM5
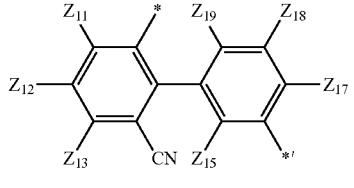 OM6

OM7 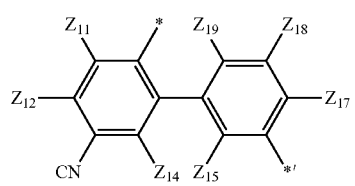
OM8 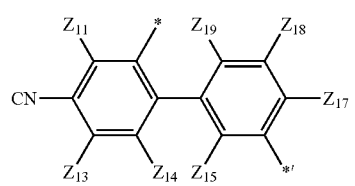
OM9 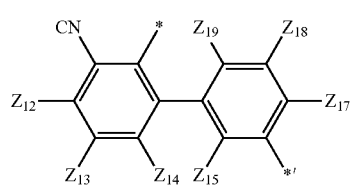
OM10 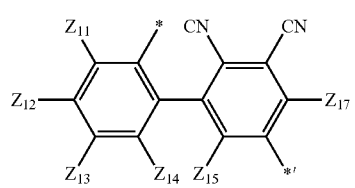
OM11 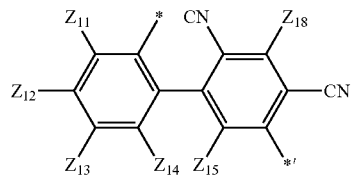
OM12 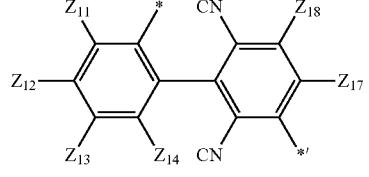
OM13 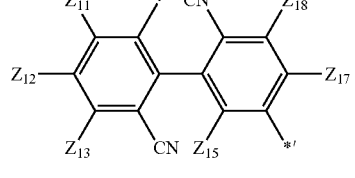
OM14 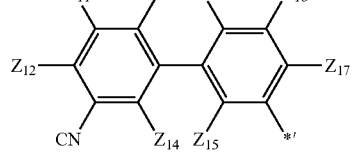
OM15 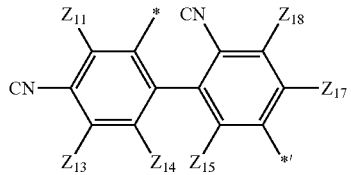
OM16 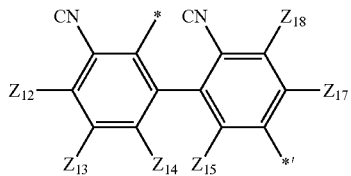
OM17 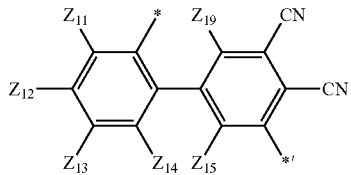
OM18 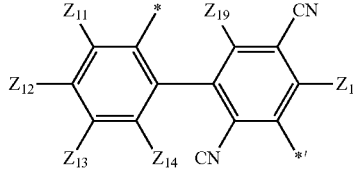
OM19 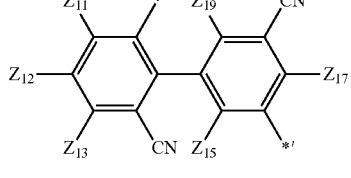
OM20 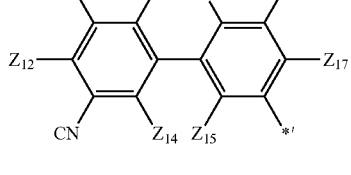
OM21 
OM22 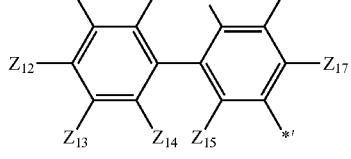

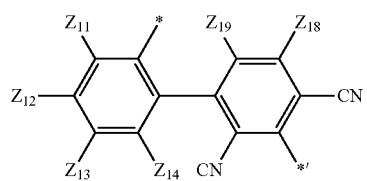 OM23
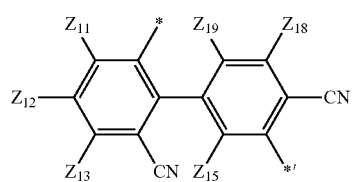 OM24
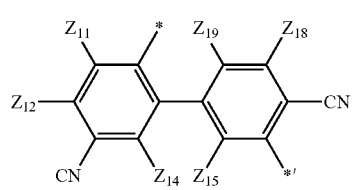 OM25
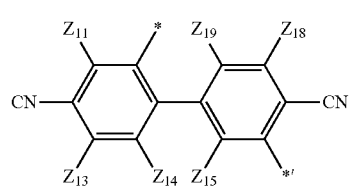 OM26
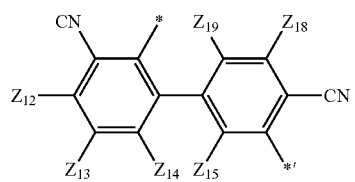 OM27
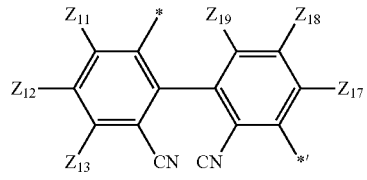 OM28
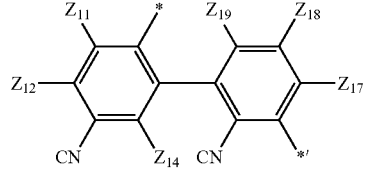 OM29
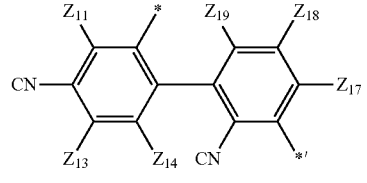 OM30
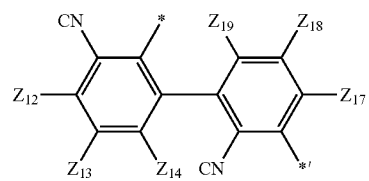 OM31
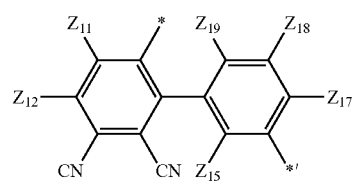 OM32
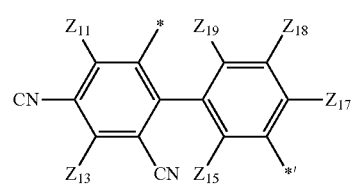 OM33
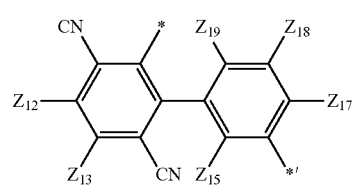 OM34
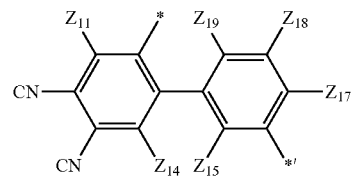 OM35
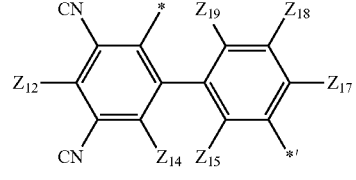 OM36
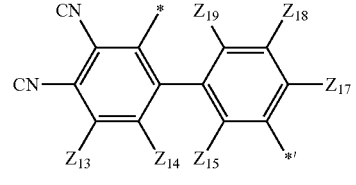 OM37
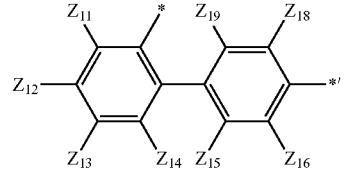 OP1

75
-continued
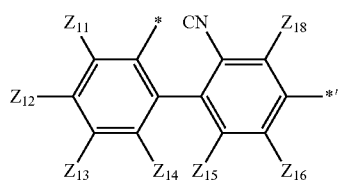 OP2
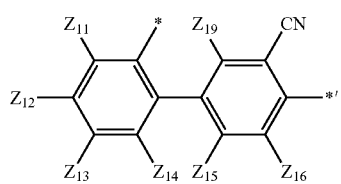 OP3
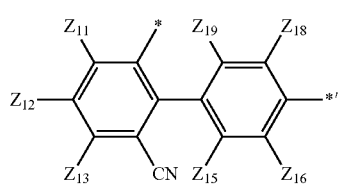 OP4
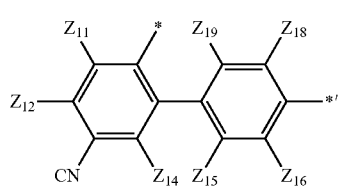 OP5
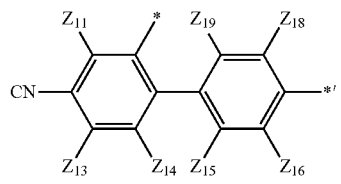 OP6
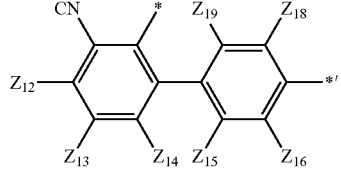 OP7
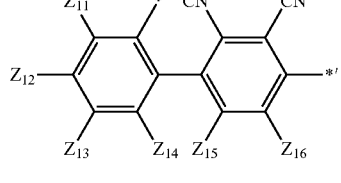 OP8
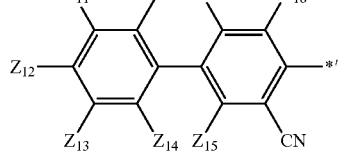 OP9
76
-continued
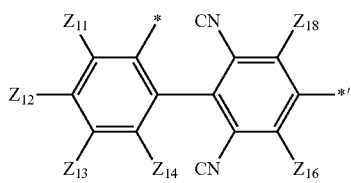 OP10
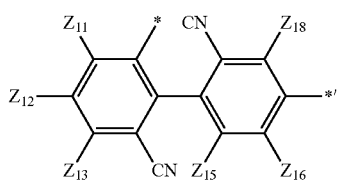 OP11
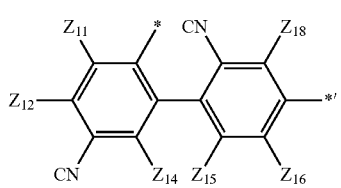 OP12
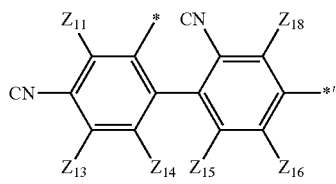 OP13
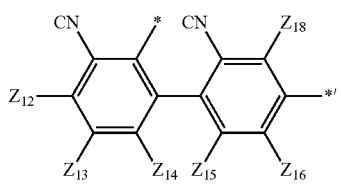 OP14
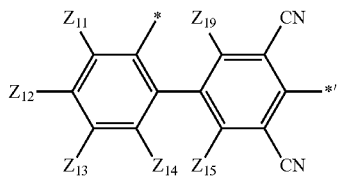 OP15
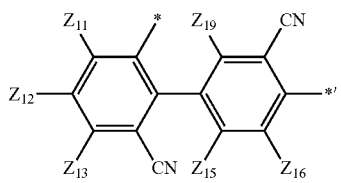 OP16
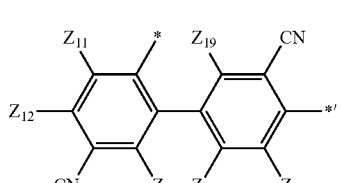 OP17

| | | | |
|---|---|---|---|
| 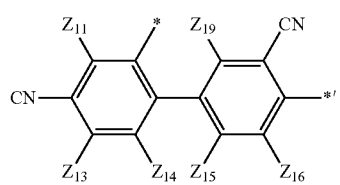 | OP18 | 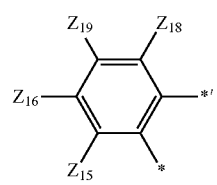 | O1 |
| 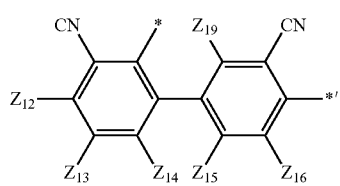 | OP19 | 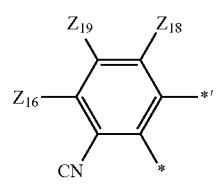 | O2 |
| 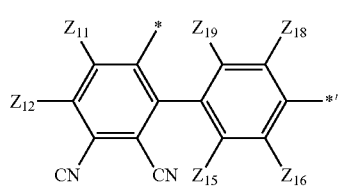 | OP20 | 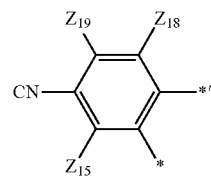 | O3 |
| 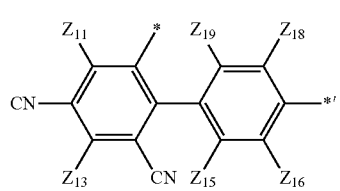 | OP21 | 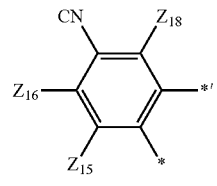 | O4 |
| 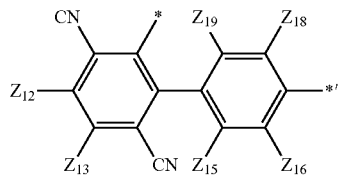 | OP22 | 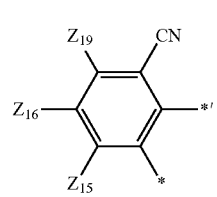 | O5 |
| 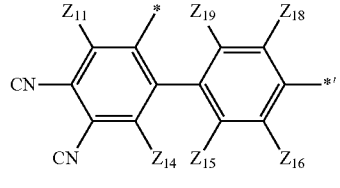 | OP23 | 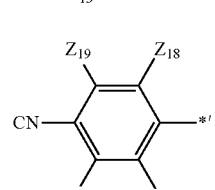 | O6 |
| 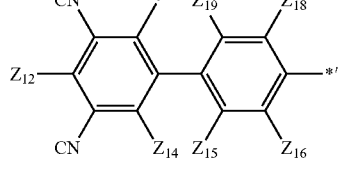 | OP24 | 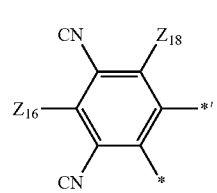 | O7 |
| 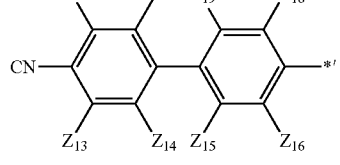 | OP25 | 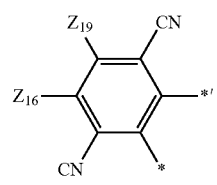 | O8 |

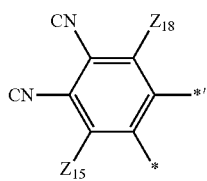 O9
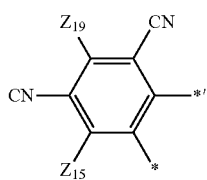 O11
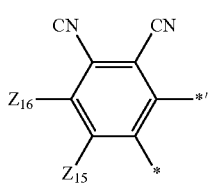 O11
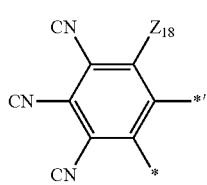 O12
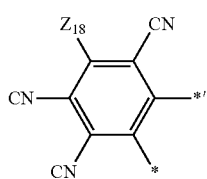 O13
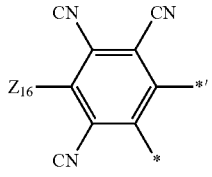 O14
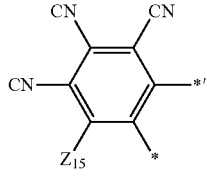 O15
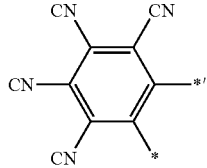 O16
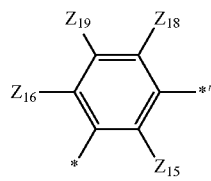 M1
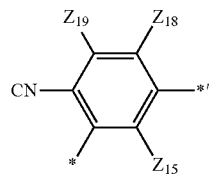 M2
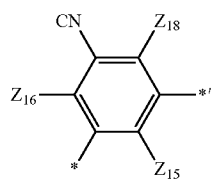 M3
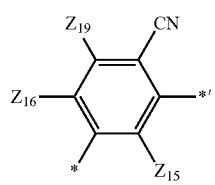 M4
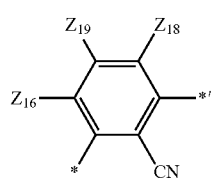 M5
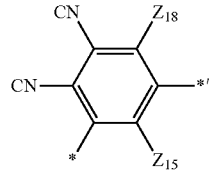 M6
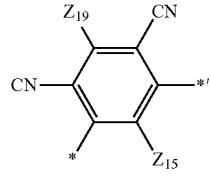 M7
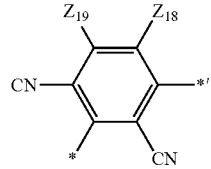 M8

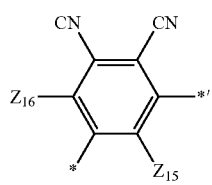 M9
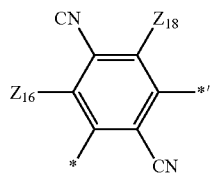 M10
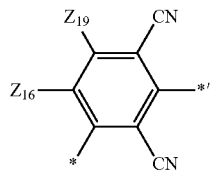 M11
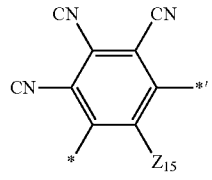 M12
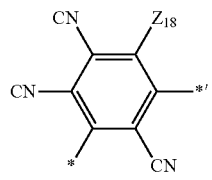 M13
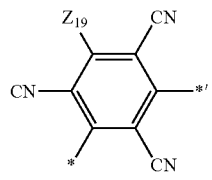 M14
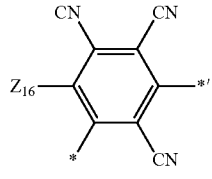 M15
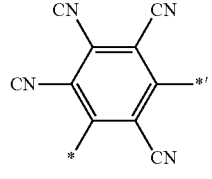 M16
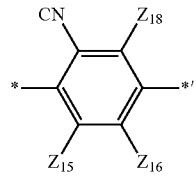 P1
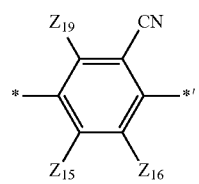 P2
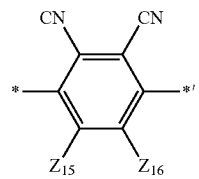 P3
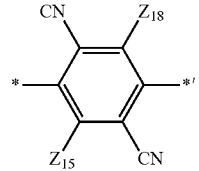 P4
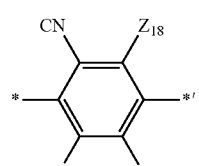 P5
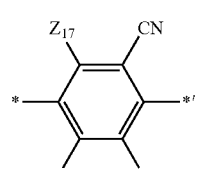 P6
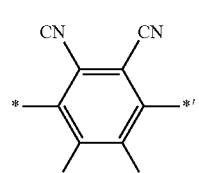 P7
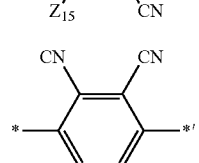 P8
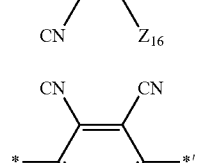 P9
In Formulae PO1 to PO25, PM1 to PM25, PP1 to PP18, MO1 to MO37, MM1 to MM37, MP1 to MP25, OO1 to OO37, OM1 to OM37, OP1 to OP25, O1 to O16, M1 to M16, or P1 to P9, $Z_{10}$ to $Z_{11}$ may each independently be hydrogen, deuterium, a cyano group, a $C_1$-$C_{10}$ alkyl group, or a $C_1$-$C_{10}$ alkoxy group; or a $C_1$-$C_{10}$ alkyl group or a $C_1$-$C_{10}$ alkoxy group, each substituted with a deuterium, a cyano group, or a combination thereof; or a phenyl group, a biphenyl group, a terphenyl group, a naphthyl group, a fluorenyl group, a carbazolyl group, a dibenzofuranyl group, or a dibenzothiophenyl group; or a phenyl group, a biphenyl group, a terphenyl group, a naphthyl group, a fluorenyl group, a carbazolyl group, a dibenzofuranyl group, or a dibenzothiophenyl group, each substituted with deuterium, a cyano group, a $C_1$-$C_{10}$ alkyl group, a $C_1$-$C_{10}$ alkoxy group, a phenyl group, a biphenyl group, a terphenyl group, a naphthyl group, a fluorenyl group, a carbazolyl group, a dibenzofuranyl group, a dibenzothiophenyl group, or a combination thereof; * and *' each indicate a bonding site to a neighboring atom.

In an embodiment, the electron transport host may include at least one of Compounds E1 to E9, but embodiments of the present disclosure are not limited thereto:

E1

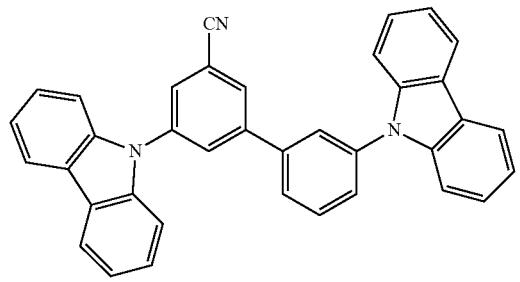

E2

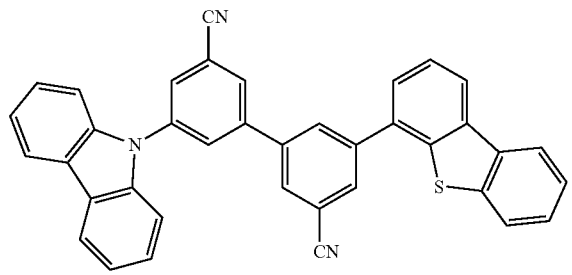

E3

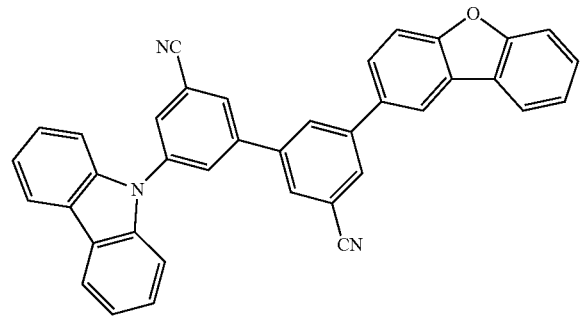

E4

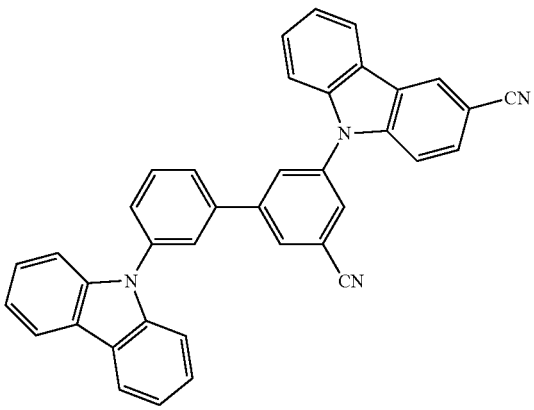

E5

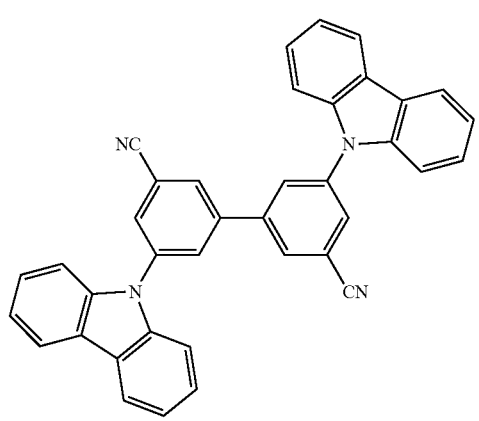

E6

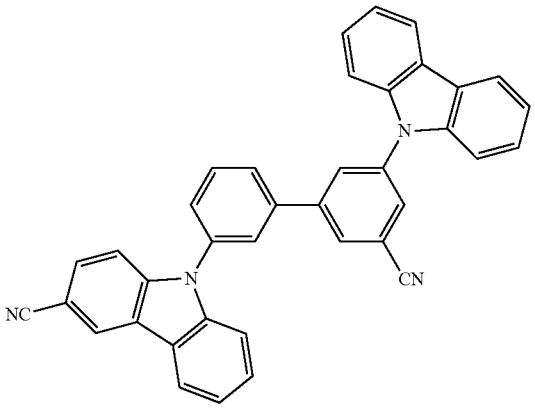

E7

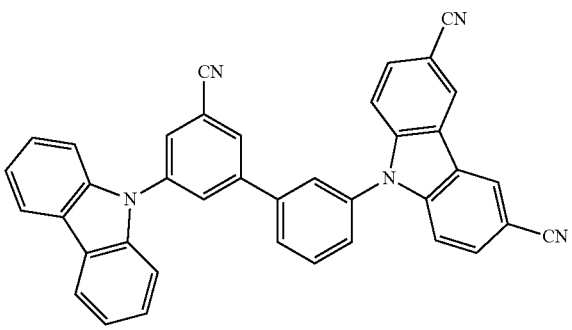

E8

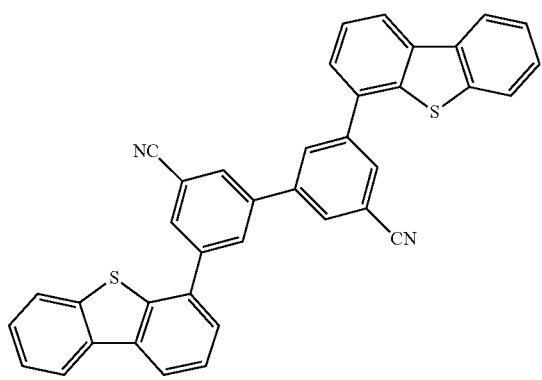

E9

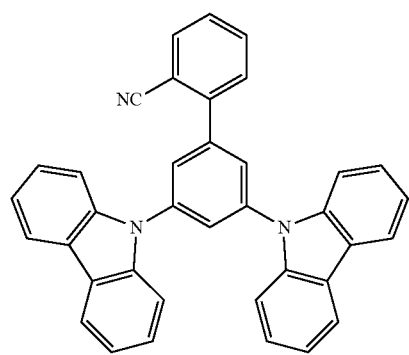

In an embodiment, the hole transport host may include a compound represented by Formulae 4-1 to 4-3, but embodiments of the present disclosure are not limited thereto:

4-1

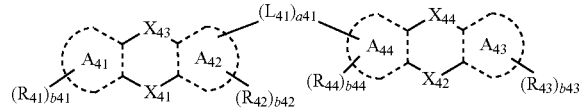

4-2

4-3

In Formulae 4-1 to 4-3, $A_{41}$ to $A_{44}$ may each independently be a benzene group, a naphthalene group, an indene group, a benzofuran group, a benzothiophene group, a benzosilole group, a fluorene group, a carbazole group, a dibenzofuran group, a dibenzothiophene group, or a dibenzosilole group; $X_{41}$ and $X_{42}$ may each independently be a single bond, O, S, $N(R_{45})$, or $C(R_{45})(R_{46})$; $X_{43}$ and $X_{44}$ may each independently be O, S, $N(R_{47})$, or $C(R_{47})(R_{48})$; $L_{41}$ may be a π electron-depleted nitrogen-free cyclic group (for example, a benzene group, a heptalene group, an indene group, a naphthalene group, an azulene group, a heptalene group, an indacene group, an acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a pentaphene group, a rubicene group, a coronene group, an ovalene group, a pyrrole group, an isoindole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, or a dihydroacridine group, each unsubstituted or substituted with a deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or a combination thereof) unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or a combination thereof; a41 may be 0, 1, 2, or 3; $R_{41}$ to $R_{48}$ may each independently be hydrogen, deuterium, a $C_1$-$C_{10}$ alkyl group, a $C_1$-$C_{10}$ alkoxy group, or a π electron-depleted nitrogen-free cyclic group (for example, a phenyl group, a biphenyl group, a terphenyl group, a tetraphenyl group, a naphthyl group, a fluorenyl group, a spiro-bifluorenyl group, a benzofluorenyl group, a dibenzofluorenyl group, a phenanthrenyl group, an anthracenyl group, a triphenylenyl group, a pyrenyl group, a chrysenyl group, a pyrrolyl group, an isoindolyl group, an indolyl group, a furanyl group, a thiophenyl group, a benzofuranyl group, a benzothiophenyl group, a benzosilolyl group, a benzocarbazolyl group, a dibenzocarbazolyl group, a dibenzofuranyl group, a dibenzothiophenyl group, a carbazolyl group, a dibenzosilolyl group, an indeno carbazolyl group, an indolocarbazolyl group, a benzofurocarbazolyl group, a benzothienocarbazolyl group, a benzosilolocarbazolyl group, an acridinyl group, or a dihydroacridinyl group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or a combination thereof) unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or a combination thereof; $Q_{401}$ to $Q_{403}$ may each independently be hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, or a tetraphenyl group; and b41 to b44 may each independently be 1, 2, 3, 4, 5, 6, 7, or 8.

For example, in Formulae 4-1 to 4-3, $A_{41}$ to $A_{44}$ may each independently be a benzene group, a fluorene group, a carbazole group, a dibenzofuran group, a dibenzothiophene group, or a dibenzosilole group, wherein at least one of $A_{41}$ and $A_{42}$ may each independently be a benzene group, and at least one of $A_{43}$ and $A_{44}$ may each independently be a benzene group, but embodiments of the present disclosure are not limited thereto.

For example, in Formulae 4-1 to 4-3, $L_{41}$ may be a benzene group, a fluorene group, a dibenzofuran group, a dibenzothiophene group, a carbazole group, a dibenzosilole group, an indenocarbazole group, an indolocarbazole group, a benzofurocarbazole group, a benzothienocarbazole group, a benzosilolocarbazole group, an acridine group, or a dihydroacridine group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or a combination thereof, but embodiments of the present disclosure are not limited thereto.

For example, in Formulae 4-1 to 4-3, a41 may be 0, 1, or 2, but embodiments of the present disclosure are not limited thereto.

For example, in Formulae 4-1 to 4-3, $R_{41}$ to $R_{48}$ may each independently be hydrogen, deuterium, a $C_1$-$C_{10}$ alkyl group, and a $C_1$-$C_{10}$ alkoxy group; or a phenyl group, a biphenyl group, a terphenyl group, a tetraphenyl group, a fluorenyl group, a dibenzocarbazolyl group, a dibenzofuranyl group, a dibenzothiophenyl group, a carbazolyl group, a dibenzosilolyl group, an indeno carbazolyl group, an indolocarbazolyl group, a benzofurocarbazolyl group, a benzothienocarbazolyl group, a benzosilolocarbazolyl group, an acridinyl group, or a dihydroacridinyl group, each unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, or a combination thereof, but embodiments of the present disclosure are not limited thereto.

In an embodiment, the hole transport host may include at least one of Compounds H1 to H32, but embodiments of the present disclosure are not limited thereto:

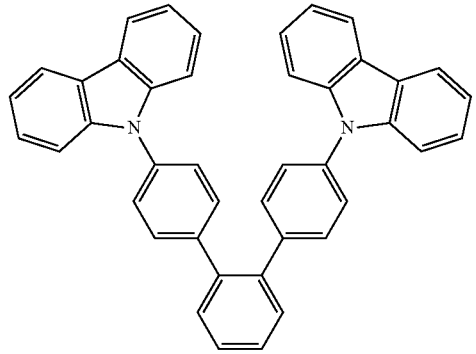

H1

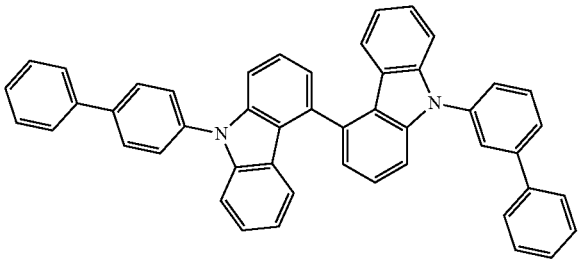

H2

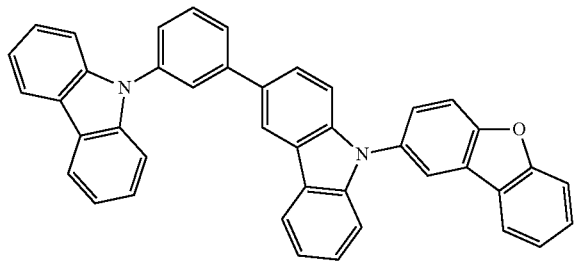

H3

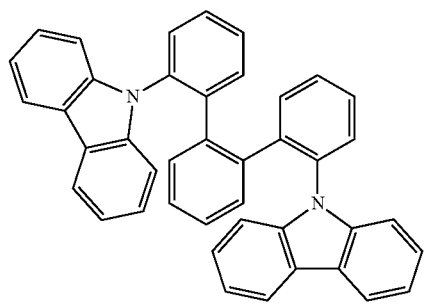

H4

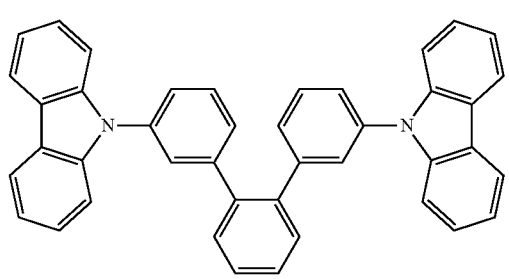

H5

H6
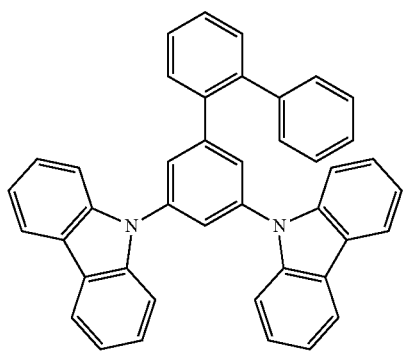
H7
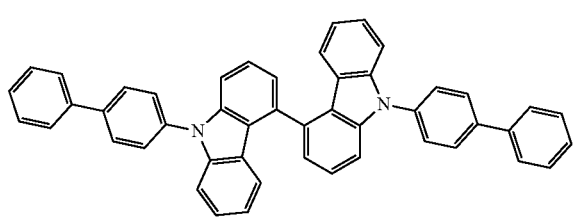
H8
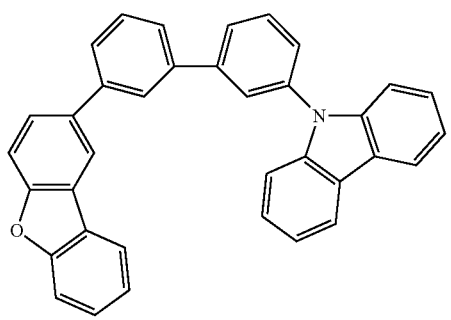
H9
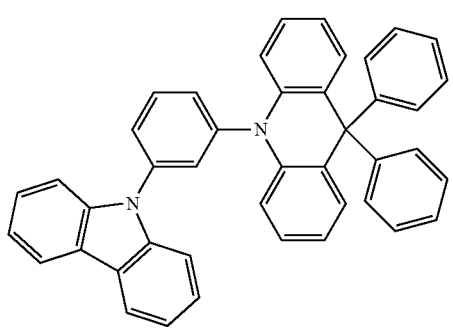
H10
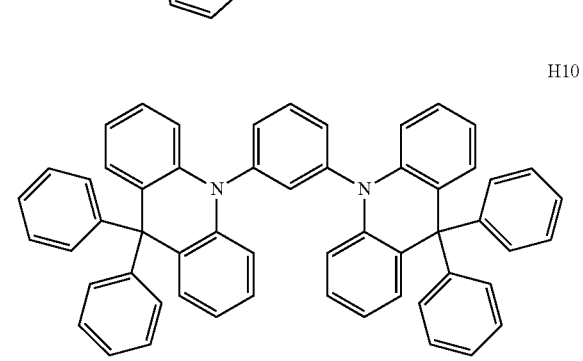
H11
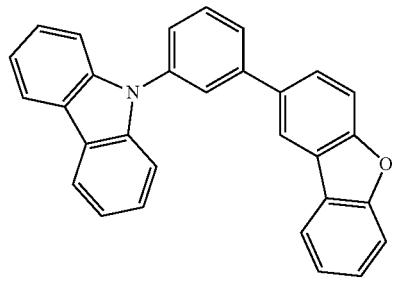
H12
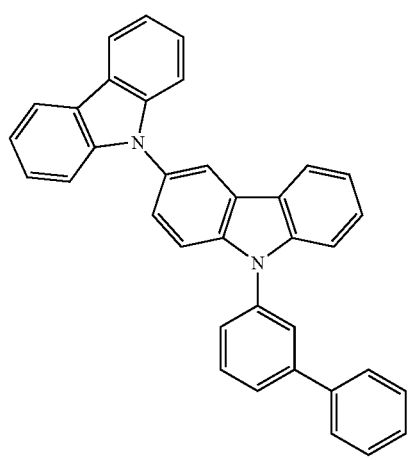
H13
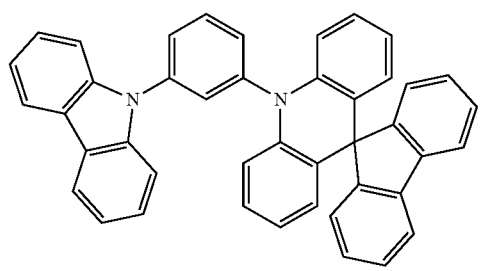
H14
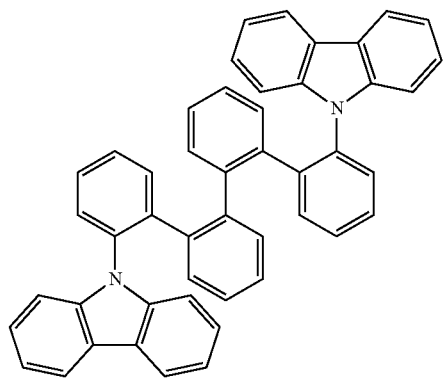

H15
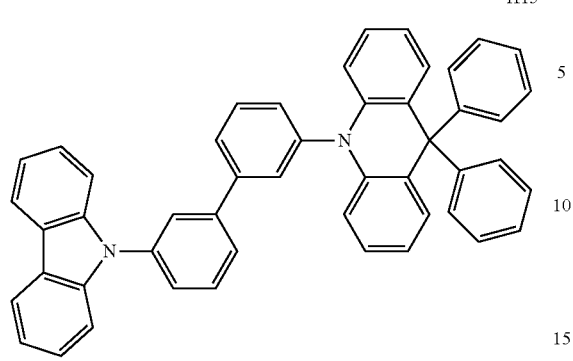
H16
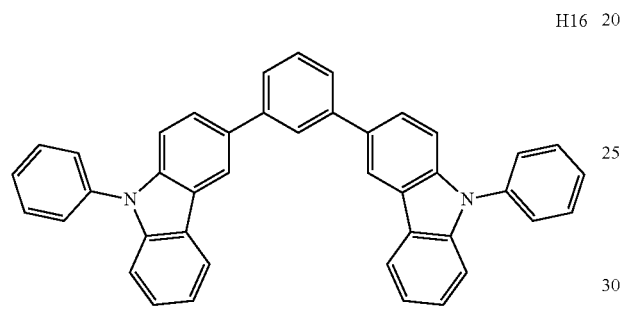
H17
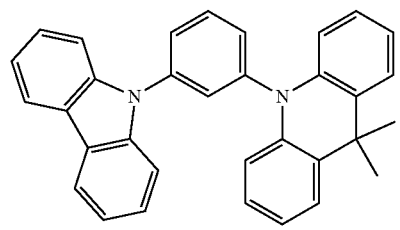
H18
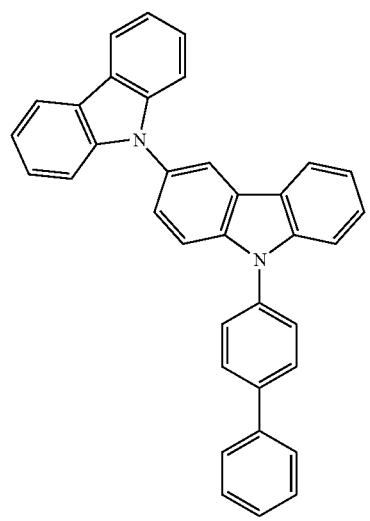
H19
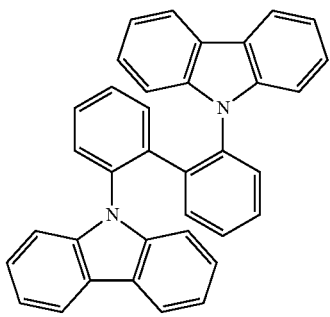
H20
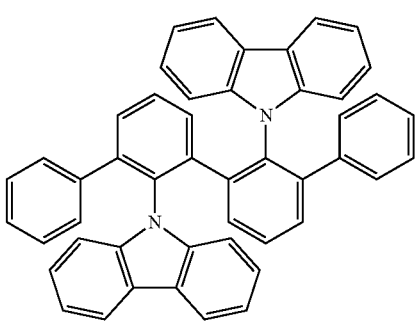
H21
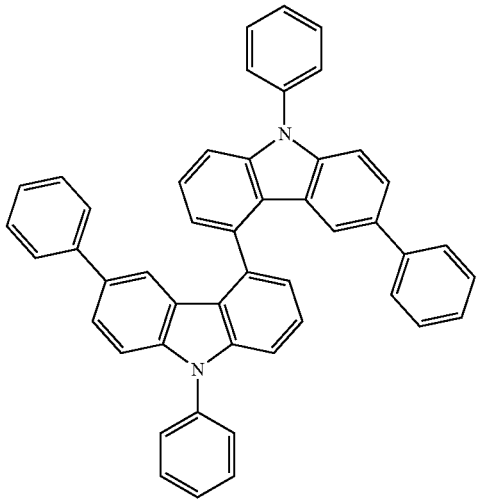
H22
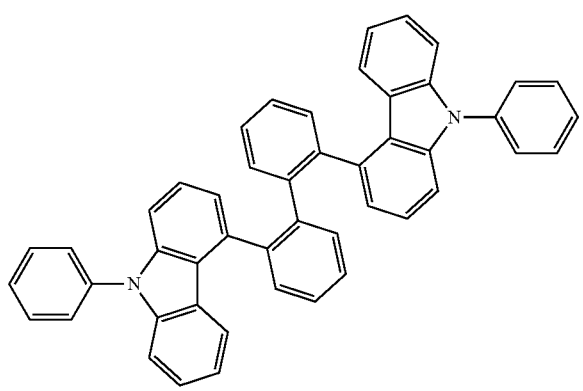

H23
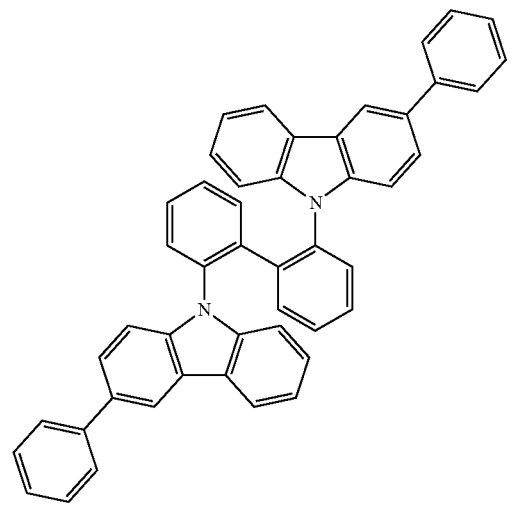
H24
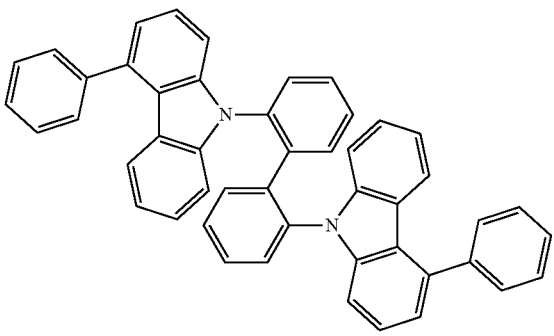
H25
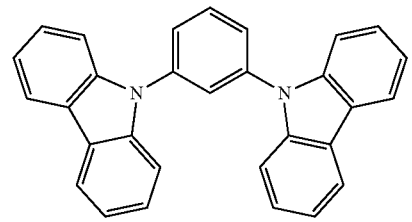
H26
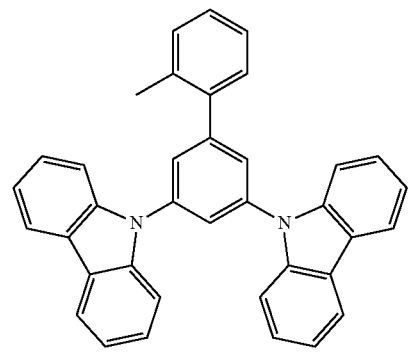
H27
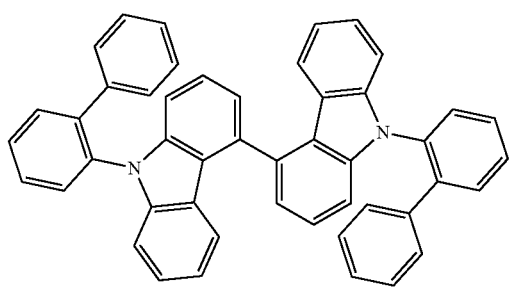
H28
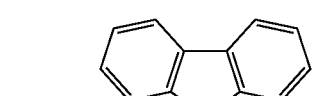
H29
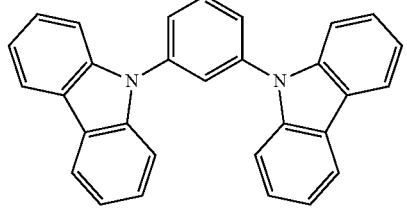
H30
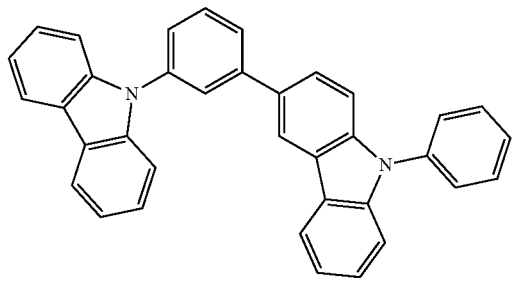
H31
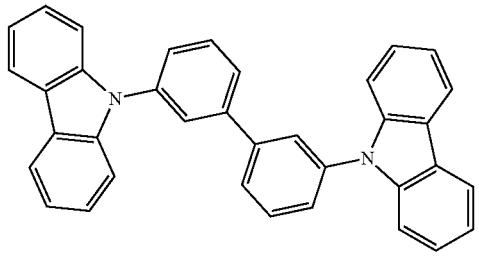
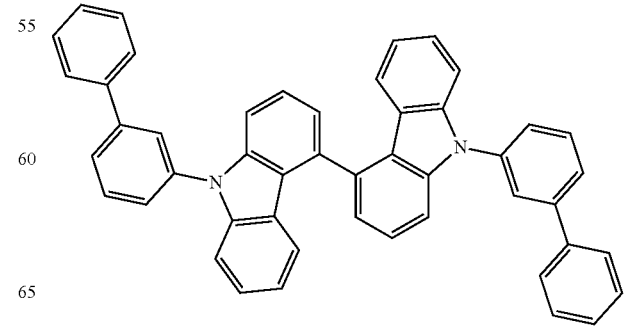

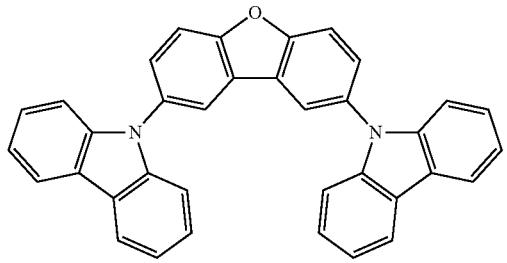

H32

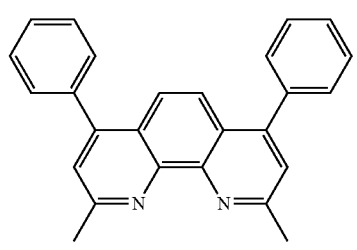

BCP

Bphen

In an embodiment, when the organic light-emitting device may include two different types of emitters, the organic light-emitting device may achieve efficiency and emission color similar to those of an organic light-emitting device including one type of an emitter, but may have a significantly improved lifespan. Thus, without a need to design one type of an emitter to have a desired emission color simultaneously with a long lifespan and high efficiency, use of two different types of emitters at the same time may satisfy required characteristics of an organic light-emitting device.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

When the organic light-emitting device is a full-color organic light-emitting device, the emission layer may be patterned into a red emission layer, a green emission layer, and a blue emission layer. In an embodiment, due to a stacked structure including a red emission layer, a green emission layer, and/or a blue emission layer, the emission layer may emit white light.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, BPhen, or a combination thereof, but may also include other materials.

For example, as a material for the hole blocking layer, the first compound represented by Formula 1 may be used, but embodiments of the present disclosure are not limited thereto.

A thickness of the hole blocking layer may be in a range of about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may further include, in addition to the organometallic compound represented by Formula 1, BCP, BPhen, Alq$_3$, BAlq, TAZ, NTAZ, or a combination thereof.

Alq$_3$

BAlq

-continued
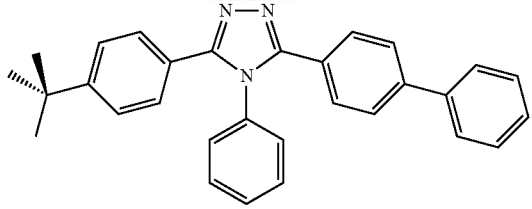
TAZ
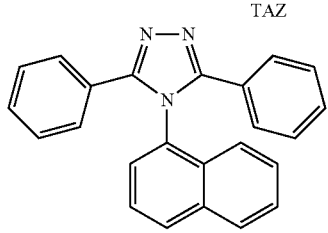
NTAZ
In an embodiment, the electron transport layer may include at least one of Compounds ET1 to ET25, but embodiments of the present disclosure are not limited thereto:
ET1
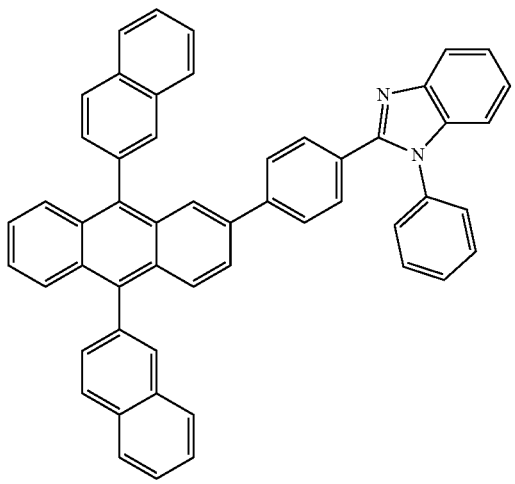
ET2
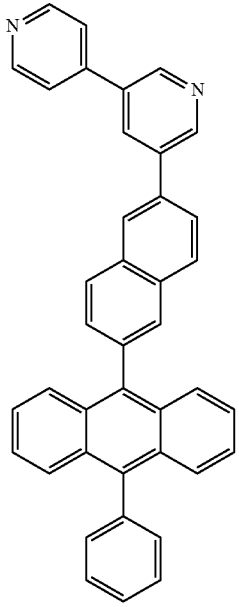
-continued
ET3
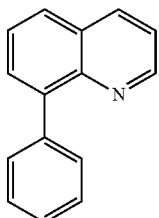
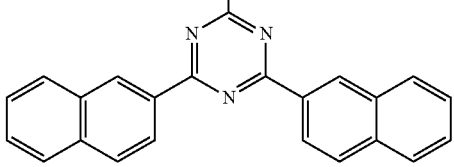
ET4
ET5
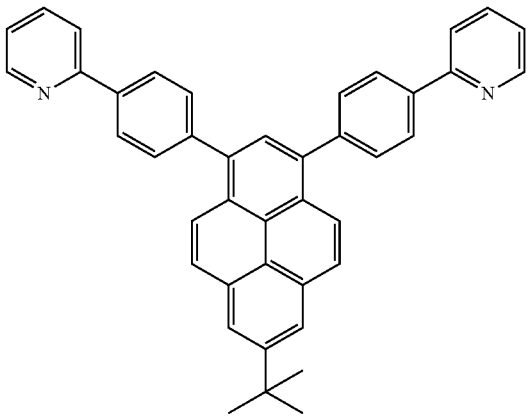

ET6
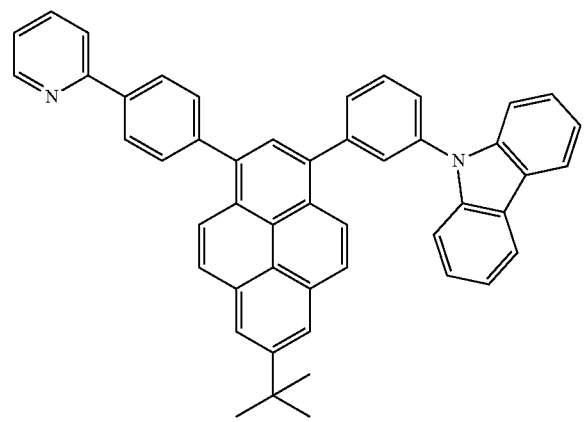
ET9
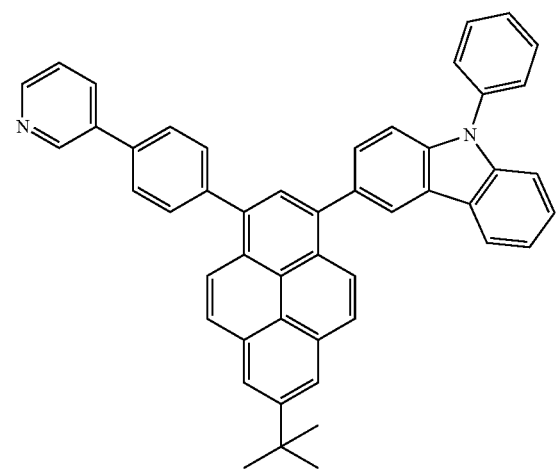
ET7
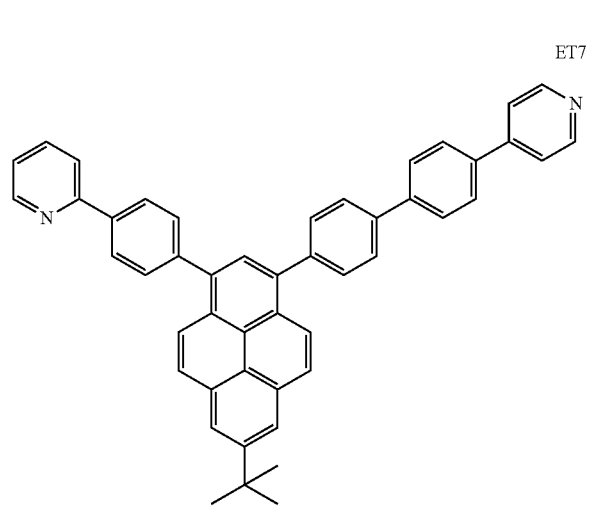
ET10
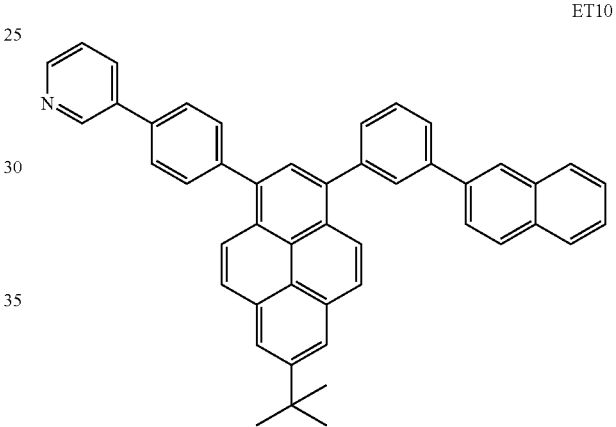
ET8
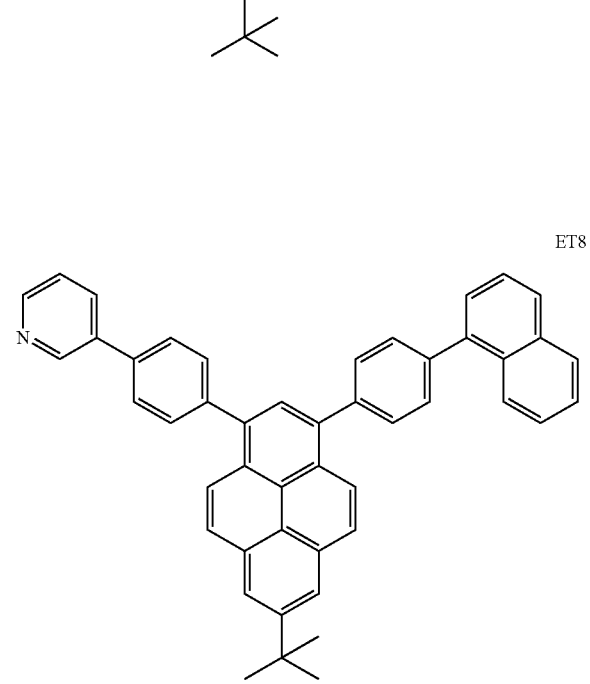
ET11
ET12
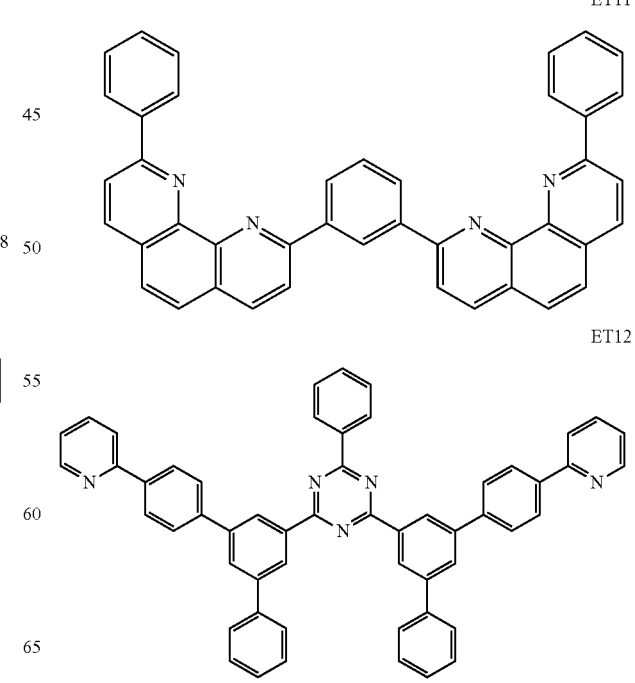

ET13
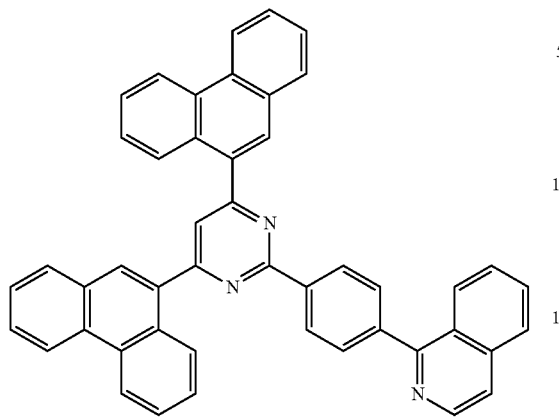
ET16
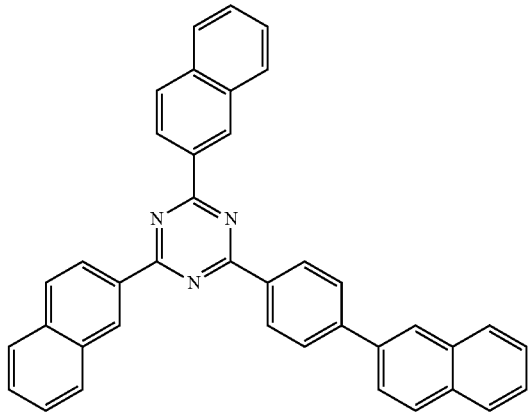
ET14
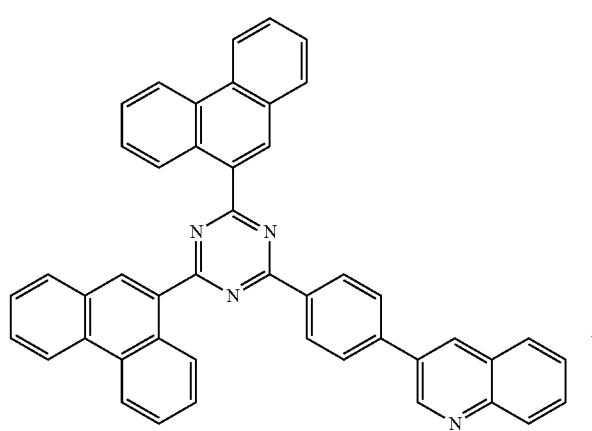
ET17
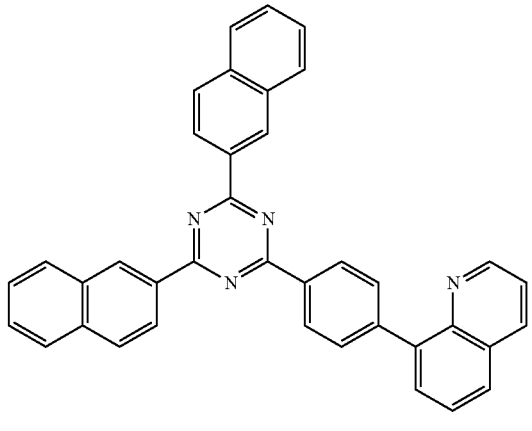
ET15
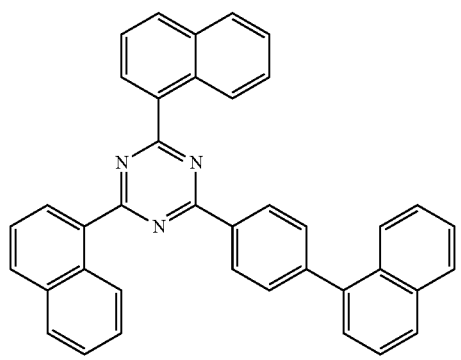
ET18
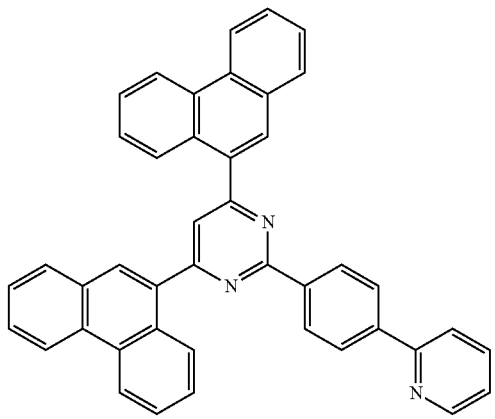

-continued
ET19
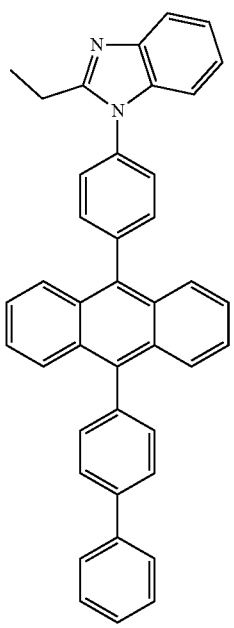
ET20
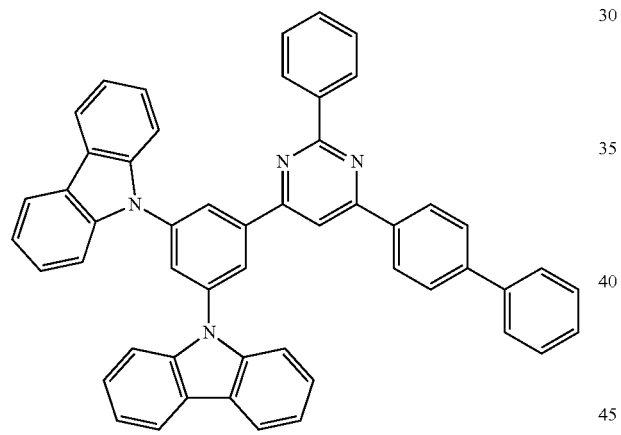
ET21
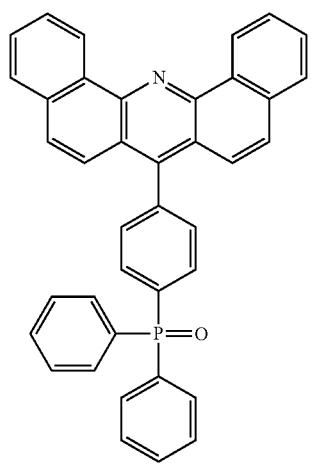
-continued
ET22
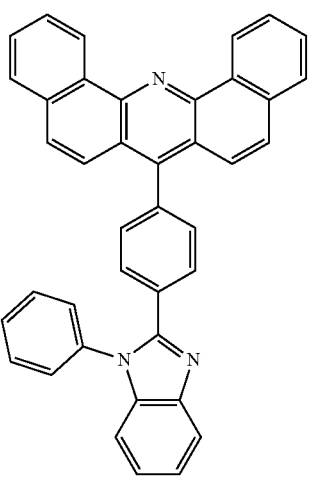
ET23
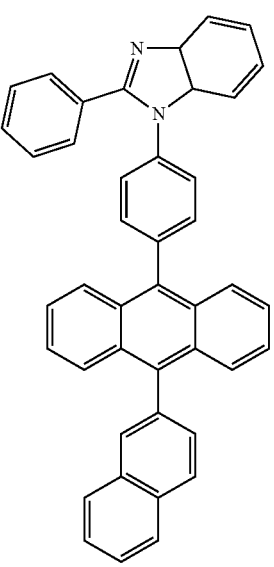
ET24
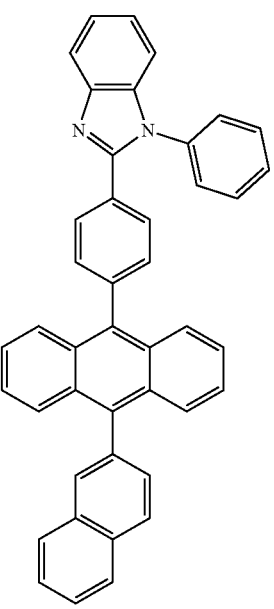

ET25

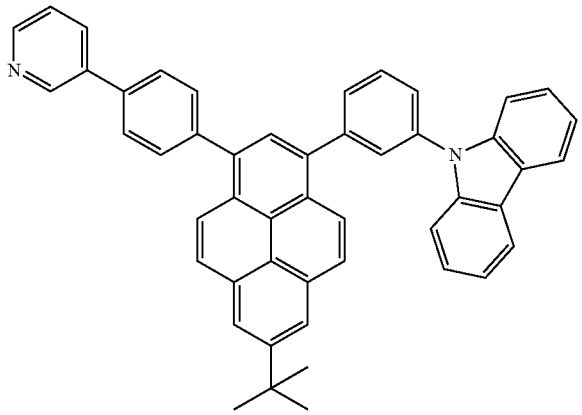

A thickness of the electron transport layer may be in a range of about 100 Å to about 1,000 Å, for example, about 150 Å to about 500 Å. While not wishing to be bound by theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

ET-D2

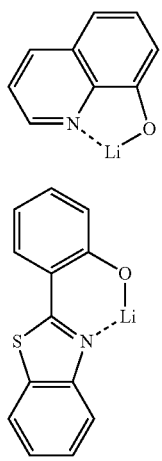

The electron transport region may include an electron injection layer that promotes flow of electrons from the second electrode 19 thereinto.

The electron injection layer may include LiF, NaCl, CsF, $Li_2O$, BaO, or a combination thereof.

A thickness of the electron injection layer may be in a range of about 1 Å to about 1,000 Å, for example, about 3 Å to about 90 Å. While not wishing to be bound by theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as the material for forming the second electrode 19. To manufacture a top-emission type light-emitting device, a transmissive electrode formed using ITO or IZO may be used as the second electrode 19.

Hereinbefore, the organic light-emitting device has been described with reference to FIG. 1, but embodiments of the present disclosure are not limited thereto.

Figure 2:
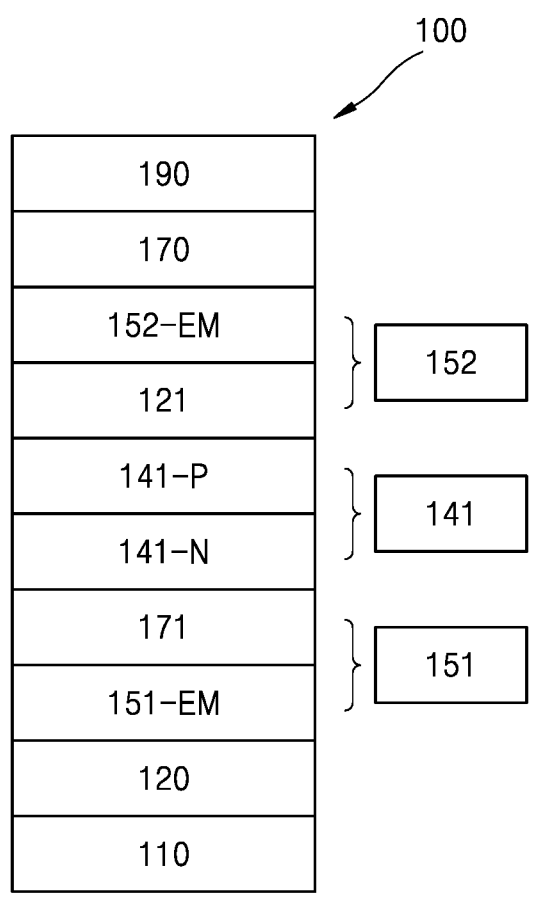
FIG. 2 is a schematic view of an organic light-emitting device 100 according to an embodiment.

Description of FIG. 2

FIG. 2 is a schematic cross-sectional view of an organic light-emitting device 100 according to an embodiment.

The organic light-emitting device 100 of FIG. 2 may include a first electrode 110, a second electrode 190 facing the first electrode 110, and a first emission unit 151 and a second emission unit 152 between the first electrode 110 and the second electrode 190. A charge generation layer 141 may be disposed between the first emission unit 151 and the second emission unit 152, and the charge generation layer 141 may include an n-type charge generation layer 141-N and a p-type charge generation layer 141-P. The charge generation layer 141 may be a layer serving to generate charges and supply the charges to an adjacent emission unit, and may use a known material.

The first emission unit 151 may include a first emission layer 151-EM, and the second emission unit 152 may include a second emission layer 152-EM. A maximum emission wavelength of light emitted by the first emission unit 151 may be different from a maximum emission wavelength of light emitted by the second emission unit 152. For example, mixed light of the light emitted by the first emission unit 151 and the light emitted by the second emission unit 152 may be white light, but embodiments of the present disclosure are not limited thereto.

A hole transport region 120 may be disposed between the first emission unit 151 and the first electrode 110, and the second emission unit 152 may include a first hole transport region 121 disposed on the side closer to the first electrode 110.

An electron transport region 170 may be disposed between the second emission unit 152 and the second electrode 190, and the first emission unit 151 may include a first electron transport region 171 disposed between the charge generation layer 141 and the first emission layer 151-EM.

The first emission layer 151-EM may include a first compound, a second compound, and a third compound, and the first compound and the second compound may be different from each other, each of the first compound and the second compound may emit light, the third compound may not emit light, the first compound and the second compound may satisfy one of Conditions 1 to 4, the first compound and the second compound may satisfy Inequality 1-1 or 1-2, and the first compound and the second compound may satisfy Inequality 2.

The second emission layer 152-EM may include a first compound, a second compound, and a third compound, and the first compound and the second compound may be different from each other, each of the first compound and the second compound may emit light, the third compound may not emit light, the first compound and the second compound may satisfy one of Conditions 1 to 4, the first compound and the second compound may satisfy Inequality 1-1 or 1-2, and the first compound and the second compound may satisfy Inequality 2.

The first electrode 110 and the second electrode 190 in FIG. 2 may be the same as described in connection with the first electrode 11 and the second electrode 19 in FIG. 1.

The first emission layer 151-EM and the second emission layer 152-EM in FIG. 2 may be the same as described in connection with the emission layer of the organic layer 15 in FIG. 1.

The hole transport region 120 and the first hole transport region 121 in FIG. 2 may be the same as described in connection with the hole transport region 12 in FIG. 1.

The electron transport region 170 and the first electron transport region 171 in FIG. 2 may be the same as described in connection with the electron transport region 17 in FIG. 1.

The organic light-emitting device including the emission layer including the first to third compounds has been described with reference to FIG. 2, but the first emission unit 151 and the second emission unit 152 may be variously modified. For example, one selected from the first emission unit 151 and the second emission unit 152 of the organic light-emitting device of FIG. 2 may be substituted with a known emission unit, or the organic light-emitting device may include three or more emission units.

Figure 3:
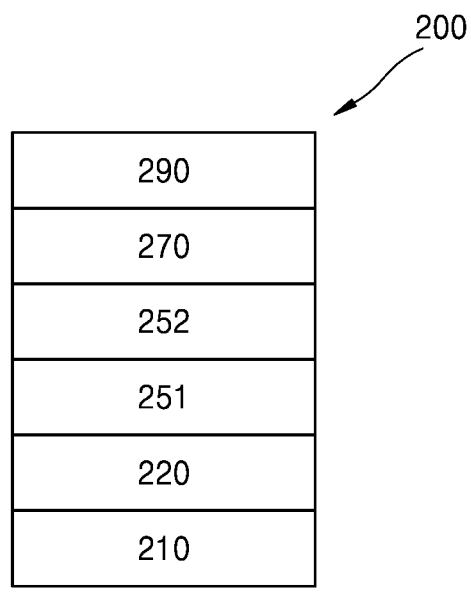
FIG. 3 is a schematic view of an organic light-emitting device 200 according to an embodiment.
Figure 4:
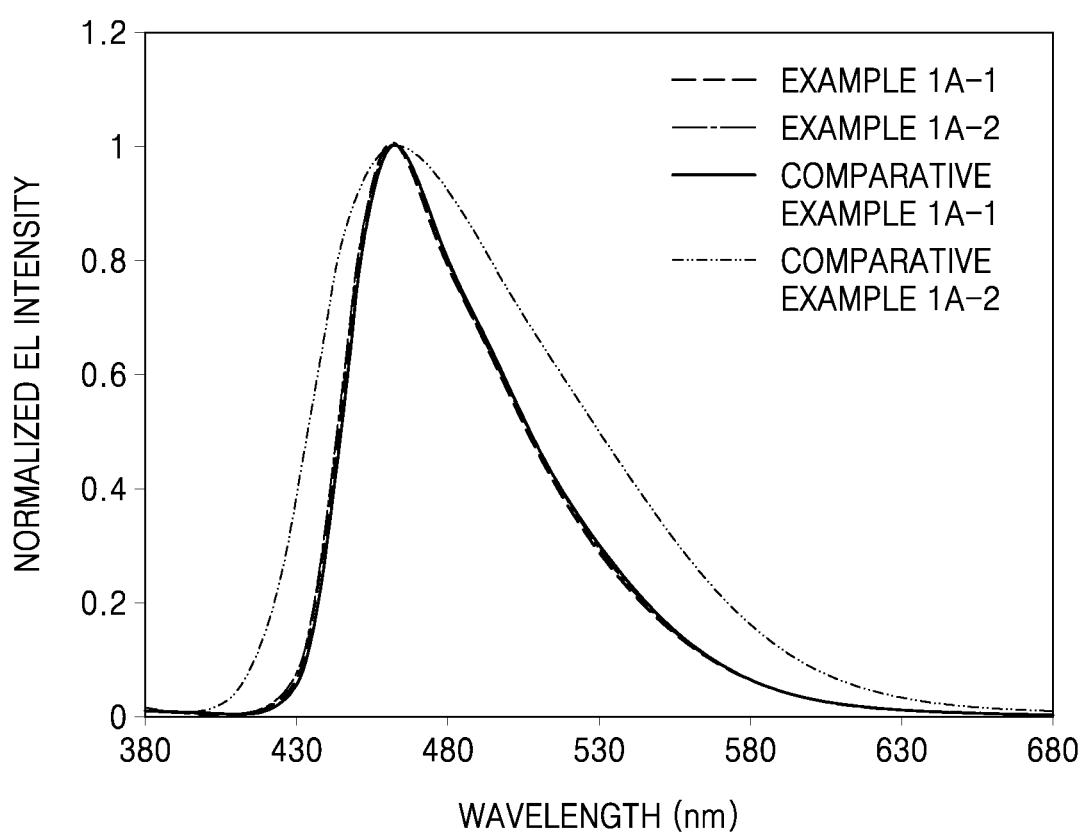
FIGS. 4 to 8 are graphs of normalized intensity (arbitrary units) versus wavelength (nanometers, nm), showing electroluminescence (EL) spectra according to one or more of the examples and comparative examples described herein.
Figure 5:
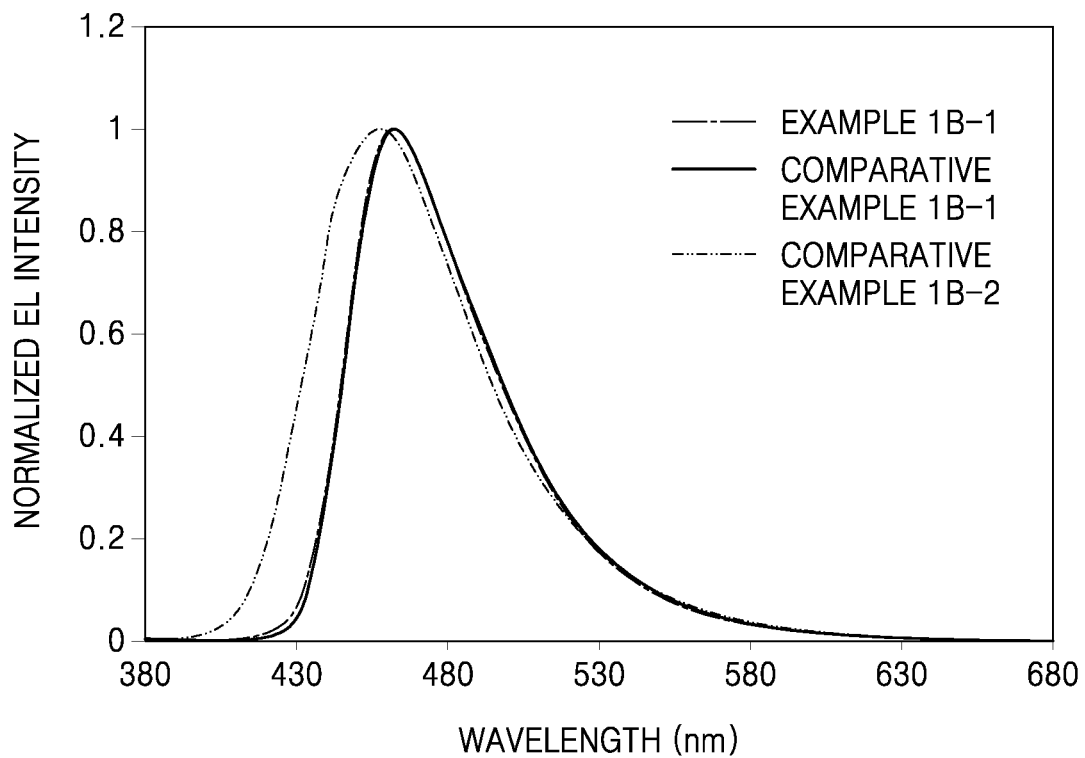
Figure 6:
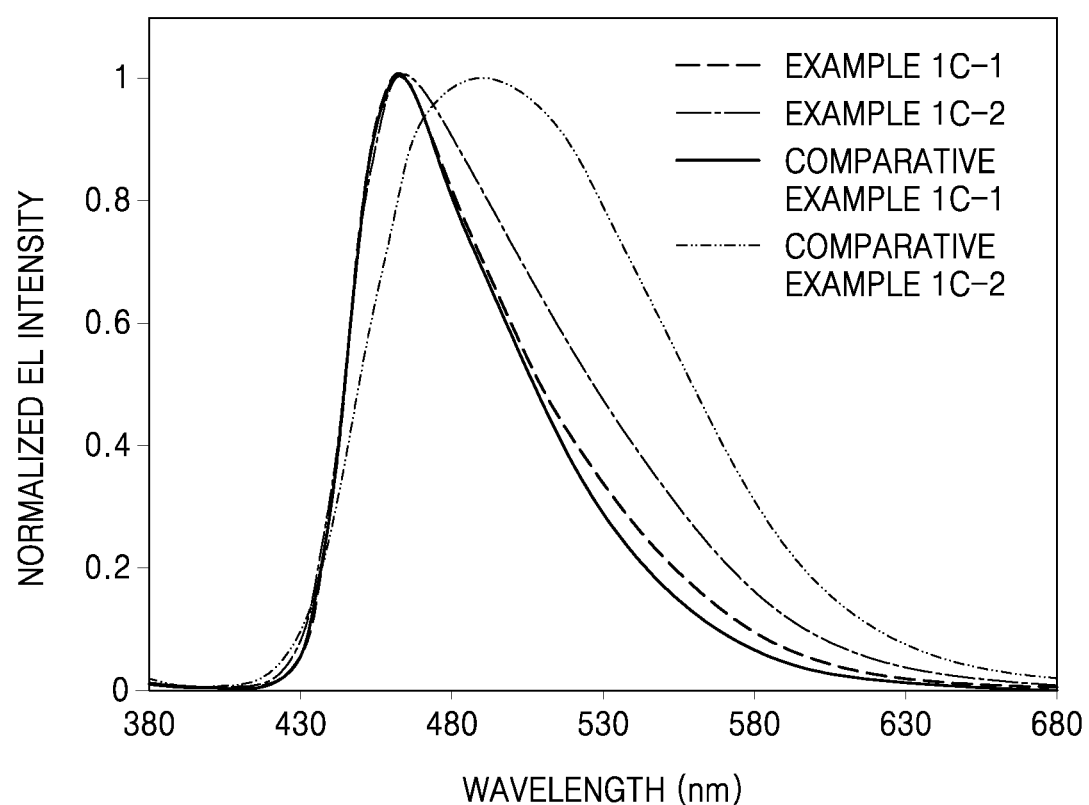
Figure 7:
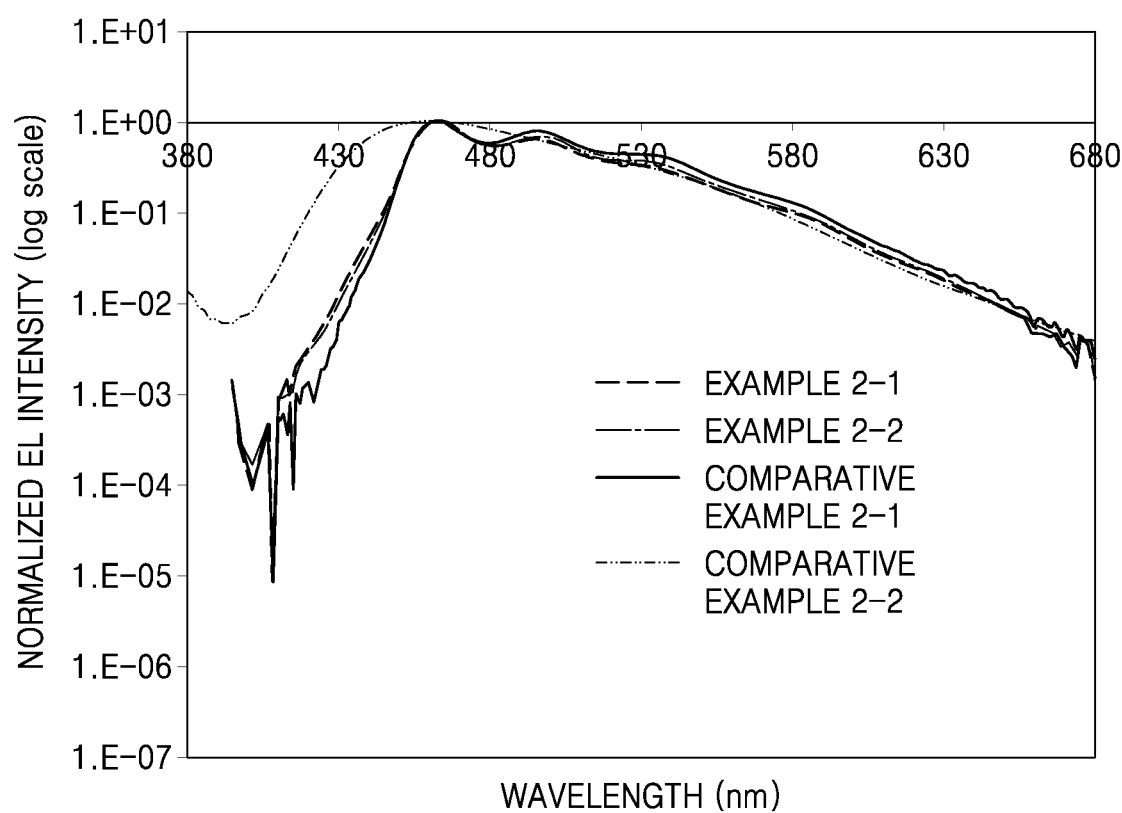
Figure 8:
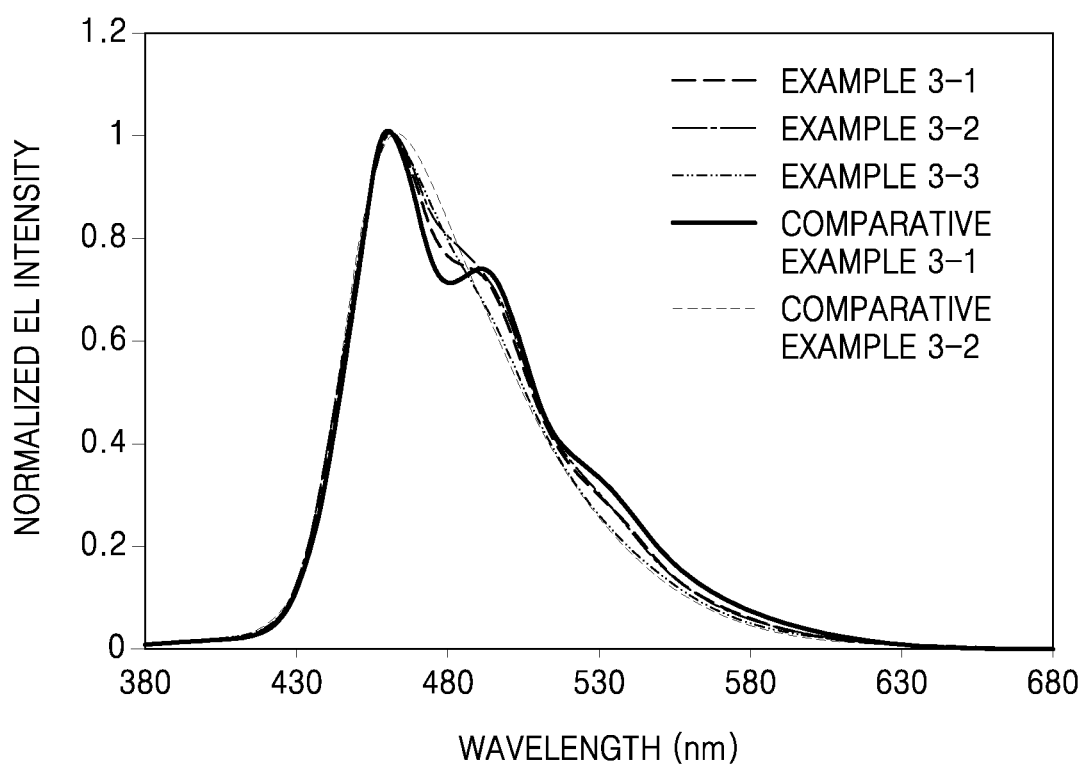

Description of FIG. 3

FIG. 3 is a schematic cross-sectional view of an organic light-emitting device 200 according to an embodiment.

The organic light-emitting device 200 may include a first electrode 210, a second electrode 290 facing the first electrode 210, and a first emission layer 251 and a second emission layer 252 stacked between the first electrode 210 and the second electrode 290.

A maximum emission wavelength of light emitted by the first emission layer 251 may be different from a maximum emission wavelength of light emitted by the second emission layer 252. For example, mixed light of the light emitted by the first emission layer 251 and the light emitted by the second emission layer 252 may be white light, but embodiments of the present disclosure are not limited thereto.

A hole transport region 220 may be disposed between the first emission layer 251 and the first electrode 210, and an electron transport region 270 may be disposed between the second emission layer 252 and the second electrode 290.

The first emission layer 251 may include a first compound, a second compound, and a third compound, and the first compound and the second compound may be different from each other, each of the first compound and the second compound may emit light, the third compound may not emit light, the first compound and the second compound may satisfy one of Conditions 1 to 4, the first compound and the second compound may satisfy Inequality 1-1 or 1-2, and the first compound and the second compound may satisfy Inequality 2.

The second emission layer 252 may include a first compound, a second compound, and a third compound, and the first compound and the second compound may be different from each other, each of the first compound and the second compound may emit light, the third compound may not emit light, the first compound and the second compound may satisfy one of Conditions 1 to 4, the first compound and the second compound may satisfy Inequality 1-1 or 1-2, and the first compound and the second compound may satisfy Inequality 2.

The first electrode 210, the hole transport region 220, and the second electrode 290 in FIG. 3 may be the same as described in connection with the first electrode 11, the hole transport region 12, and the second electrode 19 in FIG. 1.

The first emission layer 251 and the second emission layer 252 in FIG. 3 may be the same as described in connection with the emission layer of the organic layer 15 in FIG. 1.

The electron transport region 270 in FIG. 3 may be the same as described in connection with the electron transport region 17 in FIG. 1.

The organic light-emitting device including the emission layer including the first to third compounds has been described with reference to FIG. 3, but the first emission layer 251 and the second emission layer 252 may be variously modified. For example, one selected from the first emission layer 251 and the second emission layer 252 may be substituted with a known emission layer, the organic light-emitting device may include three or more emission layers, or an intermediate layer may be additionally disposed between the neighboring emission layers.

Hereinbefore, the organic light-emitting device has been described with reference to the drawings, but embodiments of the present disclosure are not limited thereto.

The first-row transition metal of the Periodic Table of Elements refers to an element that is a fourth-row element of the Periodic Table of Elements and is included in a d-block, and specific examples thereof may include scandium (Sc), titanium (Ti), vanadium (V), chromium (Cr), manganese (Mn), iron (Fe), cobalt (Co), nickel (Ni), copper (Cu), and zinc (Zn).

The second-row transition metal of the Periodic Table of Elements refers to an element that is a fifth-row element of the Periodic Table of Elements and is included in a d-block, and specific examples thereof may include yttrium (Y), zirconium (Zr), niobium (Nb), molybdenum (Mo), technetium (Tc), ruthenium (Ru), rhodium (Rh), palladium (Pd), silver (Ag), and cadmium (Cd).

The third-row transition metal of the Periodic Table of Elements refers to an element that is a sixth-row element of the Periodic Table of Elements and is included in a d-block, and specific examples thereof may include lanthanum (La), samarium (Sm), europium (Eu), terbium (Tb), thulium (Tm), ytterbium (Yb), lutetium (Lu), hafnium (Hf), tantalum (Ta), tungsten (W), rhenium (Re), osmium (Os), iridium (Ir), platinum (Pr), gold (Au), and mercury (Hg).

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having at least one double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from N, O, P, Si and S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group," used herein, refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group," used herein, refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a cyclic aromatic system that has at least one heteroatom selected from N, O, P, Si, and S as a ring-forming atom, in addition to 1 to 60 carbon atoms. The term "$C_1$-$C_{60}$ heteroarylene group" as used herein refers to a divalent group having a carbocyclic aromatic system that has at least one heteroatom selected from N, O, P, Si, and S as a ring-forming atom, in addition to 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group," as used herein, indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

The term "monovalent non-aromatic condensed polycyclic group" as used herein refers to a monovalent group having two or more rings condensed to each other, only carbon atoms (for example, the number of carbon atoms may be in a range of 8 to 60) as a ring-forming atom, and no aromaticity in its entire molecular structure. Non-limiting examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group having two or more rings condensed to each other, a heteroatom selected from N, O, P, Si, and S, other than carbon atoms (for example, the number of carbon atoms may be in a range of 2 to 60), as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The term "$C_5$-$C_{30}$ carbocyclic group" as used herein refers to a monocyclic group or a polycyclic group, and, according to its chemical structure, a monovalent, divalent, trivalent, tetravalent, pentavalent, or hexavalent group.

The term "$C_1$-$C_{30}$ heterocyclic group" as used herein refers to a saturated or unsaturated cyclic group having, as a ring-forming atom, at least one heteroatom selected from N, O, Si, P, and S other than 1 to 30 carbon atoms. The term "$C_1$-$C_{30}$ heterocyclic group" as used herein refers to a monocyclic group or a polycyclic group, and, according to its chemical structure, a monovalent, divalent, trivalent, tetravalent, pentavalent, or hexavalent group.

The substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group may be deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof; or a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or a combination thereof; or a $C_3$-$C_{10}$ cycloalkyl group, a $C_1$-$C_{60}$ heterocycloalkyl group, a $C_3$-$C_{60}$ cycloalkenyl group, a $C_1$-$C_{60}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group; or a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with a deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or a combination thereof; or —N($Q_{31}$)($Q_{32}$), —Si($Q_{33}$)($Q_{34}$)($Q_{35}$), —B($Q_{36}$)($Q_{37}$), or —P(=O)($Q_{38}$)($Q_{39}$); and wherein $Q_1$ to $Q_6$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

The term "room temperature" as used herein refers to a temperature of about 25° C.

The term "biphenyl group" as used herein refers to a monovalent group in which two benzene groups are linked to each other via a single bond.

The term "terphenyl group" as used herein refers to a monovalent group in which three benzene groups are linked via single bonds, wherein a central benzene group is linked to each of the other two benzene groups via single bonds.

Hereinafter, a compound and an organic light-emitting device according to embodiments are described in detail with reference to Synthesis Example and Examples. However, the organic light-emitting device is not limited thereto. The wording "'B' was used instead of 'A'" used in describing Synthesis Examples means that a molar equivalent of 'A' was identical to a molar equivalent of 'B'.

EXAMPLES

Evaluation Example 1: Evaluation of Physical Properties of Thin Film (1) Measurement of PL Spectrum Regarding films formed by depositing Compounds shown in Table 1 on a substrate, PL spectra were obtained at room temperature in an inert environment in which outside air was blocked. Results thereof are shown in Table 1.

(2) PL Stability

Regarding Compounds shown in Table 1, photostability (PLS) was calculated based on Equation P, and results thereof are shown in Table 1.

$$PLS\ (\%) = I_2/I_1 \times 100 \qquad \text{Equation P}$$

In Equation P, $I_1$ is the maximum light intensity obtained by measuring PL spectra at room temperature in an inert environment in which outside air is blocked, immediately after a film is formed by depositing a compound, the photostability of which is to be measured, and $I_2$ is the maximum light intensity obtained by measuring PL spectra at room temperature in an inert environment in which outside air is blocked, with respect to a film formed by depositing a compound, the photostability of which is to be measured, after exposing to pumping laser light used for evaluation of $I_1$ in an inert environment in which outside air is blocked.

(3) Measurement of Radiative Decay Rate

The radiative decay rates of Compounds shown in Table 1 were measured by using the above-described method. Results thereof are shown in Table 1.

TABLE 1

| Compound | PLQY (%) | $\lambda_{max}$ (nm) | Full width at half maximum (nm) | PLS (%) | Radiative decay rate ($s^{-1}$) |
|---|---|---|---|---|---|
| C1 | 75.3 | 467 | 62 | 48 | 7.63E+04 |
| C2 | 64.2 | 460 | 80 | 74 | 1.01E+04 |
| C3 | 59.4 | 477 | 93 | 71 | 5.09E+04 |
| C4 | 74.2 | 448 | 78 | 71 | 1.00E+04 |
| C5 | 51 | 466 | 54 | 84 | 3.37E+05 |
| C6 | 44 | 450 | 72 | 80 | 2.24E+04 |
| C8 | 80.3 | 465 | 62 | 65 | 1.57E+08 |
| C9 | 60.8 | 462 | 64 | 78 | 7.95E+07 |
| X1 | 70.3 | 459 | 33 | 30 | 5.87E+03 |
| X2 | 50.1 | 467 | 46 | 66 | 6.39E+07 |
| X3 | 65.2 | 474 | 51 | 80 | 1.15E+08 |

C1
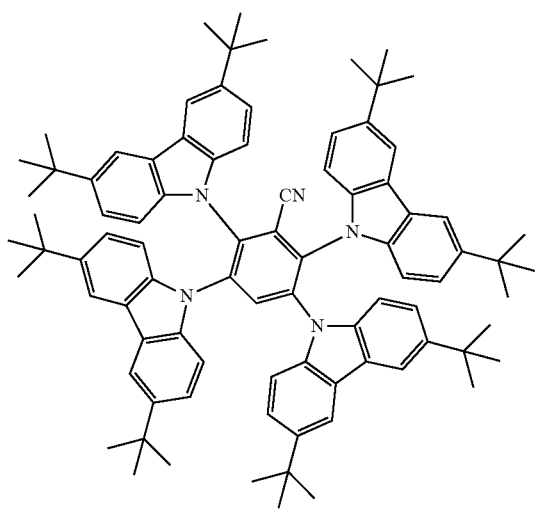
C2
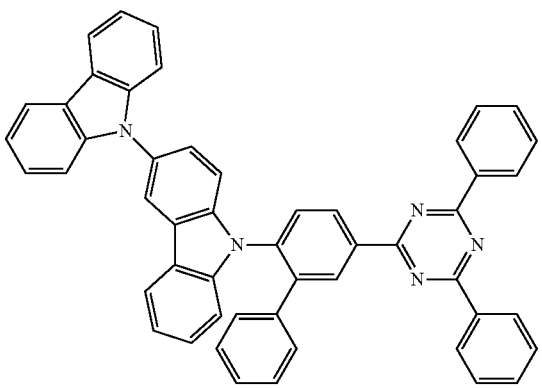
C3
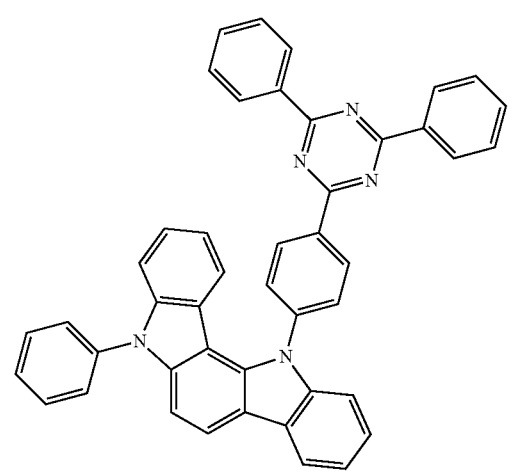
C4
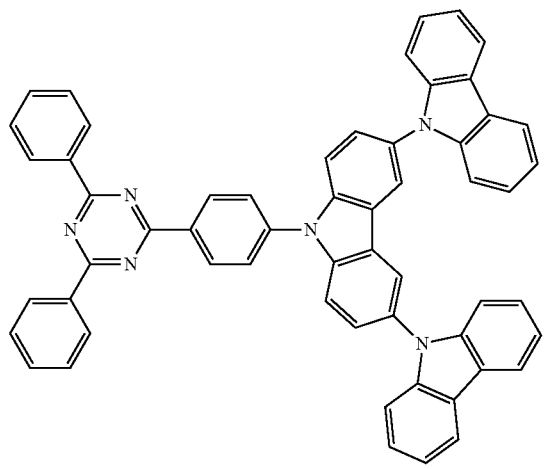
C5
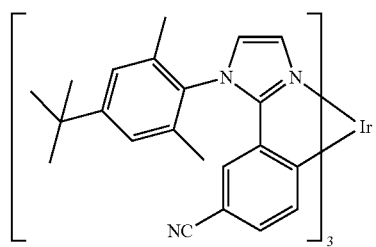
C6
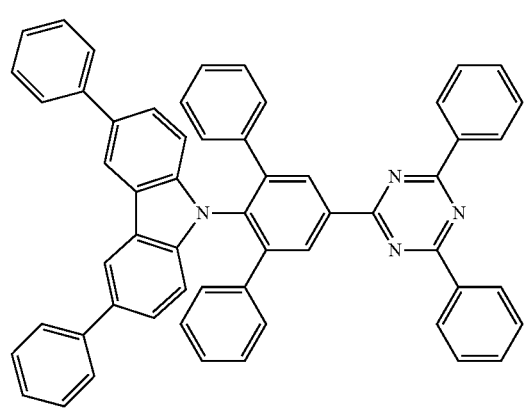
C8
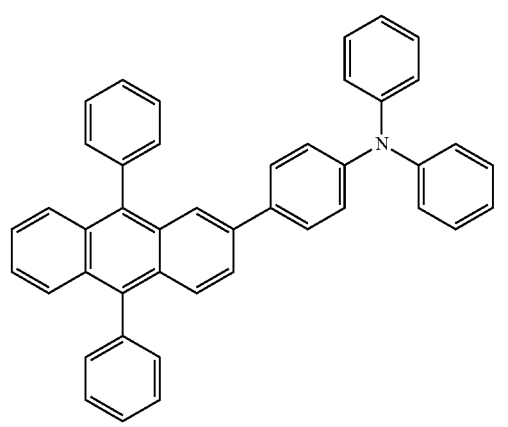

-continued

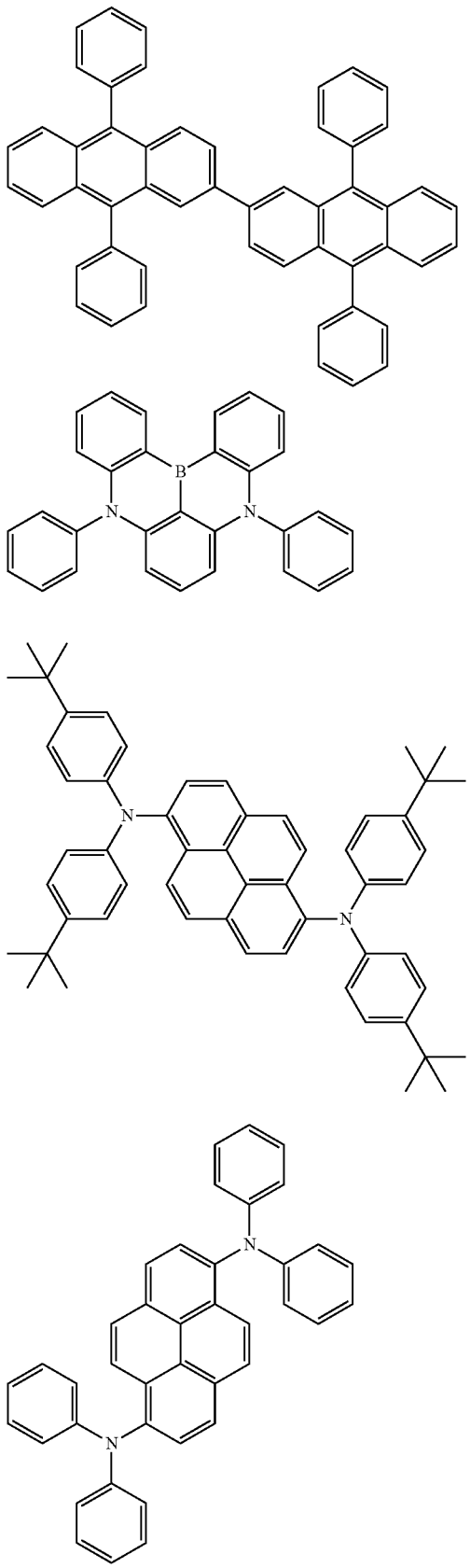

Example 1A-1

As an anode, a glass substrate, on which an ITO electrode was formed, was cut to a size of 50 mm×50 mm×0.5 mm, sonicated with acetone, isopropyl alcohol, and pure water each for 15 minutes, and then cleaned by exposure to ultraviolet rays and ozone for 30 minutes.

Compound HT3 was deposited on the anode to form a hole transport layer having a thickness of 1,600 Å, thereby forming a hole transport region.

E4 (third compound), C1 (first compound), and C2 (second compound) were respectively co-deposited on the hole transport region at 85 wt %, 12 wt %, and 3 wt % to form an emission layer having a thickness of 400 Å.

Compound ET17 and LiQ were co-deposited on the emission layer at a weight ratio of 5:5 to form an electron transport layer having a thickness of 180 Å, LiQ was deposited on the electron transport layer to form an electron injection layer having a thickness of 10 Å, and Al was formed on the electron injection layer to a thickness of 1,000 Å, thereby completing the manufacture of an organic light-emitting device.

Examples 1A-2, 1B-1, 1C-1, and 1C-2 and Comparative Examples 1A-1, 1A-2, 1B-1, 1B-2, 1C-1, 1C-2, 1-3, and 1-4

Organic light-emitting devices were manufactured in the same manner as in Example 1A-1, except that the first compound, the second compound, and the third compound were each changed as shown in Table 2 in forming an emission layer.

TABLE 2

|  | First compound | | Second compound | | Third compound | |
| --- | --- | --- | --- | --- | --- | --- |
|  | Compound | Amount (wt %) | Compound | Amount (wt %) | Compound | Amount (wt %) |
| Example 1A-1 | C1 | 12 | C2 | 3 | E4 | 85 |
| Example 1A-2 | C1 | 10 | C2 | 5 | E4 | 85 |
| Comparative Example 1A-1 | C1 | 15 | — | — | E4 | 85 |
| Comparative Example 1A-2 | — | — | C2 | 15 | E4 | 85 |
| Example 1B-1 | C1 | 10 | C4 | 5 | E1 | 85 |
| Comparative Example 1B-1 | C2 | 15 | — | — | E1 | 85 |
| Comparative Example 1B-2 | — | — | C4 | 15 | E1 | 85 |
| Example 1C-1 | C1 | 10 | C3 | 5 | E4 | 85 |
| Example 1C-2 | C1 | 5 | C3 | 10 | E4 | 85 |
| Comparative Example 1C-1 | C1 | 15 | — | — | E4 | 85 |
| Comparative Example 1C-2 | — | — | C3 | 15 | E4 | 85 |
| Comparative Example 1-3 | C1 | 14 | X1 | 1 | E4 | 85 |
| Comparative Example 1-4 | — | — | X1 | 15 | E4 | 85 |

Example 2-1

As an anode, a glass substrate, on which an ITO electrode was formed, was cut to a size of 50 mm×50 mm×0.5 mm, sonicated with acetone, isopropyl alcohol, and pure water each for 15 minutes, and then cleaned by exposure to ultraviolet rays and ozone for 30 minutes.

Compound HT3 was deposited on the anode to form a hole transport layer having a thickness of 1,600 Å, thereby forming a hole transport region.

E6 (third compound), C5 (first compound), and C6 (second compound) were respectively co-deposited on the hole transport region at 87 wt %, 10 wt %, and 3 wt % to form an emission layer having a thickness of 400 Å.

Compound ET17 and LiQ were co-deposited on the emission layer at a weight ratio of 5:5 to form an electron transport layer having a thickness of 180 Å, LiQ was deposited on the electron transport layer to form an electron injection layer having a thickness of 10 Å, and Al was formed on the electron injection layer to a thickness of 1,000 Å, thereby completing the manufacture of an organic light-emitting device.

Example 2-2 and Comparative Examples 2-1 to 2-4

Organic light-emitting devices were manufactured in the same manner as in Example 2-1, except that the first compound, the second compound, and the third compound were changed as shown in Table 3 in forming an emission layer.

TABLE 3

|  | First compound | | Second compound | | Third compound | |
| --- | --- | --- | --- | --- | --- | --- |
|  | Compound | Amount (wt %) | Compound | Amount (wt %) | Compound | Amount (wt %) |
| Example 2-1 | C5 | 10 | C6 | 3 | E4 | 87 |
| Example 2-2 | C5 | 10 | C6 | 7 | E4 | 83 |
| Comparative Example 2-1 | C5 | 10 | — | — | E4 | 90 |
| Comparative Example 2-2 | — | — | C6 | 15 | E4 | 85 |
| Comparative Example 2-3 | C5 | 10 | C1 | 5 | E4 | 85 |
| Comparative Example 2-4 | — | — | C1 | 15 | E4 | 85 |

Example 3-1

As an anode, a glass substrate, on which an ITO electrode was formed, was cut to a size of 50 mm×50 mm×0.5 mm, sonicated with acetone, isopropyl alcohol, and pure water each for 15 minutes, and then cleaned by exposure to ultraviolet rays and ozone for 30 minutes.

Compound HT3 was deposited on the anode to form a hole transport layer having a thickness of 1,600 Å, thereby forming a hole transport region.

E9 (third compound), C8 (first compound), and C9 (second compound) were respectively co-deposited on the hole transport region at 97 wt %, 2 wt %, and 1 wt % to form an emission layer having a thickness of 400 Å.

Compound ET17 and LiQ were co-deposited on the emission layer at a weight ratio of 5:5 to form an electron transport layer having a thickness of 180 Å, LiQ was deposited on the electron transport layer to form an electron injection layer having a thickness of 10 Å, and Al was formed on the electron injection layer to a thickness of 1,000 Å, thereby forming the manufacture of an organic light-emitting device.

Examples 3-2 and 3-3 and Comparative Examples 3-1 to 3-5

Organic light-emitting devices were manufactured in the same manner as in Example 3-1, except that the first compound, the second compound, and the third compound were changed as shown in Table 4 in forming an emission layer.

TABLE 4

|  | First compound | | Second compound | | Third compound | |
| --- | --- | --- | --- | --- | --- | --- |
|  | Compound | Amount (wt %) | Compound | Amount (wt %) | Compound | Amount (wt %) |
| Example 3-1 | C8 | 2 | C9 | 1 | E9 | 97 |
| Example 3-2 | C8 | 1.5 | C9 | 1.5 | E9 | 97 |
| Example 3-3 | C8 | 1 | C9 | 2 | E9 | 97 |
| Comparative Example 3-1 | C8 | 3 | — | — | E9 | 97 |
| Comparative Example 3-2 | — | — | C9 | 3 | E9 | 97 |
| Comparative Example 3-3 | X2 | 3 | — | — | E4 | 97 |
| Comparative Example 3-4 | X2 | 1 | X3 | 2 | E4 | 97 |
| Comparative Example 3-5 | — | — | X3 | 3 | E4 | 97 |

Evaluation Example 2: Evaluation of Device Characteristics

The maximum external quantum efficiency ($EQE_{max}$), luminance, external quantum efficiency (EQE, at 500 cd/m$^2$ or 1,000 cd/m$^2$), relative external quantum efficiency, CIE color coordinates (at 500 cd/m$^2$ or 1,000 cd/m$^2$), maximum emission wavelength (EL λmax), lifespan ($T_{95}$) (at 500 cd/m$^2$ or 1,000 cd/m$^2$) and relative lifespan characteristics of the organic light-emitting devices manufactured according to Examples and Comparative Examples were measured by using a current-voltage meter (Keithley 2400) and a luminance meter (Minolta Cs-1000A), and results thereof are shown in Tables 5 to 7 and FIGS. 4 to 8. In Tables 5 to 7, $T_{95}$ (at 500 cd/m$^2$ or 1,000 cd/m$^2$) is lifespan data obtained by evaluating the time that lapsed when luminance was 95% of luminance (100%).

TABLE 5

|  | First compound | Second compound | First compound:Second compound | $EQE_{max}$ (%) | Luminance (cd/m$^2$) | EQE (%) | CIEx | CIEy | EL $λ_{max}$ (nm) | $T_{95}$ (hr) | Relative EQE | Relative $T_{95}$ |
| --- | --- | --- | --- | --- | --- | --- | --- | --- | --- | --- | --- | --- |
| Example 1A-1 | C1 | C2 | 12:3 | 22.7 | 500 | 19.6 | 0.16 | 0.21 | 462 | 11.6 | 102% | 215% |
| Example 1A-2 | C1 | C2 | 10:5 | 21.8 | 500 | 18.8 | 0.16 | 0.21 | 461 | 12.6 | 98% | 233% |
| Comparative Example 1A-1 | C1 | — | 15:0 | 22.0 | 500 | 19.2 | 0.16 | 0.22 | 462 | 5.4 | 100% | 100% |
| Comparative Example 1A-2 | — | C2 | 0:15 | 8.9 | 500 | 7.1 | 0.16 | 0.20 | 461 | 3.4 | 37% | 63% |

TABLE 5-continued

|  | First compound | Second compound | First compound:Second compound | $EQE_{max}$ (%) | Luminance (cd/m²) | EQE (%) | CIEx | CIEy | EL $\lambda_{max}$ (nm) | $T_{95}$ (hr) | Relative EQE | Relative $T_{95}$ |
|---|---|---|---|---|---|---|---|---|---|---|---|---|
| Example 1B-1 | C1 | C4 | 10:5 | 23.2 | 500 | 17.8 | 0.15 | 0.17 | 462 | 4.27 | 97% | 155% |
| Comparative Example 1B-1 | C1 | — | 15:0 | 24.5 | 500 | 18.3 | 0.15 | 0.17 | 462 | 2.76 | 100% | 100% |
| Comparative Example 1B-2 | — | C4 | 0:15 | 8.4 | 500 | 6.7 | 0.15 | 0.14 | 456 | 1.60 | 37% | 58% |
| Example 1C-1 | C1 | C3 | 10:5 | 21.8 | 500 | 19.1 | 0.17 | 0.24 | 462 | 17.0 | 100% | 227% |
| Example 1C-2 | C1 | C3 | 5:10 | 20.0 | 500 | 17.2 | 0.18 | 0.28 | 466 | 21.6 | 104% | 288% |
| Comparative Example 1C-1 | C1 | — | 15:0 | 23.3 | 500 | 20.2 | 0.16 | 0.22 | 462 | 7.5 | 100% | 100% |
| Comparative Example 1C-2 | — | C3 | 0:15 | 17.6 | 500 | 15.3 | 0.22 | 0.38 | 487 | 22.2 | 25% | 296% |
| Comparative Example 1-3 | C1 | X1 | 14:1 | 17.5 | 500 | 20.2 | 0.15 | 0.14 | 461 | 1.1 | 60% | 18% |
| Comparative Example 1-4 | — | X1 | 0:15 | 12.0 | 500 | 2.6 | 0.13 | 0.12 | 460 | 0.1 | 13% | 2% |

TABLE 6

|  | First compound | Second compound | First compound:Second compound | $EQE_{max}$ (%) | Luminance (cd/m²) | EQE (%) | CIEx | CIEy | EL $\lambda_{max}$ (nm) | $T_{95}$ (hr) | Relative EQE | Relative $T_{95}$ |
|---|---|---|---|---|---|---|---|---|---|---|---|---|
| Example 2-1 | C5 | C6 | 10:3 | 23.9 | 1000 | 21.5 | 0.18 | 0.31 | 462 | 51.3 | 107% | 221% |
| Example 2-2 | C5 | C6 | 10:7 | 23.7 | 1000 | 21.1 | 0.17 | 0.29 | 462 | 49.5 | 105% | 213% |
| Comparative Example 2-1 | C5 | — | 10:0 | 22.4 | 1000 | 20.1 | 0.18 | 0.33 | 462 | 23.2 | 100% | 100% |
| Comparative Example 2-2 | — | C6 | 0:15 | 12.1 | 1000 | 8.1 | 0.16 | 0.20 | 461 | 1.5 | 40% | 6% |
| Comparative Example 2-3 | C5 | C1 | 10:5 | 20.2 | 1000 | 20.6 | 0.17 | 0.28 | 462 | 12.5 | 102% | 54% |
| Comparative Example 2-4 | — | C1 | 0:15 | 21.6 | 1000 | 17.4 | 0.15 | 0.21 | 462 | 2.49 | 87% | 11% |

TABLE 7

|  | First compound | Second compound | First compound:Second compound | $EQE_{max}$ (%) | Luminance (cd/m²) | EQE (%) | CIEx | CIEy | EL $\lambda_{max}$ (nm) | $T_{95}$ (hr) | Relative EQE | Relative $T_{95}$ |
|---|---|---|---|---|---|---|---|---|---|---|---|---|
| Example 3-1 | C8 | C9 | 2:1 | 4.1 | 500 | 3.0 | 0.15 | 0.20 | 462 | 1.68 | 107% | 160% |
| Example 3-2 | C8 | C9 | 1.5:1.5 | 4.2 | 500 | 3.0 | 0.15 | 0.21 | 462 | 2.80 | 107% | 267% |
| Example 3-3 | C8 | C9 | 1:2 | 4.2 | 500 | 3.1 | 0.15 | 0.22 | 462 | 2.65 | 111% | 252% |
| Comparative Example 3-1 | C8 | — | 3:0 | 3.9 | 500 | 2.8 | 0.15 | 0.19 | 464 | 1.05 | 100% | 100% |
| Comparative Example 3-2 | — | C9 | 0:3 | 4.0 | 500 | 3.0 | 0.16 | 0.23 | 461 | 1.13 | 107% | 108% |
| Comparative Example 3-3 | X2 | — | 3:0 | 3.3 | 500 | 2.5 | 0.15 | 0.32 | 477 | 4.43 | 100% | 100% |
| Comparative Example 3-4 | X2 | X3 | 1:2 | 3.2 | 500 | 2.2 | 0.15 | 0.31 | 472 | 3.85 | 88% | 87% |
| Comparative Example 3-5 | — | X3 | 0:3 | 3.2 | 500 | 1.9 | 0.14 | 0.19 | 465 | 2.49 | 76% | 56% |

Referring to Tables 5 to 7, it is confirmed that the organic light-emitting devices of the Examples have color coordinates similar to those of the organic light-emitting devices of the Comparative Examples, but have remarkably improved or similar external quantum efficiency and lifespan, as compared with those of the organic light-emitting devices of the Comparative Examples. In addition, the organic light-emitting devices of the Examples may have remarkably shorter wavelengths while having a lifespan similar to that of the organic light-emitting devices of the Comparative Examples.

The organic light-emitting device may have high efficiency and a long lifespan at the same time.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present description as defined by the following claims.

What is claimed is:

1. An organic light-emitting device comprising:
a first electrode;
a second electrode facing the first electrode; and
an organic layer disposed between the first electrode and the second electrode,
wherein
the organic layer comprises an emission layer,
the emission layer comprises a first compound, a second compound, and a third compound, and the first compound and the second compound are different from each other,
each of the first compound and the second compound emits light,
the third compound does not emit light,
the first compound and the second compound satisfy one of Conditions 1 to 4:
wherein Condition 1 comprises:
400 nanometers≤$\lambda_{max1}$<500 nanometers, and
400 nanometers≤$\lambda_{max2}$<500 nanometers,
wherein Condition 2 comprises:
500 nanometers≤$\lambda_{max1}$<550 nanometers, and
500 nanometers≤$\lambda_{max2}$<550 nanometers,
wherein Condition 3 comprises:
550 nanometers≤$\lambda_{max1}$<620 nanometers, and
550 nanometers≤$\lambda_{max2}$<620 nanometers,
wherein Condition 4 comprises:
620 nanometers≤$\lambda_{max1}$<700 nanometers, and
620 nanometers≤$\lambda_{max2}$<700 nanometers,
the first compound and the second compound may satisfy Inequality (1-1) or (1-2):

$$PLS(C1) \leq PLS(C2) \tag{1-1}$$

$$(\lambda_{max2}-\lambda_{max1})+PLS(C1) \leq PLS(C2) \tag{1-2},$$

the first compound and the second compound may satisfy Inequality (2):

$$kr(C1) \geq kr(C2) \tag{2}, and$$

wherein, in Conditions 1 to 4 and Inequalities (1-1), (12) and (2),
$\lambda_{max1}$ is a maximum emission wavelength of the first compound,
$\lambda_{max2}$ is a maximum emission wavelength the second compound,
PLS(C1) is a photostability of the first compound,
PLS(C2) is a photostability of the second compound,
wherein the photostability PLS(C1) is defined by Equation (P1):

$$PLS(C1)=I_2(C1)/I_1(C1) \times 100\% \tag{P1},$$

wherein $I_1(C1)$ is maximum light intensity obtained by measuring PL spectra at room temperature under an inert environment where outside air is blocked, with respect to a first film that is formed by depositing the first compound alone or with the third compound on a quartz substrate followed by performing encapsulation with a glass substrate,
wherein $I_2(C1)$ is maximum light intensity obtained by measuring PL spectra at room temperature under an inert environment where outside air is blocked, with respect to a second film that is formed by depositing the first compound alone or with the third compound on a quartz substrate followed by performing encapsulation with a glass substrate and exposing the second film to pumping laser light for 3 hours,
wherein the photostability PLS(C2) is defined by Equation (P2):

$$PLS(C2)=I_2(C2)/I_1(C2) \times 100\% \tag{P2},$$

wherein $I_1(C2)$ is maximum light intensity obtained by measuring PL spectra at room temperature under an inert environment where outside air is blocked, with respect to a third film that is formed by depositing the second compound alone or with the third compound on a quartz substrate followed by performing encapsulation with a glass substrate,
wherein $I_2(C1)$ is maximum light intensity obtained by measuring PL spectra at room temperature under an inert environment where outside air is blocked, with respect to a fourth film that is formed by depositing the second compound alone or with the third compound on a quartz substrate followed by performing encapsulation with a glass substrate and exposing the fourth film to pumping laser light for 3 hours,
kr(C1) is a radiative decay rate of the first compound,
kr(C2) is a radiative decay rate of the second compound,
wherein kr(C1) is determined from photoluminescence quantum efficiency (PLQY) and decay lifetime (Tau) measured in a fifth film manufactured by mixing the first compound with polymethyl (meth)acrylate (PMMA) or the third compound, and
wherein kr(C2) is determined from photoluminescence quantum efficiency (PLQY) and decay lifetime (Tau) measured in a sixth film manufactured by mixing the second compound with polymethyl (meth)acrylate (PMMA) or the third compound.

2. The organic light-emitting device of claim 1, wherein the organic light-emitting device further satisfies Inequalities (2-1) and (2-2):

$$LT(C1+C2)>LT(C1) \tag{2-1}$$

$$LT(C1+C2)>LT(C2) \tag{2-2}$$

wherein, in Inequalities (2-1) and (2-2),
LT(C1) is a lifespan of a comparable organic light-emitting device that is identical to the organic light-emitting device of claim 1 except that it does not comprise the second compound,
LT(C2) is a lifespan of a comparable organic light-emitting device that is identical to the organic light-emitting device of claim 1 except that it does not comprise the first compound, and
LT(C1+C2) is a lifespan of the organic light-emitting device,
wherein LT(C1), LT(C2), and LT(C1+C2) are measured under the same conditions.

3. The organic light-emitting device of claim 1, wherein an amount of the first compound in the emission layer is greater than an amount of the second compound in the emission layer.

4. The organic light-emitting device of claim 1, wherein an amount of the first compound and an amount of the second compound in the emission layer are each independently in a range of about 1 weight percent to about 20 weight percent, based on the total weight of the emission layer.

5. The organic light-emitting device of claim 1, wherein the first compound and the second compound each independently have a photoluminescence quantum yield (PLQY) of about 10% to about 100%.

6. The organic light-emitting device of claim 1, wherein an energy gap (Eg1) of the first compound and an energy gap (Eg2) of the second compound satisfy Inequality (2-4):

|Eg1−Eg2|<0.15 electron volts   (2-4)

wherein the energy gap (Eg1) and the energy gap (Eg2) are expressed in electron volts.

7. The organic light-emitting device of claim 1, wherein the first compound and the second compound are each a delayed fluorescence emitter;

the first compound and the second compound are each a phosphorescence emitter;

the first compound is a delayed fluorescence emitter, and the second compound is a phosphorescence emitter;

the first compound is a phosphorescence emitter, and the second compound is a delayed fluorescence emitter; or the first compound and the second compound are each a fluorescence emitter.

8. The organic light-emitting device of claim 7, wherein the delayed fluorescence emitter satisfies Inequality (3):

0 electron volts≤[$E_{S1}$(TADF)−$E_{T1}$(TADF)]≤0.3 electron volts   (3)

wherein, in Inequality 3, $E_{S1}$(TADF) is a lowest excitation singlet energy level of the delayed fluorescence emitter in electron volts, and $E_{T1}$(TADF) is a lowest excitation triplet energy level of the delayed fluorescence emitter in electron volts.

9. The organic light-emitting device of claim 7, wherein the delayed fluorescence emitter is represented by one of Formulae 1 or 2:

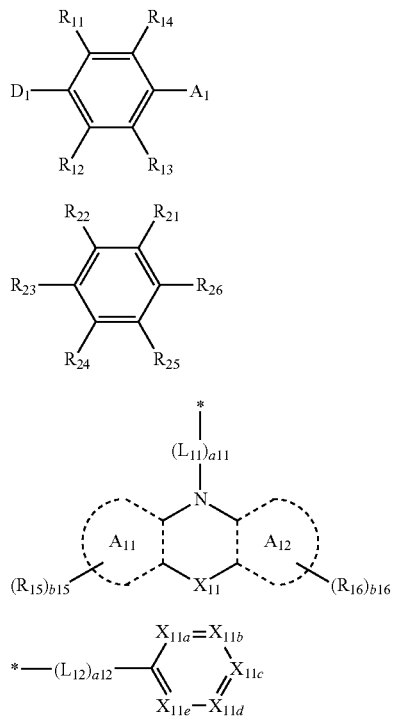

Formula 1

Formula 2

Formula 11-1

Formula 12-1

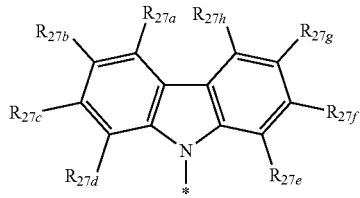

Formula 13-1

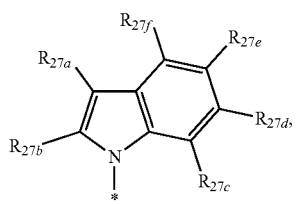

Formula 13-2 wherein, in Formulae 1, 2, 11-1, 12-1, 13-1 and 13-2, $D_1$ is a group represented by Formula 11-1, $A_1$ is a group represented by Formula 12-1, $X_{11}$ is a single bond, O, S, N($R_{17}$), or C($R_{17}$)($R_{18}$), $A_{11}$ and $A_{12}$ are each independently a benzene group, a fluorene group, a carbazole group, a dibenzofuran group, or a dibenzothiophene group, $L_{11}$ and $L_{12}$ are each independently a substituted or unsubstituted $C_5$-$C_{30}$ carbocyclic group or a substituted or unsubstituted $C_1$-$C_{30}$ heterocyclic group, $a_{11}$ and $a_{12}$ are each independently 0, 1, 2, or 3, $X_{11a}$ is N or C($R_{11a}$); $X_{11b}$ is N or C($R_{11b}$); $X_{11c}$ is N or C($R_{11c}$); $X_{11d}$ is N or C($R_{11d}$); and $X_{11e}$ is N or C($R_{11e}$), wherein at least one of $X_{11a}$ to $X_{11e}$ is N, $R_{21}$ to $R_{26}$ are each independently a group represented by Formula 13-1, a group represented by Formula 13-2, hydrogen, deuterium, —F, —Cl, —Br, —I, a hydroxyl group, a cyano group, a substituted or unsubstituted $C_1$-$C_{60}$ alkyl group, a substituted or unsubstituted $C_1$-$C_{60}$ alkoxy group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group, at least one of $R_{21}$ to $R_{26}$ is a cyano group, at least one of $R_{21}$ to $R_{26}$ is a group represented by Formula 13-1 and a group represented by Formula 13-2, $R_{11}$ to $R_{18}$, $R_{11a}$ to $R_{11e}$, and $R_{27a}$ to $R_{27h}$, are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), or —B($Q_6$)($Q_7$), b15 and b16 are each independently 1, 2, 3, 4, 5, 6, 7, or 8, $Q_1$ to $Q_7$ are each independently hydrogen, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, and

* indicates a bonding site to a neighboring atom.

10. The organic light-emitting device of claim 7, wherein the phosphorescence emitter is represented by Formula 81:

$$M(L_{81})_{n81}(L_{82})_{n82} \quad \text{Formula 81}$$

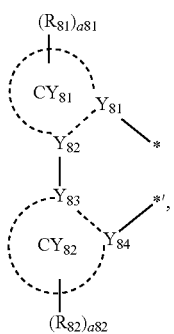

Formula 81A wherein, in Formulae 81 and 81A,

M is a first-row transition metal, a second-row transition metal, or a third-row transition metal of the Periodic Table of Elements, $L_{81}$ is a ligand represented by Formula 81A, and n81 is an integer from 1 to 3, wherein, when n81 is two or more, two or more groups L81 are identical to or different from each other, $L_{82}$ is an organic ligand, and n82 is an integer from 0 to 4, wherein, when n82 is two or more, two or more groups $L_{82}$ are identical to or different from each other, $Y_{81}$ to $Y_{84}$ are each independently carbon (C) or nitrogen (N), $Y_{81}$ and $Y_{82}$ are linked via a single bond or a double bond, and $Y_{83}$ and $Y_{84}$ are linked via a single bond or a double bond, $CY_{81}$ and $CY_{82}$ are each independently a $C_5$-$C_{30}$ carbocyclic group or a $C_3$-$C_{30}$ heterocarbocyclic group, $CY_{81}$ and $CY_{82}$ are optionally linked via an organic linking group, $R_{81}$ and $R_{82}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{81}$)($Q_{82}$)($Q_{83}$), —N($Q_{84}$)($Q_{85}$), —B($Q_{86}$)($Q_{87}$), or —P(=O)($Q_{88}$)($Q_{89}$), a81 and a82 are each independently an integer from 1 to 5, wherein, when a81 is two or more, two or more groups $R_{81}$ are identical to or different from each other, wherein, when a82 is two or more, two or more groups $R_{82}$ are identical to or different from each other, wherein, when a81 is two or more, neighboring groups $R_{81}$ are optionally linked to form a saturated or unsaturated ring, wherein, when a82 is two or more, neighboring groups $R_{82}$ are optionally linked to form a saturated or unsaturated ring, two, three, or four selected from a plurality of neighboring $R_{81}$(s) and $R_{82}$(s) are optionally linked to form a four-coordinate, six-coordinate, or eight-coordinate ligand,

* and *' in Formula 81A each indicate a bonding site to M in Formula 81, and $Q_{81}$ to $Q_{89}$ and $Q_{91}$ to $Q_{93}$ are each independently hydrogen, deuterium, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group.

11. The organic light-emitting device of claim 7, wherein the fluorescence emitter satisfies Inequality 4:

$$0 \text{ eV} \leq [E_{S1}(F) - E_{T1}(F)] < 0.5 \text{ eV} \quad (4)$$

wherein, in Inequality 4, $E_{S1}(F)$ is a lowest excitation singlet energy level of the fluorescence emitter, and $E_{T1}(F)$ is a lowest excitation triplet energy level of the fluorescence emitter.

12. The organic light-emitting device of claim 1, wherein p1 the organic light-emitting device further satisfies Inequalities (5) and (6):

$$CIE_x(C1) < CIE_x(C1+C2) < CIE_x(C2) \quad (5)$$

$$CIE_y(C1) < CIE_y(C1+C_2) < CIE_y(C2) \quad (6)$$

wherein, in Inequalities (5) and (6), $CIE_x(C1)$ is an x value of a CIE color coordinate of a comparable organic light-emitting device that is identical to the organic light-emitting device of claim 1 except that it does not comprise the second compound, $CIE_x(C2)$ is an x value of a CIE color coordinate of a comparable organic light-emitting device that is identical to the organic light-emitting device of claim 1 except that it does not comprise the first compound, $CIE_x(C1+C_2)$ is an x value of a CIE color coordinate of the organic light-emitting device, $CIE_y(C1)$ is a y value of a CIE color coordinate of the comparable organic light-emitting device that is identical to the organic light-emitting device of claim 1 except that it does not comprise the second compound, $CIE_y(C2)$ is a y value of a CIE color coordinate of the comparable organic light-emitting device that is identical to the organic light-emitting device of claim 1 except that it does not comprise the first compound, and $CIE_y(C1+C2)$ is a y value of a CIE color coordinate of the organic light-emitting device.

13. The organic light-emitting device of claim 1, wherein the organic light-emitting device further satisfies Equation 1:

$$A(C1+C2)=[a \times A(C1)]+[b \times A(C2)] \quad \text{Equation 1}$$

wherein, in Equation 1, a and b are each independently a real number greater than 0 and less than 1, the sum of a and b is 1, A(C1+C2) is an area of a region defined by an x-axis and an electroluminescence (EL) spectrum of the organic light-emitting device, A(C1) is an area of a region defined by an x-axis and an electroluminescence (EL) spectrum of a comparable organic light-emitting device that is identical to the organic light-emitting device of claim 1 except that it does not comprise the second compound, and A(C2) is an area of a region defined by an x-axis and an electroluminescence (EL) spectrum of a comparable organic light-emitting device that is identical to the organic light-emitting device of claim 1 except that it does not comprise the first compound.

14. The organic light-emitting device of claim 1, wherein the third compound satisfies at least one of Inequalities (7-1) to (7-4):

$$S1(C3) \geq S1(C1) \quad (7\text{-}1)$$

$$T1(C3) \geq T1(C1) \quad (7\text{-}2)$$

$$S1(C3) \geq S1(C2) \quad (7\text{-}3)$$

$$T1(C3) \geq T1(C2) \quad (7\text{-}4)$$

wherein, in Inequalities 7-1 to 7-4,

S1(C1) is a lowest excitation singlet energy level of the first compound,

T1(C1) is a lowest excitation triplet energy level of the first compound,

S1(C2) is a lowest excitation singlet energy level of the second compound,

T1(C2) is a lowest excitation triplet energy level of the second compound,

S1(C3) is a lowest excitation singlet energy level of the third compound, and

T1(C3) is a lowest excitation triplet energy level of the third compound.

15. The organic light-emitting device of claim 14, wherein the first compound and the second compound are each a delayed fluorescence emitter, and the first compound and the second compound satisfy Inequalities (7-1) to (7-4); or the first compound and the second compound are each a phosphorescence emitter, and the first compound and the second compound satisfy Inequalities (7-2) and (7-4); or the first compound is a delayed fluorescence emitter, the second compound is a phosphorescence emitter, and the first compound and the second compound satisfy Inequalities (7-1), (7-2), and (7-4); or the first compound is a phosphorescence emitter, the second compound is a delayed fluorescence emitter, and the first compound and the second compound satisfy Inequalities (7-2) to (7-4); or the first compound and the second compound are each a fluorescence emitter, and the first compound and the second compound satisfy Inequalities (7-1) and (7-3).

16. The organic light-emitting device of claim 1, wherein the third compound comprises an electron transport host, a hole transport host, or a combination thereof, the electron transport host comprises an electron transport moiety, and the hole transport host does not comprise an electron transport moiety.

17. The organic light-emitting device of claim 16, wherein the electron transport host comprises a compound represented by one of Formulae 3-1 or 3-2:

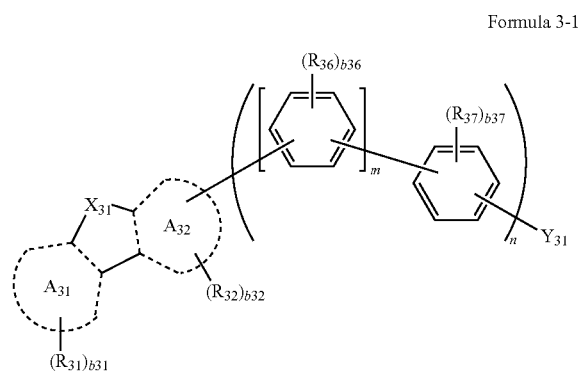

Formula 3-1

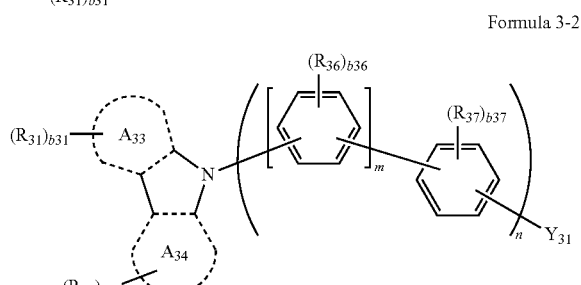

Formula 3-2

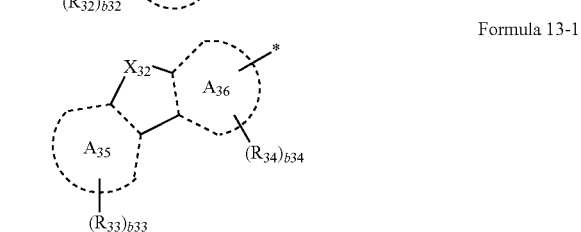

Formula 13-1

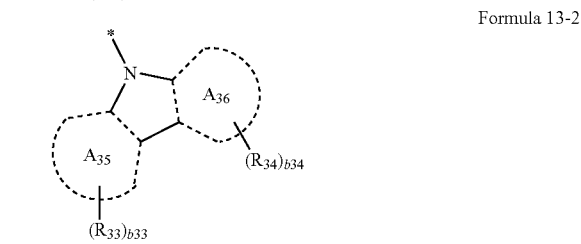

Formula 13-2

-continued

Formula 13-3

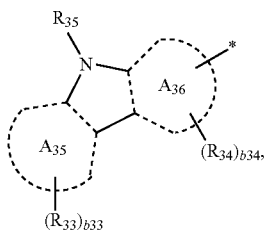

-continued 4-1

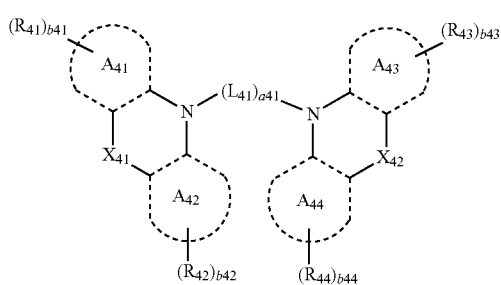

4-2

4-3

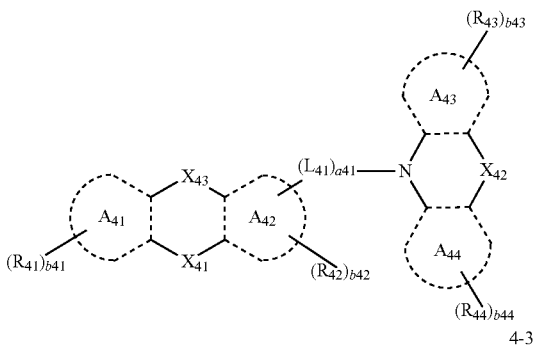

wherein, in Formulae 3-1, 3-2, and 13-1 to 13-3,
$Y_{31}$ is a group represented by one of Formulae 13-1 to 13-3, $A_{31}$ to $A_{36}$ are each independently a benzene group, a naphthalene group, a fluorene group, a carbazole group, a dibenzosilole group, a dibenzofuran group, or a dibenzothiophene group,
$X_{31}$ and $X_{32}$ are each independently O or S,
m is 0, 1, or 2,
n is 1 or 2,
$R_{31}$ to $R_{37}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_1$)($Q_2$), or —B($Q_1$)($Q_2$),
b31 to b34, b36, and b37 are each independently 1, 2, 3, or 4,
* indicates a bonding site to a neighboring atom, and
the compound represented by one of Formulae 3-1 or 3-2 comprises a cyano group.

18. The organic light-emitting device of claim 16, wherein the hole transport host comprises a compound represented by one of Formulae 4-1 to 4-3:

wherein, in Formulae 4-1 to 4-3,
$A_{41}$ to $A_{44}$ are each independently a benzene group, a naphthalene group, an indene group, a benzofuran group, a benzothiophene group, a benzosilole group, a fluorene group, a carbazole group, a dibenzofuran group, a dibenzothiophene group, or a dibenzosilole group,
$X_{41}$ and $X_{42}$ are each independently a single bond, O, S, N($R_{45}$), or C($R_{45}$)($R_{46}$),
$X_{43}$ and $X_{44}$ are each independently O, S, N($R_{47}$), or C($R_{47}$)($R_{48}$),
$L_{41}$ is a π electron-depleted nitrogen-free cyclic group unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or a combination thereof,
a41 is 0, 1, 2, or 3,
$R_{41}$ to $R_{48}$ are each independently: hydrogen, deuterium, a $C_1$-$C_{10}$ alkyl group, or a $C_1$-$C_{10}$ alkoxy group; or a π electron-depleted nitrogen-free cyclic group unsubstituted or substituted with deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, a tetraphenyl group, —Si($Q_{401}$)($Q_{402}$)($Q_{403}$), or a combination thereof,
$Q_{401}$ to $Q_{403}$ are each independently hydrogen, deuterium, a $C_1$-$C_{10}$ alkyl group, a $C_1$-$C_{10}$ alkoxy group, a phenyl group, a naphthyl group, a fluorenyl group, a carbazolyl group, a dibenzofuranyl group, a dibenzothiophenyl group, a triphenylenyl group, a biphenyl group, a terphenyl group, or a tetraphenyl group, and
b41 to b44 are each independently 1, 2, 3, 4, 5, 6, 7, or 8.

19. An organic light-emitting device comprising:
a first electrode;
a second electrode facing the first electrode;
a plurality of light-emitting units, in the number of m, disposed between the first electrode and the second electrode, each light-emitting unit comprising an emission layer; and a plurality of charge generation layers, in the number of m-1, disposed between two adjacent light-emitting units among the plurality of light-emitting units, each charge generation layer comprising an n-type charge generation layer and a p-type charge generation layer,
wherein
m is an integer of 2 or more,
a maximum emission wavelength of light emitted by at least one light-emitting unit among the plurality of light-emitting units is different from a maximum emission wavelength of light emitted by at least one other light-emitting unit among the plurality of light-emitting units,
the emission layer comprises a first compound, a second compound, and a third compound, and the first compound and the second compound are different from each other,
each of the first compound and the second compound emits light,
the third compound does not emit light,
the first compound and the second compound satisfy one of Conditions 1 to 4:
  wherein Condition 1 comprises:
    400 nanometers≤$\lambda_{max1}$<500 nanometers, and
    400 nanometers≤$\lambda_{max2}$<500 nanometers,
  wherein Condition 2 comprises:
    500 nanometers≤$\lambda_{max1}$<550 nanometers, and
    500 nanometers≤$\lambda_{max2}$<550 nanometers,
  wherein Condition 3 comprises:
    550 nanometers≤$\lambda_{max1}$<620 nanometers, and
    550 nanometers≤$\lambda_{max2}$<620 nanometers,
  wherein Condition 4 comprises:
    620 nanometers≤$\lambda_{max1}$<700 nanometers, and
    620 nanometers≤$\lambda_{max2}$<700 nanometers,
the first compound and the second compound may satisfy Inequality (1-1) or (1-2):

$$PLS(C1) \leq PLS(C2) \quad (1\text{-}1)$$

$$(\lambda_{max2}-\lambda_{max1})+PLS(C1) \leq PLS(C2) \quad (1\text{-}2),$$

the first compound and the second compound may satisfy Inequality (2):

$$kr(C1) \geq kr(C2) \quad (2),\text{ and}$$

wherein, in Conditions 1 to 4 and Inequalities (1-1), (12) and (2),
$\lambda_{max1}$ is a maximum emission wavelength of the first compound,
$\lambda_{max2}$ is a maximum emission wavelength the second compound,
PLS(C1) is a photostability of the first compound,
PLS(C2) is a photostability of the second compound,
wherein the photostability PLS(C1) is defined by Equation (P1):

$$PLS(C1)=I_2(C1)/I_1(C1)\times 100\% \quad (P1),$$

wherein $I_1(C1)$ is maximum light intensity obtained by measuring PL spectra at room temperature under an inert environment where outside air is blocked, with respect to a first film that is formed by depositing the first compound alone or with the third compound on a quartz substrate followed by performing encapsulation with a glass substrate,
wherein $I_2(C1)$ is maximum light intensity obtained by measuring PL spectra at room temperature under an inert environment where outside air is blocked, with respect to a second film that is formed by depositing the first compound alone or with the third compound on a quartz substrate followed by performing encapsulation with a glass substrate and exposing the second film to pumping laser light for 3 hours,
wherein the photostability PLS(C2) is defined by Equation (P2):

$$PLS(C2)=I_2(C2)/I_1(C2)\times 100\% \quad (P2),$$

wherein $I_1(C2)$ is maximum light intensity obtained by measuring PL spectra at room temperature under an inert environment where outside air is blocked, with respect to a third film that is formed by depositing the second compound alone or with the third compound on a quartz substrate followed by performing encapsulation with a glass substrate,
wherein $I_2(C1)$ is maximum light intensity obtained by measuring PL spectra at room temperature under an inert environment where outside air is blocked, with respect to a fourth film that is formed by depositing the second compound alone or with the third compound on a quartz substrate followed by performing encapsulation with a glass substrate and exposing the fourth film to pumping laser light for 3 hours,
kr(C1) is a radiative decay rate of the first compound,
kr(C2) is a radiative decay rate of the second compound,
wherein kr(C1) is determined from photoluminescence quantum efficiency (PLQY) and decay lifetime (Tau) measured in a fifth film manufactured by mixing the first compound with polymethyl (meth)acrylate (PMMA) or the third compound, and
wherein kr(C2) is determined from photoluminescence quantum efficiency (PLQY) and decay lifetime (Tau) measured in a sixth film manufactured by mixing the second compound with polymethyl (meth)acrylate (PMMA) or the third compound.

20. An organic light-emitting device comprising:
a first electrode;
a second electrode facing the first electrode; and
a plurality of emission layers, in the number of m, disposed between the first electrode and the second electrode,
wherein
m is an integer of 2 or more,
a maximum emission wavelength of light emitted by at least one emission layer among the plurality of emission layers is different from a maximum emission wavelength of light emitted by at least one other emission layer among the plurality of emission layers,
the emission layer comprises a first compound, a second compound, and a third compound, and the first compound and the second compound are different from each other,
each of the first compound and the second compound emits light,
the third compound does not emit,
the first compound and the second compound satisfy one of Conditions 1 to 4:
  wherein Condition 1 comprises:
    400 nanometers≤$\lambda_{max1}$<500 nanometers, and
    400 nanometers≤$\lambda_{max2}$<500 nanometers,
  wherein Condition 2 comprises:
    500 nanometers≤$\lambda_{max1}$<550 nanometers, and
    500 nanometers≤$\lambda_{max2}$<550 nanometers,
  wherein Condition 3 comprises:
    550 nanometers≤$\lambda_{max1}$<620 nanometers, and
    550 nanometers≤$\lambda_{max2}$<620 nanometers, wherein Condition 4 comprises:
620 nanometers≤$\lambda_{max1}$<700 nanometers, and
620 nanometers≤$\lambda_{max2}$<700 nanometers,
the first compound and the second compound may satisfy Inequality (1-1) or (1-2):

$$PLS(C1) \leq PLS(C2) \quad (1\text{-}1)$$

$$(\lambda_{max2} - \lambda_{max1}) + PLS(C1) \leq PLS(C2) \quad (1\text{-}2),$$

the first compound and the second compound may satisfy Inequality (2):

$$kr(C1) \geq kr(C2) \quad (2), \text{ and}$$

wherein, in Conditions 1 to 4 and Inequalities (1-1), (12) and (2), $\lambda_{max1}$ is a maximum emission wavelength of the first compound, $\lambda_{max2}$ is a maximum emission wavelength the second compound, PLS(C1) is a photostability of the first compound,
PLS(C2) is a photostability of the second compound,
Wherein the photostability PLS(C1) is defined by Equation (P1):

$$PLS(C1) = I_2(C1)/I_1(C1) \times 100\% \quad (P1),$$

wherein $I_1$(C1) is maximum light intensity obtained by measuring PL spectra at room temperature under an inert environment where outside air is blocked, with respect to a first film that is formed by depositing the first compound alone or with the third compound on a quartz substrate followed by performing encapsulation with a glass substrate, wherein $I_2$(C1) is maximum light intensity obtained by measuring PL spectra at room temperature under an inert environment where outside air is blocked, with respect to a second film that is formed by depositing the first compound alone or with the third compound on a quartz substrate followed by performing encapsulation with a glass substrate and exposing the second film to pumping laser light for 3 hours, wherein the photostability PLS(C2) is defined by Equation (P2):

$$PLS(C2) = I_2(C2)/I_1(C2) \times 100\% \quad (P2),$$

wherein $I_1$(C2) is maximum light intensity obtained by measuring PL spectra at room temperature under an inert environment where outside air is blocked, with respect to a third film that is formed by depositing the second compound alone or with the third compound on a quartz substrate followed by performing encapsulation with a glass substrate, wherein $I_2$(C1) is maximum light intensity obtained by measuring PL spectra at room temperature under an inert environment where outside air is blocked, with respect to a fourth film that is formed by depositing the second compound alone or with the third compound on a quartz substrate followed by performing encapsulation with a glass substrate and exposing the fourth film to pumping laser light for 3 hours, kr(C1) is a radiative decay rate of the first compound,
kr(C2) is a radiative decay rate of the second compound,
wherein kr(C1) is determined from photoluminescence quantum efficiency (PLQY) and decay lifetime (Tau) measured in a fifth film manufactured by mixing the first compound with polymethyl (meth)acrylate (PMMA) or the third compound, and wherein kr(C2) is determined from photoluminescence quantum efficiency (PLQY) and decay lifetime (Tau) measured in a sixth film manufactured by mixing the second compound with polymethyl (meth)acrylate (PMMA) or the third compound.

* * * * *